US 9,431,420 B2

(12) United States Patent
Hwang

(10) Patent No.: US 9,431,420 B2
(45) Date of Patent: Aug. 30, 2016

(54) SEMICONDUCTOR DEVICES INCLUDING VERTICAL CELL STRINGS THAT ARE COMMONLY CONNECTED

(71) Applicant: Sung-Min Hwang, Seoul (KR)

(72) Inventor: Sung-Min Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/728,574

(22) Filed: Jun. 2, 2015

(65) Prior Publication Data

US 2016/0013202 A1 Jan. 14, 2016

(30) Foreign Application Priority Data

Jul. 9, 2014 (KR) .................. 10-2014-0086182

(51) Int. Cl.
| H01L 27/115 | (2006.01) |
| G11C 16/04 | (2006.01) |
| G11C 16/12 | (2006.01) |
| G11C 16/34 | (2006.01) |

(52) U.S. Cl.
CPC ..... *H01L 27/11582* (2013.01); *G11C 16/0483* (2013.01); *G11C 16/12* (2013.01); *G11C 16/3427* (2013.01); *H01L 27/11565* (2013.01); *H01L 27/11573* (2013.01); *G11C 2216/02* (2013.01)

(58) Field of Classification Search
None
See application file for complete search history.

(56) References Cited

U.S. PATENT DOCUMENTS

| 8,274,108 B2 | 9/2012 | Katsumata et al. |
| 8,614,126 B1 | 12/2013 | Lee et al. |
| 8,658,499 B2 | 2/2014 | Makala et al. |
| 8,828,884 B2 | 9/2014 | Lee et al. |
| 8,853,767 B2 | 10/2014 | Lee et al. |
| 8,878,277 B2 | 11/2014 | Lee et al. |
| 2013/0248975 A1 | 9/2013 | Hishida et al. |
| 2014/0192596 A1* | 7/2014 | Rhie ............ G11C 11/5635 365/185.17 |
| 2015/0091096 A1* | 4/2015 | Shin ............ G11C 11/5621 257/390 |

FOREIGN PATENT DOCUMENTS

| JP | 2013-197537 A | 9/2013 |
| KR | 10-1054532 B1 | 8/2011 |
| KR | 10-2013-0070922 A | 6/2013 |
| KR | 10-2013-0136249 A | 12/2013 |

* cited by examiner

*Primary Examiner* — Anthony Ho
*Assistant Examiner* — Kevin Quinto
(74) *Attorney, Agent, or Firm* — Myers Bigel & Sibley, P.A.

(57) ABSTRACT

A semiconductor device includes bit lines on a substrate, a gate structure provided between the substrate and the bit lines, a common source line provided between the gate structure and the bit lines, and channel structures connecting the bit lines to the common source line. Each of the channel structures may include a plurality of first vertical portions penetrating the gate structure and being connected to the bit lines, a second vertical portion penetrating the gate structure and being connected to the common source line, and a horizontal portion provided between the substrate and the gate structure to connect the first and second vertical portions to each other.

17 Claims, 42 Drawing Sheets

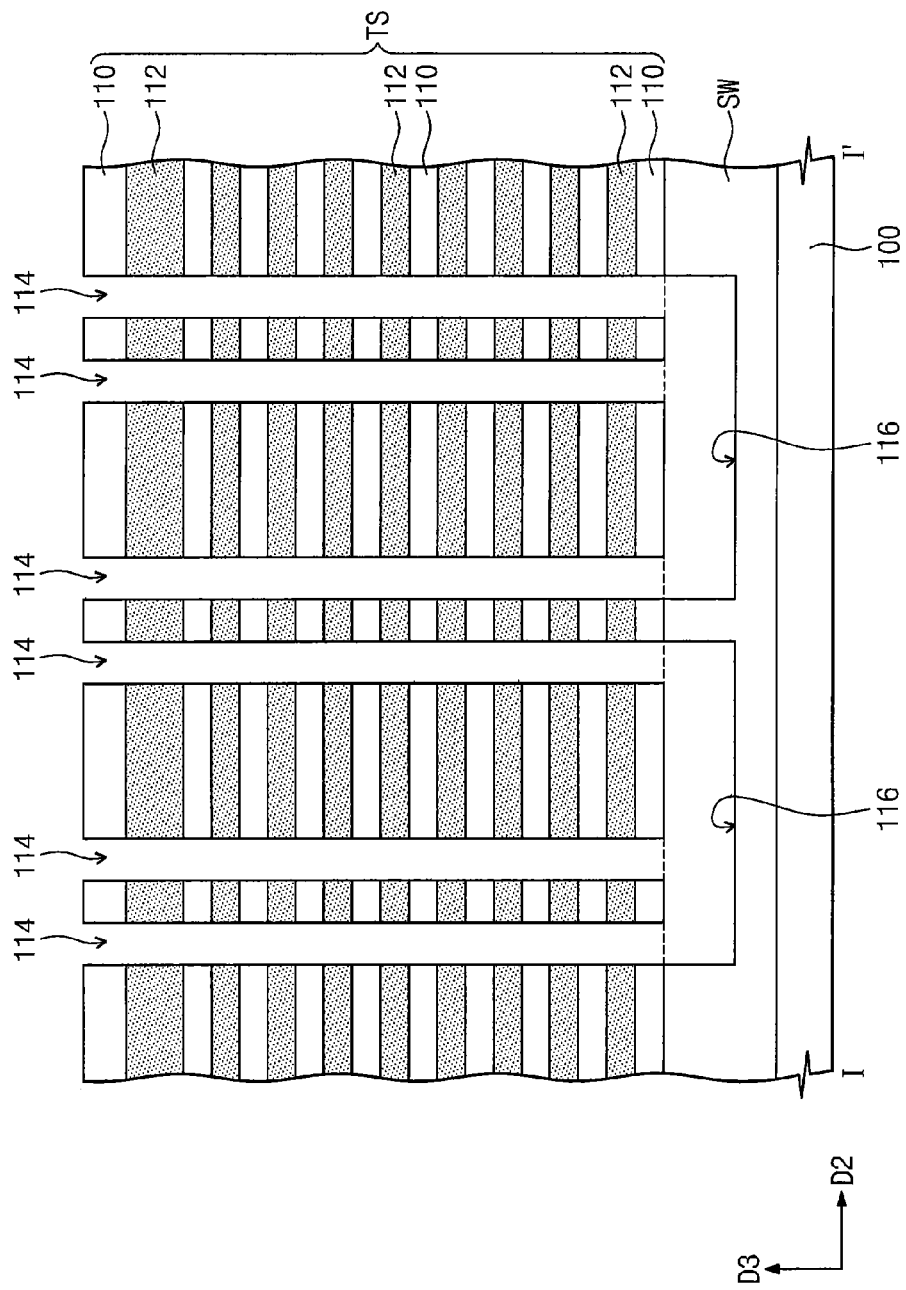

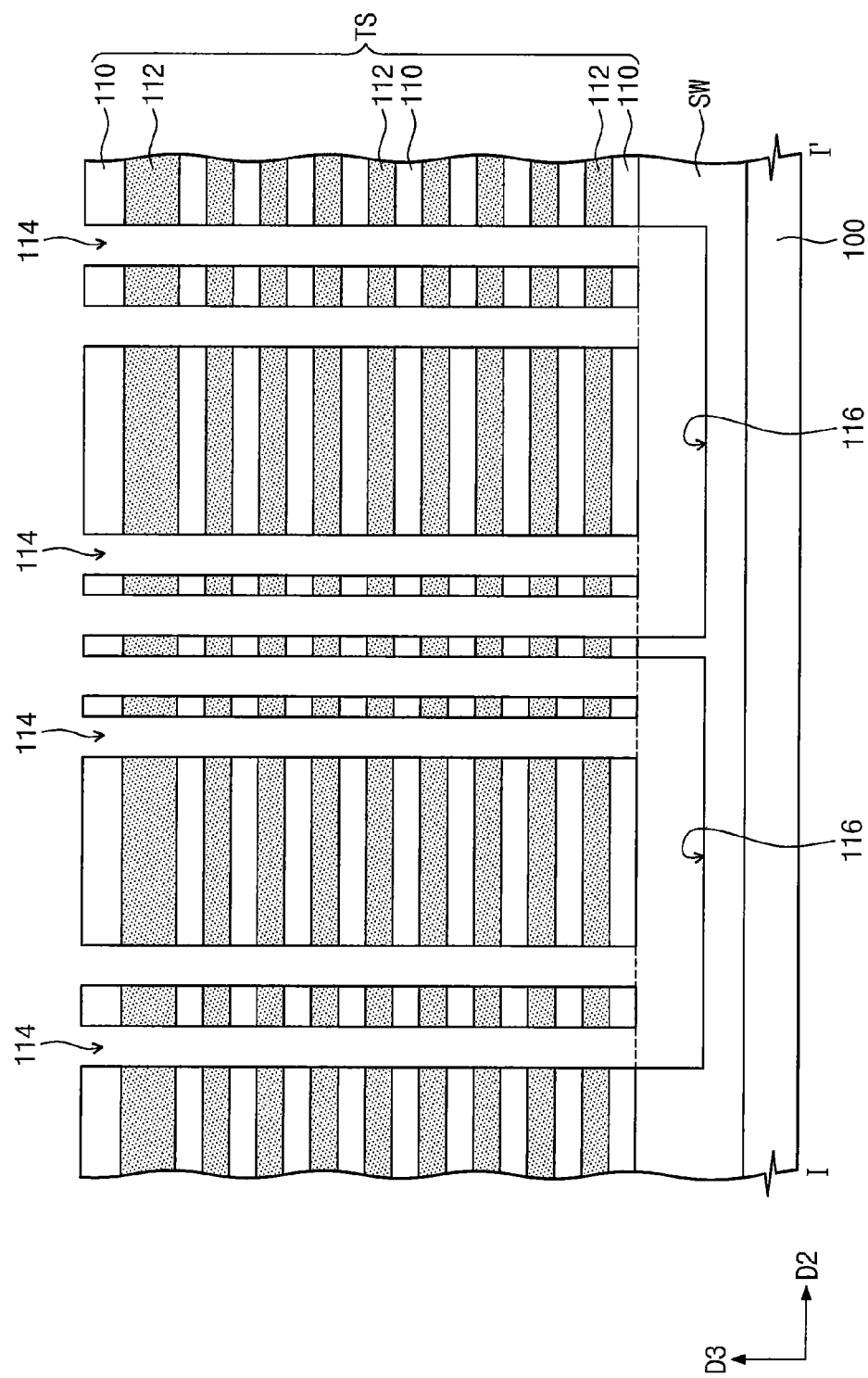

SEMICONDUCTOR DEVICES INCLUDING VERTICAL CELL STRINGS THAT ARE COMMONLY CONNECTED

CROSS-REFERENCE TO RELATED APPLICATION

This U.S. non-provisional patent application claims priority under 35 U.S.C. §119 to Korean Patent Application No. 10-2014-0086182, filed on Jul. 9, 2014, in the Korean Intellectual Property Office, the entire contents of which are hereby incorporated by reference.

BACKGROUND

Example embodiments of the inventive concepts relate to semiconductor devices and methods of fabricating the same, and in particular, to three-dimensional semiconductor memory devices with three-dimensionally arranged memory cells and methods of fabricating the same.

The continued development of highly integrated semiconductor devices is spurred in part by consumer demand for low-cost, superior performance products. Indeed, particularly in the case of semiconductor devices, increased device integration is a major factor in achieving price points satisfying market demands. Conventionally, semiconductor memory devices include planar or two-dimensional (2D) memory cell arrays, i.e., memory cell arrays having memory cells laid-out in a two-dimensional plane. Further integration of such devices is becoming more difficult (and costly) as patterning technologies approach practical limits. At the very least, prohibitively expensive process equipment would be needed to achieve major advances in 2D memory cell array device integration.

As a result, three-dimensional (3D) semiconductor memory devices have been proposed in which the memory cells of the memory cell array are arranged in three dimensions.

SUMMARY

According to example embodiments of the inventive concepts, a semiconductor device may include bit lines on a substrate, a gate structure between the substrate and the bit lines, a common source line between the gate structure and the bit lines, and channel structures connecting the bit lines to the common source line. Each of the channel structures may include first vertical portions penetrating the gate structure and being connected to the bit lines, a second vertical portion penetrating the gate structure and being connected to the common source line, and a horizontal portion between the substrate and the gate structure to connect the first and second vertical portions to each other.

In example embodiments, in each of the channel structures, each of the first vertical portions may be connected to a corresponding one of the bit lines.

In example embodiments, the gate structure may include word lines stacked on the substrate, a string selection line between the word lines and the bit lines, and a ground selection line between the word lines and the common source line. The word lines may include upper word lines between the substrate and the string selection line and lower word lines between the substrate and the ground selection line, and the lower word lines may be spaced apart from the upper word lines in a direction parallel to a face of the substrate, such as a top surface of the substrate.

In example embodiments, in each of the channel structures, each of the first vertical portions may penetrate the upper word lines and the string selection line, and the second vertical portion may penetrate the lower word lines and the ground selection line.

In example embodiments, in each of the channel structures, the horizontal portion may be overlapped with not only the upper word lines but also the lower word lines, when viewed in a plan view.

In example embodiments, the device may further include an electrode separating pattern penetrating the gate structure. The electrode separating pattern may be between the string selection line and the ground selection line and between the upper word lines and the lower word lines.

In example embodiments, in each of the channel structures, each of the first vertical portions may penetrate the upper word lines and the string selection line, and the second vertical portion may penetrate the lower word lines and the ground selection line. The string selection line, the ground selection line, and the word lines may extend parallel to a first direction, and the string selection line may be spaced apart from the ground selection line in a second direction crossing the first direction. The channel structures may include a pair of channel structures adjacent to each other in the second direction, and the second vertical portions of the pair of the channel structures may share the lower word lines and the ground selection line.

In example embodiments, the first vertical portions of one of the pair of the channel structures may penetrate the string selection line and the upper word lines, and the first vertical portions of the other of the pair of the channel structures may penetrate another string selection line and other upper word lines, which are spaced apart from the string selection line and the upper word lines by the ground selection line and the lower word lines interposed therebetween.

In example embodiments, the common source line may include a first common source line and a second common source line spaced apart from each other, and the second vertical portion of each of the channel structures may include a pair of second vertical portions coupled to the first and second common source lines, respectively.

In example embodiments, in each of the channel structures, each of the first vertical portions may be connected to a corresponding one of the bit lines.

In example embodiments, the gate structure may include word lines stacked on the substrate, a string selection line between the word lines and the bit lines, and a ground selection line between the word lines and the common source line. The word lines may include upper word lines between the substrate and the string selection line and lower word lines between the substrate and the ground selection line, and the lower word lines may be spaced apart from the upper word lines in a direction parallel to a face of the substrate, such as a top surface of the substrate. In each of the channel structures, each of the first vertical portions may penetrate the string selection line and the upper word lines, and each of the pair of second vertical portions may penetrate the ground selection line and the lower word lines.

In example embodiments, the string selection line, the ground selection line, and the word lines extend parallel to a first direction, and the string and ground selection lines may be spaced apart from each other in a second direction crossing the first direction. The channel structures may include a pair of channel structures adjacent to each other in the second direction, and the second vertical portions of the pair of the channel structures share the lower word lines and the ground selection line.

In example embodiments, the second vertical portions of the pair of the channel structures may be on the substrate to form a zigzag arrangement, when viewed in plan view.

In example embodiments, the gate structure may include word lines stacked on the substrate, a string selection line between the word lines and the bit lines, a ground selection line between the word lines and the common source line, and a neighboring ground selection line between the word lines and the common source line and spaced apart from the ground selection line with the string selection line interposed therebetween. The word lines below the ground selection line may be spaced apart from the word lines below the string selection line in a direction parallel to a face of the substrate, such as a top surface of the substrate, and the string selection line and the neighboring ground selection line may be on the word lines below the string selection line and may be horizontally separated from each other.

In example embodiments, the device may further include an insulating pattern between the string selection line and the neighboring ground selection line.

In example embodiments, the word lines, the string selection line, the ground selection line, and the neighboring ground selection line extend parallel to a first direction, and the string selection line, the ground selection line, and the neighboring ground selection line may be separated from each other in a second direction crossing the first direction. The word lines below the ground selection line may be spaced apart from the word lines below the string selection line in the second direction, and the insulating pattern may be a line-shaped pattern extending along the first direction.

In example embodiments, the gate structure may further include a neighboring string selection line between the word lines and the bit lines and spaced apart from the string selection line with the ground selection line interposed therebetween, and the ground selection line and the neighboring string selection line may be horizontally separated from each other, on the word lines below the ground selection line.

In example embodiments, in each of the channel structures, each of the first vertical portions may penetrate the string selection lines and the word lines therebelow, and the second vertical portion may penetrate the ground selection line and the word lines therebelow.

In example embodiments, in each of the channel structures, the horizontal portion may be overlapped with the word lines below the string and ground selection lines, when viewed in a plan view.

In example embodiments, the string selection line may include a pair of string selection lines horizontally spaced apart from each other.

In example embodiments, in each of the channel structures, at least one pair of the first vertical portions may penetrate the pair of the string selection lines, respectively, and may be connected in common to a corresponding one of the bit lines.

According to example embodiments of the inventive concepts, a semiconductor device may include a common source line, a plurality of bit lines, and cell strings therebetween. Each of the cell strings may include a plurality of upper strings, a respective one of which is connected to a respective one of the bit lines, and a lower string connected to the common source line. The plurality of upper strings may be connected in common to the lower string.

According to other example embodiments of the inventive concept, a semiconductor device may include first, second and third strings of nonvolatile memory cells that are stacked on the substrate and spaced apart from each other, such that the first, second and third strings of nonvolatile memory cells each comprises a first end adjacent the substrate and a second end remote from the substrate. These embodiments also include first, second and third conductive lines, a respective one of which is connected to a respective second end of the first, second and third strings of nonvolatile memory cells. A fourth conductive line connects the first ends of the first, second and third strings of nonvolatile memory cells in common.

In example embodiments, the first, second and third conductive lines comprise metal and the fourth conductive line comprises semiconductor material.

In example embodiments, the first through fourth conductive lines all extend parallel to a face of the substrate.

In example embodiments, the first and third strings of memory cells each further comprises a string selection transistor and is devoid of a ground selection transistor, and the second string of memory cells comprises a ground selection transistor and is devoid of a string selection transistor.

In example embodiments, a fourth string of nonvolatile memory cells are stacked on the substrate and are spaced apart from the first through third strings of nonvolatile memory cells. The fourth string of memory cells comprises a first end adjacent the substrate and a second end remote from the substrate. A fifth conductive line that is connected to the second end of the fourth string of nonvolatile memory cells. The fourth conductive line also connects the first end of the fourth string of nonvolatile memory cells in common to the first ends of the first, second and third strings of nonvolatile memory cells.

In example embodiments, the fourth string of memory cells further comprises a string selection transistor and is devoid of a ground selection transistor.

In example embodiments, the fourth string of memory cells further comprises a ground selection transistor and is devoid of a string selection transistor.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8 through 10 are sectional views taken along the line I-I' of FIG. 7B to illustrate a method of fabricating the semiconductor device according to the second embodiment of the inventive concepts.

FIGS. 12 through 14 are sectional views taken along the line I-I' of FIG. 11B to illustrate a method of fabricating the semiconductor device according to the modification of the second embodiment of the inventive concepts.

Figure 1A:
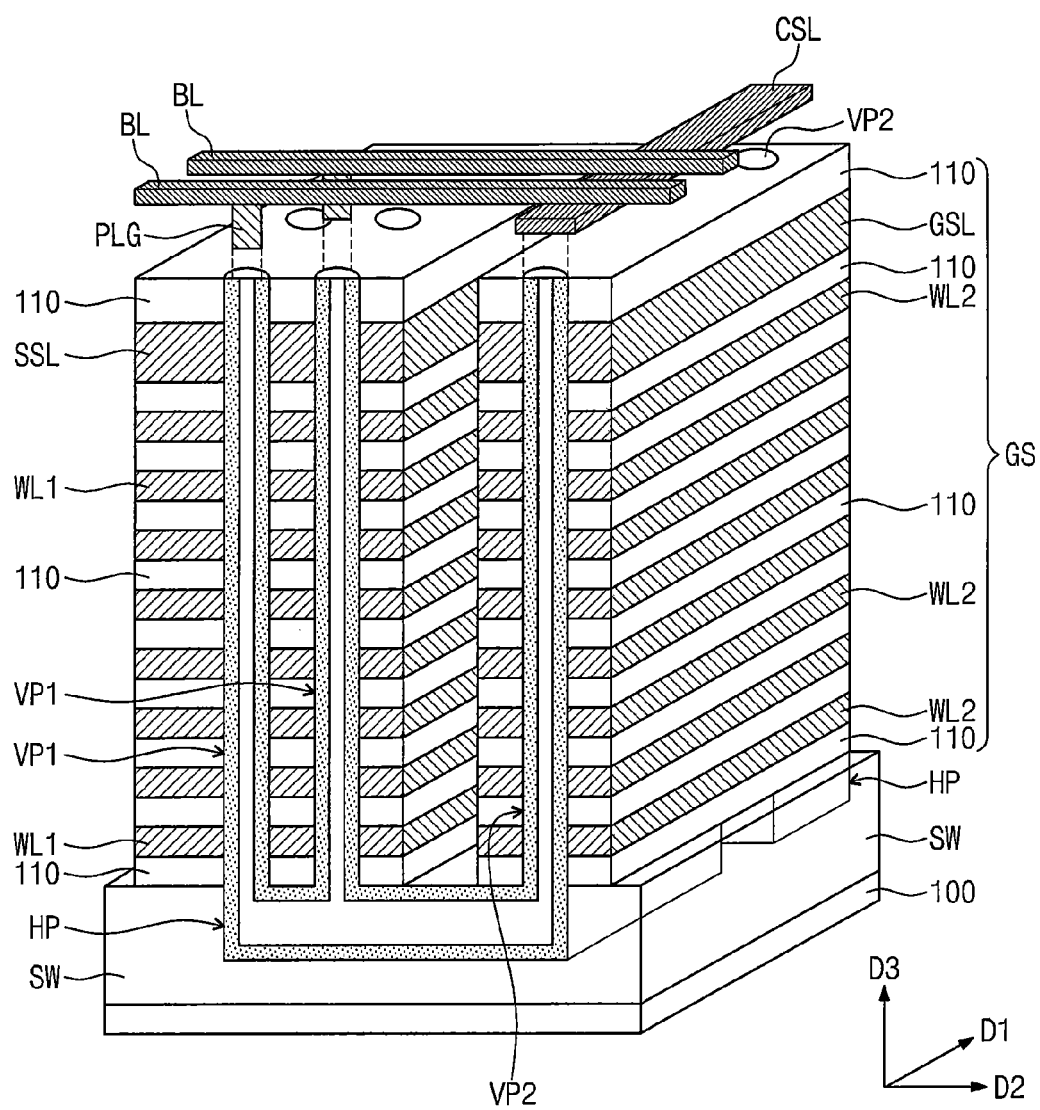
FIG. 1A is a perspective view illustrating a semiconductor device according to a first embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First Embodiment

Figure 1B:
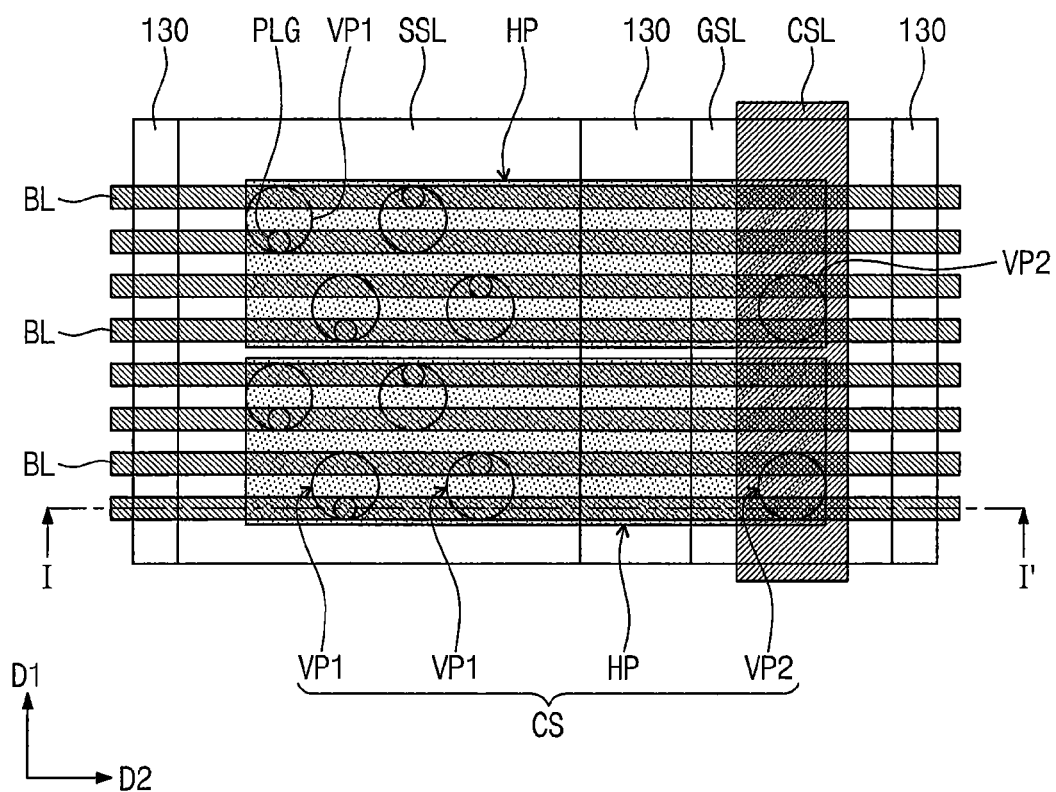
FIG. 1B is a plan view illustrating the semiconductor device according to the first embodiment of the inventive concepts.
Figure 1C:
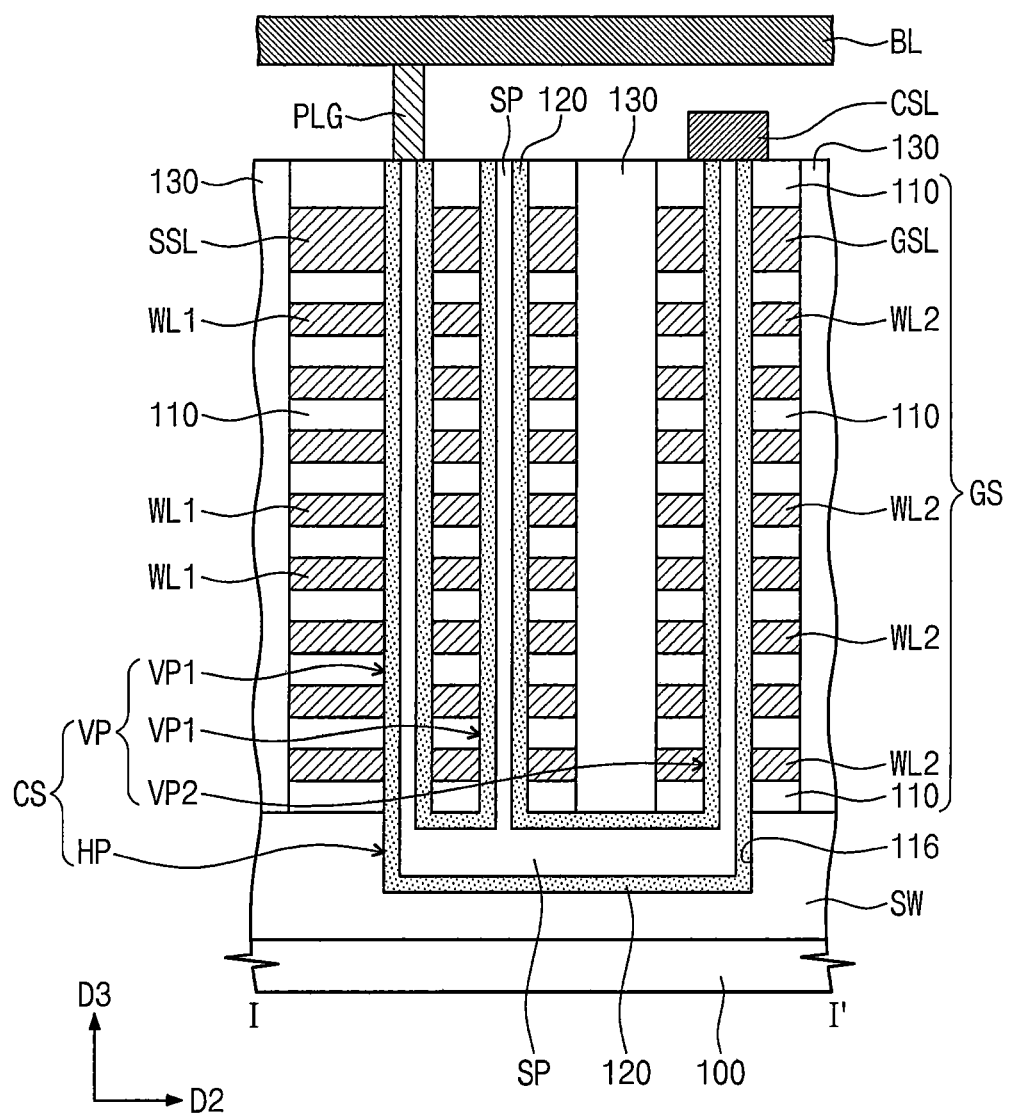
FIG. 1C is a sectional view taken along line I-I' of FIG. 1B.
Figure 1D:
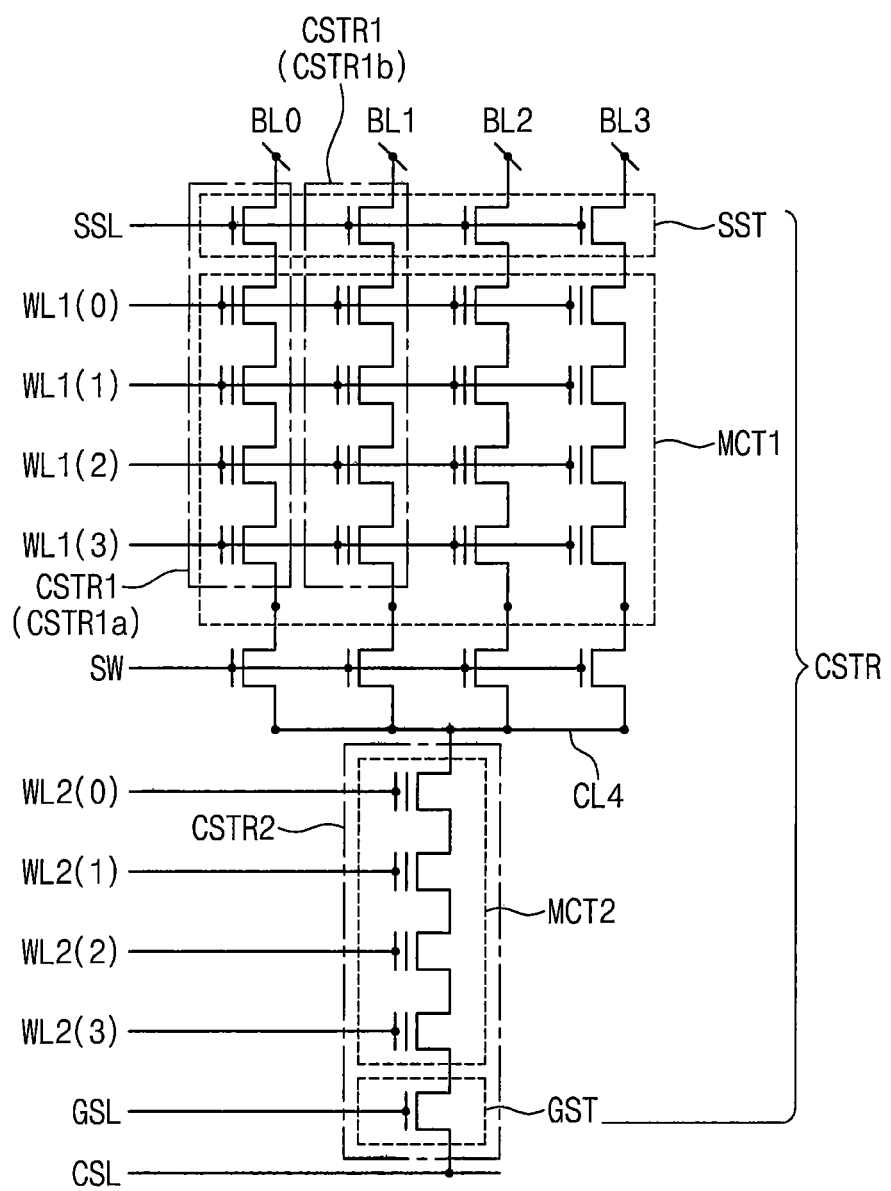
FIG. 1D is a schematic circuit diagram illustrating a cell array of the semiconductor device according to the first embodiment of the inventive concepts.

FIGS. 1A and 1B are perspective and plan views illustrating a semiconductor device according to a first embodiment of the inventive concepts, and FIG. 1C is a sectional view taken along line I-I' of FIG. 1B. Further, FIG. 1D is a schematic circuit diagram illustrating a cell array of the semiconductor device according to the first embodiment of the inventive concepts.

Referring to FIGS. 1A through 1C, a semiconductor device may include bit lines BL on a substrate 100, a gate structure GS between the substrate 100 and the bit lines BL, a common source line CSL between the gate structure GS and the bit lines BL, and channel structures CS penetrating the gate structure GS. Each of the channel structures CS may be provided to connect a corresponding one of the bit lines BL to the common source line CSL. The semiconductor device may further include contact plugs PLG provided between the gate structure GS and the bit lines BL.

The gate structure GS may include a plurality of word lines sequentially stacked on the substrate 100 and a plurality of selection lines disposed between the word lines and the bit lines BL. The selection lines may include a string selection line SSL between the word lines and the bit lines BL and a ground selection line GSL between the word lines and the common source line CSL. In example embodiments, the word lines, the string selection line SSL, and the ground selection line GSL may extend parallel to a first direction D1. The string and ground selection lines SSL and GSL may be spaced apart from each other in a second direction D2 crossing the first direction D1. The word lines may include a plurality of upper word lines WL1 disposed between the substrate 100 and the string selection line SSL and a plurality of lower word lines WL2 disposed between the substrate 100 and the ground selection line GSL. The upper word lines WL1 may be spaced apart from the lower word lines WL2 in the second direction D2.

An electrode separating pattern 130 may be provided between the string and ground selection lines SSL and GSL and between the upper and lower word lines WL1 and WL2. The electrode separating pattern 130 may be a line-shaped pattern extending parallel to the first direction D1. As an example, the electrode separating pattern 130 may include a silicon oxide layer, a silicon nitride layer and/or a silicon oxynitride layer.

The channel structures CS may be formed to penetrate the gate structure GS and may be connected to the substrate 100. The channel structures CS may be arranged along the first direction D1, when viewed in plan view.

Each of the channel structures CS may include at least three vertical portions VP penetrating the gate structure GS and a horizontal portion HP provided below the gate structure GS to connect the vertical portions VP to each other. One of the vertical portions VP may be formed to penetrate the gate structure GS and may be connected to the common source line CSL, and the others of the vertical portions VP may be formed to penetrate the gate structure GS and may be connected to corresponding ones of the bit lines BL. The horizontal portion HP may be provided between the substrate 100 and the gate structure GS to connect the vertical portions VP.

For example, for each of the channel structures CS, the vertical portions VP may include a plurality of first vertical portions VP1, which are formed to penetrate the upper word lines WL1 and the string selection line SSL, and a second vertical portion VP2, which is formed to penetrate the lower word lines WL2 and the ground selection line GSL. The first vertical portions VP1 may be connected to corresponding ones of the bit lines BL, and the second vertical portion VP2 may be connected to the common source line CSL. The first vertical portions VP1 may be connected to the corresponding bit lines through corresponding ones of the contact plugs PLG. For each of the channel structures CS, the horizontal portion HP may be disposed below both the upper and lower word lines WL1 and WL2 to connect the first vertical portions VP1 to the second vertical portion VP2. As shown in FIG. 1B, when viewed in plan view, the first vertical portions VP1 may be disposed to form a zigzag arrangement in the first direction D1. As shown in FIG. 1B, when viewed in plan view, the horizontal portion HP may be shaped like a plate crossing the electrode separating pattern 130.

When viewed in plan view, as shown in FIG. 1B, the first vertical portions VP1 of the channel structures CS adjacent to each other in the first direction D1 may be disposed to form a zigzag arrangement in the first direction D1, and the second vertical portions VP2 of the channel structures CS adjacent to each other in the first direction D1 may be arranged to form a column in the first direction D1. When viewed in plan view, the horizontal portions HP of the channel structures CS adjacent to each other in the first direction D1 may be arranged along the first direction D1 and may be disposed to cross the electrode separating pattern 130.

Each of the channel structures CS may include a semiconductor pattern SP, which is formed to penetrate the gate structure GS and to extend blow the gate structure GS. The semiconductor pattern SP may include vertical semiconductor patterns provided in the vertical portions VP, and a horizontal semiconductor pattern provided in the horizontal portion HP. The vertical semiconductor patterns and the horizontal semiconductor pattern may be connected to each other to form a single body. In example embodiments, the semiconductor pattern SP may include a pillar-shaped structure penetrating the gate structure GS and a plate-shaped structure extending blow the gate structure GS The semiconductor pattern SP may include a semiconductor material. For example, the semiconductor pattern SP may contain silicon (Si), germanium (Ge) and/or any mixture thereof and be a doped or intrinsic semiconductor layer. Further, the semiconductor pattern SP may have a single-crystalline, amorphous and/or polycrystalline crystal structure. In certain embodiments, the semiconductor pattern SP may be in an undoped state or be doped to have the same conductivity type as the substrate 100.

Figure 20:
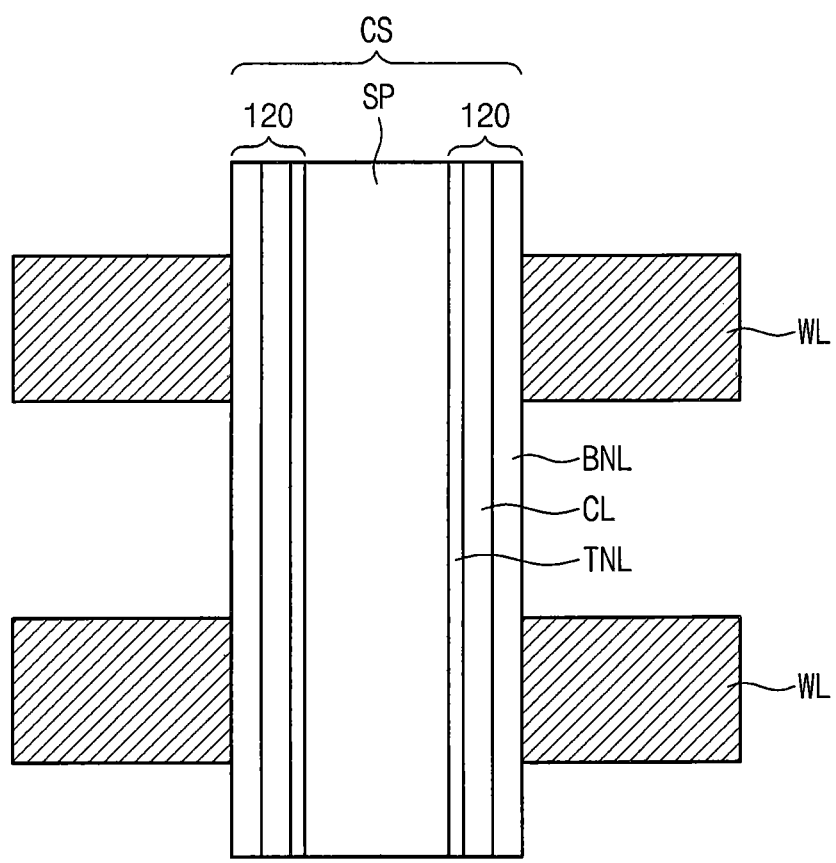
FIGS. 20 through 22 are sectional views exemplarily illustrating channel structures according to example embodiments of the inventive concepts.
Figure 21:
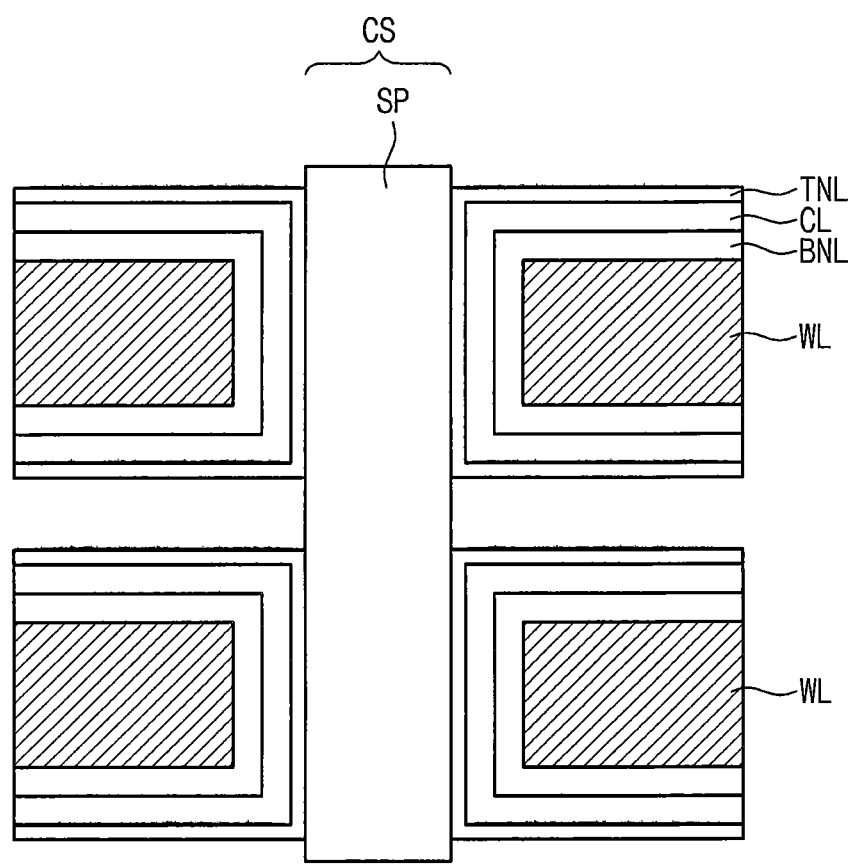
Figure 22:
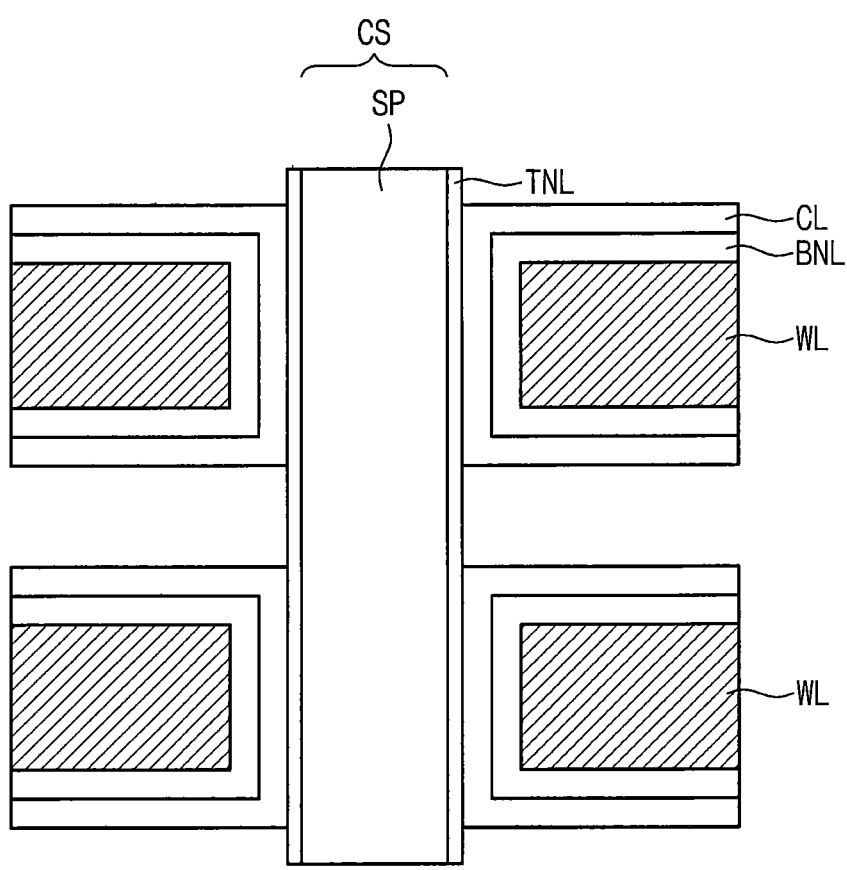

Each of the channel structures CS may further include a memory layer 120 interposed between the semiconductor pattern SP and the gate structure GS. The memory layer 120 may extend between the semiconductor pattern SP and the substrate 100. As shown in FIG. 20, the memory layer 120 may include a tunnel insulating layer TNL, a charge storing layer CL, and a blocking insulating layer BNL, which are formed sequentially on, and in some embodiments to cover, an outer surface of the semiconductor pattern SP. In example embodiments, as shown in FIG. 20, the memory layer 120 may be formed on, and in some embodiments to continuously cover, the outer surface of the semiconductor pattern SP. In other embodiments, as shown in FIG. 21, the memory layer 120 may include first portions, which are interposed between the semiconductor pattern SP and sidewalls of the word lines WL, and second portions, which extend horizontally from the first portions on, and in some embodiments to cover, top and bottom surfaces of the word lines W. In still other example embodiments, as shown in FIG. 22, at least one of the layers constituting the memory layer 120 (for example, the blocking insulating layer BNL and the charge storing layer CL) may be formed to include the first portions, which are interposed between the semiconductor pattern SP and sidewalls of the word lines WL, and the second portions, which extend horizontally from the first portions on, and in some embodiments to cover, top and bottom surfaces of the word lines W, and the other (for example, the tunnel insulating layer TNL) may be formed on, and in some embodiments to continuously cover, the outer surface of the semiconductor pattern SP.

The charge storing layer CL may include at least one of, for example, a silicon nitride layer, a silicon oxynitride layer, a silicon-rich nitride layer, a nanocrystalline silicon layer and/or a laminated trap layer. The tunnel insulating layer TNL may include a material having a band gap higher than that of the charge storage layer CL. For example, the tunnel insulating layer TNL may be a silicon oxide layer. The blocking insulating layer BNL may include a material having a band gap higher than that of the charge storing layer CL. In certain embodiments, the blocking insulating layer BNL may be a silicon oxide layer, a silicon nitride layer, and/or a silicon oxynitride layer. In example embodiments, the blocking insulating layer BNL may include first and second blocking insulating layers that are formed of different materials. For example, one of the first and second blocking insulating layers may be one of materials, whose band gap is smaller than that of the tunnel insulating layer TNL and greater than that of the charge storing layer CL. As an example, the first blocking insulating layer may be formed of one of high-k dielectrics such as aluminum oxide and/or hafnium oxide, and the second blocking insulating layer may be formed of a material having a dielectric constant smaller than that of the first blocking insulating layer. As another example, the second blocking insulating layer may be formed of one of high-k dielectrics, and the first blocking insulating layer may be formed of a material having a dielectric constant smaller than that of the second blocking insulating layer.

The word lines WL1 and WL2 may be configured to control an electric potential of the semiconductor pattern SP. For example, an electric connection between the bit lines BL and the common source line CSL may be controlled using voltages applied to the word lines WL1 and WL2, the string selection line SSL, and the ground selection line GSL. According to this configuration, the semiconductor pattern SP may be used as a part of a unit cell string of an NAND-type cell array structure.

The bit lines BL may extend along the second direction D2. In example embodiments, the bit lines BL may be connected to the first vertical portions VP1 of the channel structures CS, respectively, through the contact plugs PLG. The bit lines BL may be provided spaced apart from the common source line CSL in a third direction D3, which is orthogonal to both the first and second directions D1 and D2.

A switching device SW may be provided in the substrate 100 to selectively control an electric current flowing through the horizontal portion HP of the channel structure CS. The switching device SW may be configured to simultaneously control the horizontal portions HP of the plurality of channel structures CS. As an example, the switching device SW may be a conductive plate pattern, which is capacitively coupled with the plurality of channel structures CS. In certain embodiments, the switching device SW may be formed of or include poly silicon and/or metallic materials.

Referring to FIG. 1D, a cell array of the semiconductor device according to the first embodiment of the inventive concepts may include the common source line CSL, the plurality of bit lines BL, and a cell string CSTR between the common source line CSL and the bit lines BL.

The common source line CSL may be a conductive thin film disposed on a substrate, and the bit lines BL may be conductive patterns (e.g., metal lines) disposed on the substrate.

The cell string CSTR may include a plurality of upper strings CSTR1 respectively connected to the bit lines BL and one lower string CSTR2 connected to the common source line CSL. The plurality of upper strings CSTR1 may be connected in common to the lower string CSTR2. The upper strings CSTR1 may be connected in common to the lower string CSTR2 through the switching devices SW. The switching devices SW connected to the upper strings CSTR1 may be controlled in such a way that the same voltage is applied thereto.

Each of the upper strings CSTR1 may include a string selection transistor SST connected to a corresponding one of the bit lines BL and a plurality of upper memory cell transistors MCT1 disposed between the string selection transistor SST and the switching device SW. The string selection transistor SST may be connected in series to the upper memory cell transistors MCT1. The lower string CSTR2 may include a ground selection transistor GST connected to the common source line CSL and a plurality of lower memory cell transistors MCT2 disposed between the ground selection transistor GST and the switching devices SW. The ground selection transistor GST may be connected in series to the lower memory cell transistors MCT2.

The string selection line SSL and the upper word lines WL1(0)-WL1(3), which are disposed between the bit lines BL and the switching devices SW, may be respectively used for gate electrodes of the string selection transistor SST and the upper memory cell transistors MCT1, and the ground selection line GSL and the lower word lines WL2(0)-WL2(3), which are disposed between the common source line CSL and the switching devices SW, may be respectively used for gate electrodes of the ground selection transistor GST and the lower memory cell transistors MCT2. The plurality of the upper strings CSTR1 may share the string selection line SSL and the upper word lines WL1(0)-WL1(3). Each of the upper and lower memory cell transistors MCT1 and MCT2 may include a data storage element or a memory layer.

Embodiments of FIGS. 1A-1D may also be regarded as describing a semiconductor device comprising a substrate 100, first, second and third strings of nonvolatile memory cells CSTR1a, CSTR2, CSTR1b, respectively, that are stacked on the substrate and spaced apart from one another, such that the first, second and third strings of nonvolatile memory cells CSTR1a, CSTR2, CSTR1b, respectively, each comprises a first end adjacent the substrate and a second end remote from the substrate. These embodiments also include first, second and third conductive lines BL0, CSL and BL1, respectively, a respective one of which is connected to a respective second end of the first, second and third strings CSTR1a, CSTR2, CSTR1b of nonvolatile memory cells. Finally, a fourth conductive line CL4 connects the first ends of the first, second and third strings CSTR1a, CSTR2, CSTR1b of nonvolatile memory cells in common. The first, second and third conductive lines BL0, CSL and BL1 may comprise metal and the fourth conductive line CL4 may comprise semiconductor material. The first through fourth conductive lines BL0, CSL, BL1, CL4 all extend parallel to the face of the substrate. Moreover, the first and third strings of memory cells CSTR1a, CSTR1b each further comprises a string selection transistor SST and is devoid of a ground selection transistor GST, and the second string of memory cells CSTR2 comprises a ground selection transistor GST and is devoid of a string selection transistor SST.

According to example embodiments of the inventive concepts, a plurality of upper strings connected to respective bit lines may be connected in common to a single lower string connected to a common source line. Thus, a ground selection transistor of the single lower string can be shared with the upper strings. Due to the sharing of the ground selection transistor of the lower string, it possible to increase an integration density of the semiconductor device. Further, since the upper strings are respectively connected to the bit lines, it is still possible to independently operate the upper strings sharing the ground selection transistor.

FIGS. 2 through 6 are sectional views taken along the line I-I' of FIG. 1B to illustrate a method of fabricating the semiconductor device according to the first embodiment of the inventive concepts.

Figure 2:
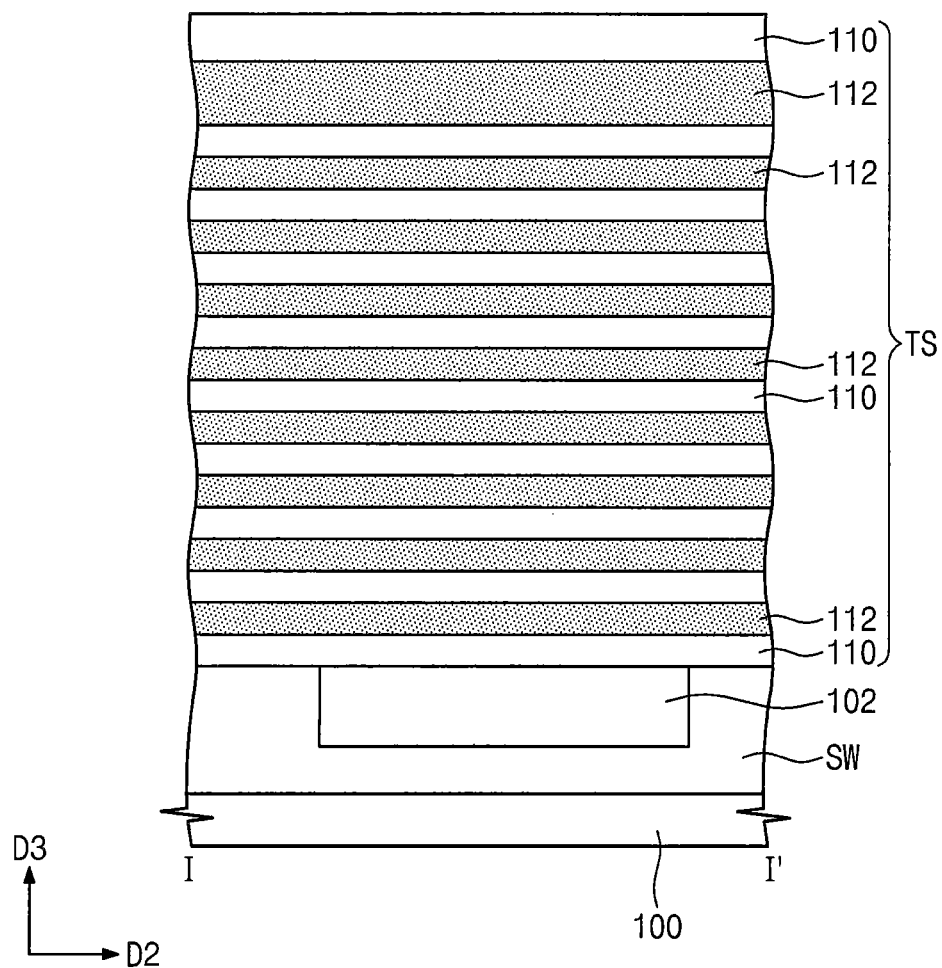
FIGS. 2 through 6 are sectional views taken along the line I-I' of FIG. 1B to illustrate a method of fabricating the semiconductor device according to the first embodiment of the inventive concepts.

Referring to FIG. 2, the switching device SW and a buried sacrificial pattern 102 may be formed in the substrate 100. For example, the switching device SW may be a conductive plate pattern buried in the substrate 100. A layered structure TS may be formed on the structure including the buried sacrificial pattern 102. The layered structure TS may include a plurality of insulating layers 110 and a plurality of sacrificial layers 112, which are alternatingly and repeatedly stacked on the substrate 100. The substrate 100 may be formed of or include a semiconductor material (e.g., a silicon wafer).

The sacrificial layers 112 may be formed of a material having an etch selectivity with respect to the insulating layers 110. For example, the insulating layers 110 may include a silicon oxide layer and/or a silicon nitride layer, and the sacrificial layer 112 may include a silicon layer, a silicon oxide layer, a silicon carbide layer, and/or a silicon nitride layer but may be selected to be different from the insulating layers 110.

The buried sacrificial pattern 102 may be formed of a material having an etch selectivity with respect to the insulating layers 110 and the sacrificial layers 112. Although not shown, in the substrate 100, a plurality of buried sacrificial patterns 102 may be formed to form a two-dimensional arrangement, when viewed in plan view. In certain embodiments, the buried sacrificial pattern 102 may be formed using a process of forming an insulating device isolation pattern (for example, an STI process).

Figure 3:
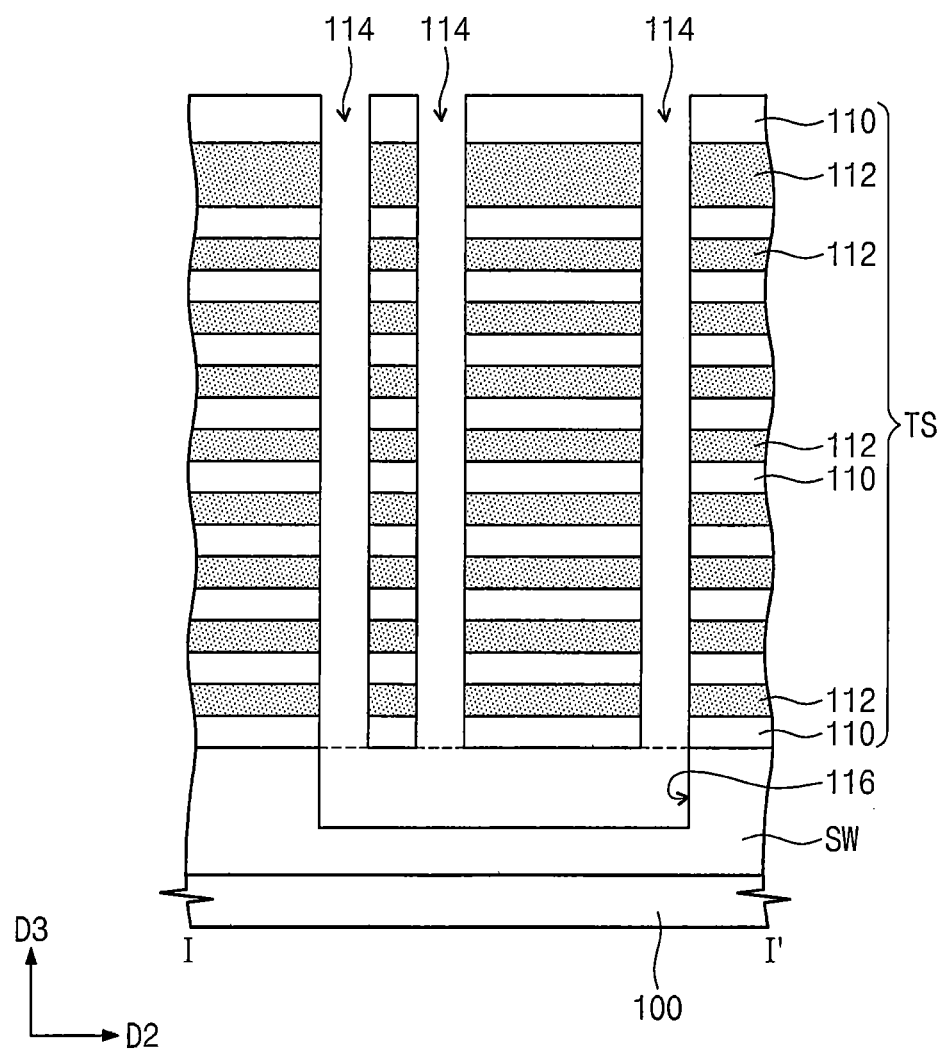

Referring to FIG. 3, through holes 114 may be formed to penetrate the layered structure TS and thereby expose a top surface of the buried sacrificial pattern 102. Thereafter, the buried sacrificial pattern 102 may be selectively removed through the through holes 114, thereby forming a horizontal hole 116. In example embodiments, at least three through holes 114 may be formed on the buried sacrificial pattern 102. The through holes 114 may be connected to each other through the horizontal hole 116. The through holes 114 and the horizontal hole 116 connected to each other may constitute one opening penetrating the layered structure TS.

Figure 4:
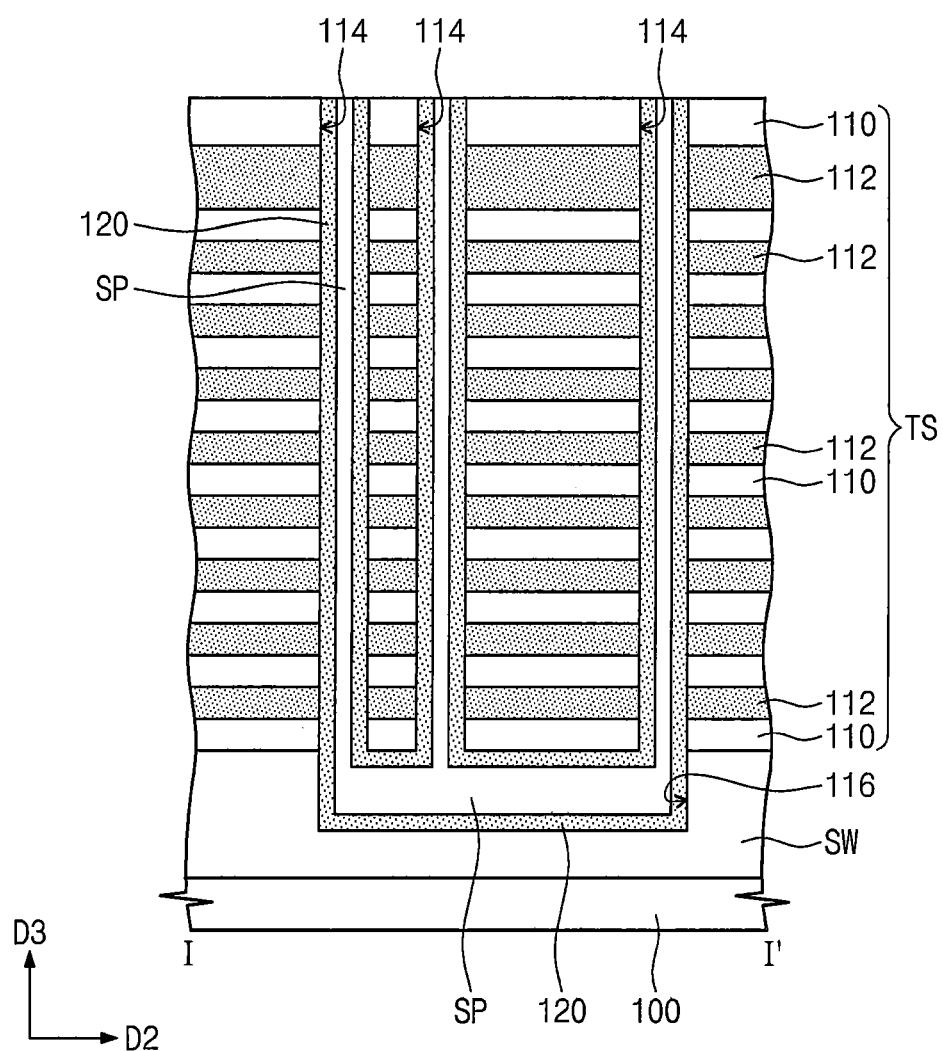

Referring to FIG. 4, the semiconductor pattern SP may be formed in the opening. The semiconductor pattern SP may be formed in, and in some embodiments to fill, at least a portion of the opening.

The formation of the semiconductor pattern SP may include forming a semiconductor layer in, and in some embodiments to fill, the opening. The semiconductor layer may be formed using atomic layer deposition (ALD) and/or chemical vapor deposition (CVD) processes and may be formed of a semiconductor material (e.g., a single-crystalline, amorphous and/or polycrystalline silicon layer). The formation of the semiconductor pattern SP may further include anisotropically etching the semiconductor layer to expose a top surface of the layered structure TS. Accordingly, the semiconductor pattern SP may be locally formed in the opening.

In example embodiments, as shown in FIGS. 4 and 20, before the formation of the semiconductor pattern SP, the memory layer 120 may be formed on, and in some embodiments to conformally cover, an inner surface of the opening. The memory layer 120 may include the blocking insulating layer BNL, the charge storing layer CL, and the tunnel insulating layer TNL sequentially on, and in some embodiments covering, the inner surface of the opening. In other example embodiments, as shown in FIG. 22, a portion of the memory layer 120 (for example, the tunnel insulating layer TNL) may be formed before the formation of the semiconductor pattern SP on, and in some embodiments to cover, the inner surface of the opening. When at least a portion of the memory layer 120 is formed to fill a portion of the opening, the semiconductor pattern SP may be formed to fill the rest of the opening.

Figure 5:
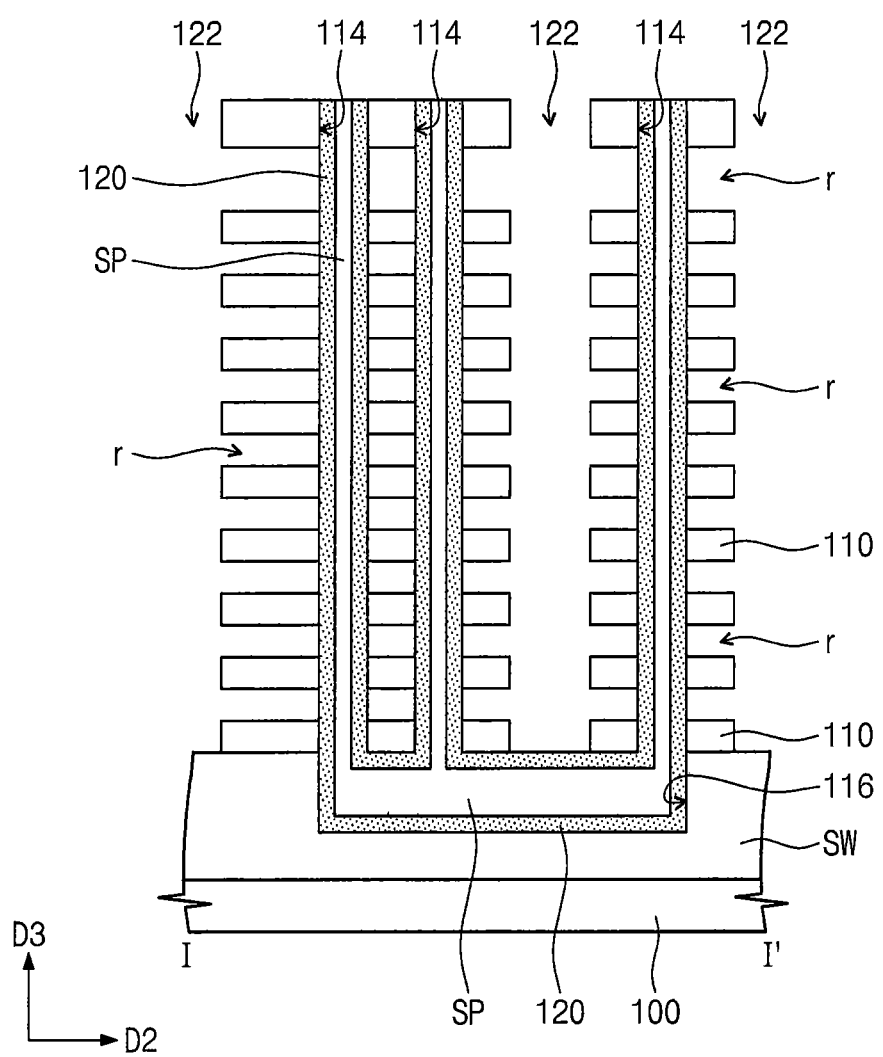

Referring to FIG. 5, the layered structure TS may be patterned to form trenches 122 exposing side surfaces of the insulating and sacrificial layers 110 and 112. At least one of the trenches 122 may be formed to cross the horizontal hole 116. At least one of the trenches 122 may be formed between a pair of through holes 114 connected by the horizontal hole 116. In the case where a plurality of horizontal holes 116 are two-dimensionally arranged in the substrate 100, at least one of the trenches 122 may be formed to cross a plurality of horizontal holes 116 arranged in a specific direction. The formation of the trenches 122 may include forming mask patterns on the layered structure TS to define positions and arrangement of the trenches 122 and then etching the layered structure TS using the mask patterns as an etch mask. In some embodiments, when at least a portion of the memory layer 120 is formed to fill a portion of the opening, at least one of the trenches 122 may be formed to expose a portion of a surface of the memory layer 120 provided in the horizontal hole 116. In other embodiment, at least one of the trenches 122 may be formed to expose a portion of a surface of the semiconductor pattern SP provided in the horizontal hole 116.

The sacrificial layers 112 exposed by the trenches 122 may be selectively removed to form recess regions r between the insulating layers 110. Each of the recess regions r may be a gap region, which is extended from the trenches 122 horizontally toward the semiconductor pattern SP. In example embodiments, the recess regions r may be formed to expose a sidewall of the semiconductor pattern SP. In the case where, as shown in FIGS. 20 and 22, an outer side surface of the semiconductor pattern SP is covered with at least a portion of the memory layer 120, the recess regions r may be formed to expose a sidewall of the portion of the memory layer 120. The formation of the recess regions r may include isotropically etching the sacrificial layers 112 using an etch recipe selected to have an etch selectivity with respect to the insulating layers 110.

Figure 6:
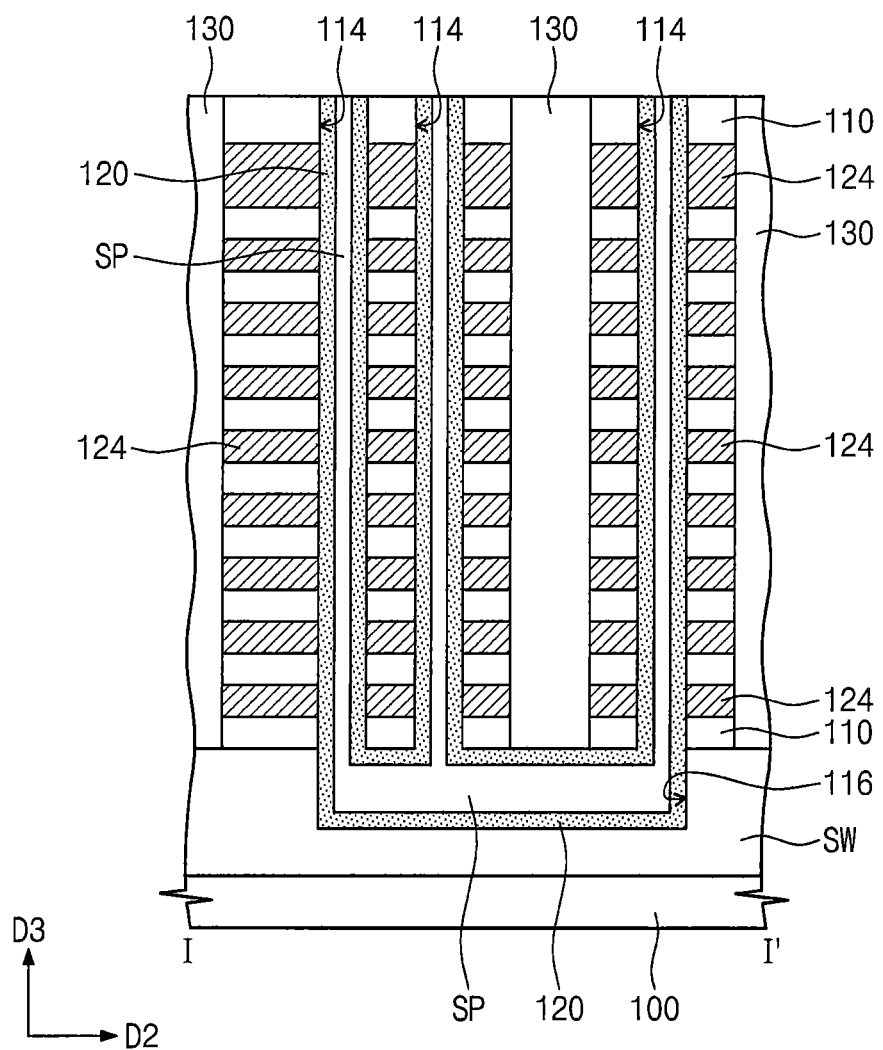

Referring to FIG. 6, conductive patterns 124 may be formed in the recess regions r. In example embodiments shown in FIGS. 21 and 22, at least a portion of the memory layer 120 may be formed on, and in some embodiments to cover, inner surfaces of the recess regions r, before the formation of the conductive patterns 124, and then, the conductive patterns 124 may be formed in, and in some embodiments to fill, the remaining regions of the recess regions r, in which the at least portion of the memory layer 120 is formed.

The formation of the conductive patterns 124 may include forming a conductive layer on the substrate 100 in, and in some embodiments to fill, the trenches 122 and the recess regions r and then selectively removing the conductive layer from the trenches 122. As a result of the removal of the conductive layer from the trenches 122, the conductive patterns 124 may be locally formed in the recess regions r, respectively. Thereafter, the electrode separating patterns 130 may be formed in, and in some embodiments to fill, the trenches 122. The electrode separating patterns 130 may be formed in the trenches 122, respectively.

Referring back to FIG. 1C, the uppermost ones of the conductive patterns 124 may be used as the string and ground selection lines SSL and GSL of the cell array of the semiconductor device described with reference to FIG. 1a The string and ground selection lines SSL and GSL may be formed spaced apart from each other by the electrode separating pattern 130 interposed therebetween. The conductive patterns 124 interposed between the string selection line SSL and the substrate 100 may be used as the upper word lines WL1 of the cell array of the semiconductor device described with reference to FIG. 1D, and the conductive patterns 124 interposed between the ground selection line GSL and the substrate 100 may be used as the lower word lines WL2 of the cell array of the semiconductor device described with reference to FIG. 1D. The upper word lines WL1 may be formed spaced apart from the lower word lines WL2 by the electrode separating pattern 130 interposed therebetween. The gate structure GS may include the upper and lower word lines WL1 and WL2, the string selection line SSL, and the ground selection line GSL stacked on the substrate 100.

The semiconductor pattern SP and the memory layer 120, which are formed in the opening, may be defined as the channel structure CS. The channel structure CS may include the plurality of first vertical portions VP1, which are formed to penetrate the upper word lines WL1 and the string selection line SSL, the second vertical portion VP2, which is formed to penetrate the lower word lines WL2 and the ground selection line GSL, and the horizontal portion HP, which is provided below the gate structure GS to connect the first and second vertical portions VP1 and VP2.

The plurality of bit lines BL may be formed on the gate structure GS, and the common source line CSL may be formed between the gate structure GS and the bit lines BL. In the channel structure CS, the first vertical portions VP1 may be connected to corresponding ones of the bit lines BL, respectively, and the second vertical portion VP2 may be connected to the common source line CSL. The contact plugs PLG may be formed on the gate structure GS to connect the first vertical portions VP1 to the corresponding ones of the bit lines, respectively.

Second Embodiment

Figure 7A:
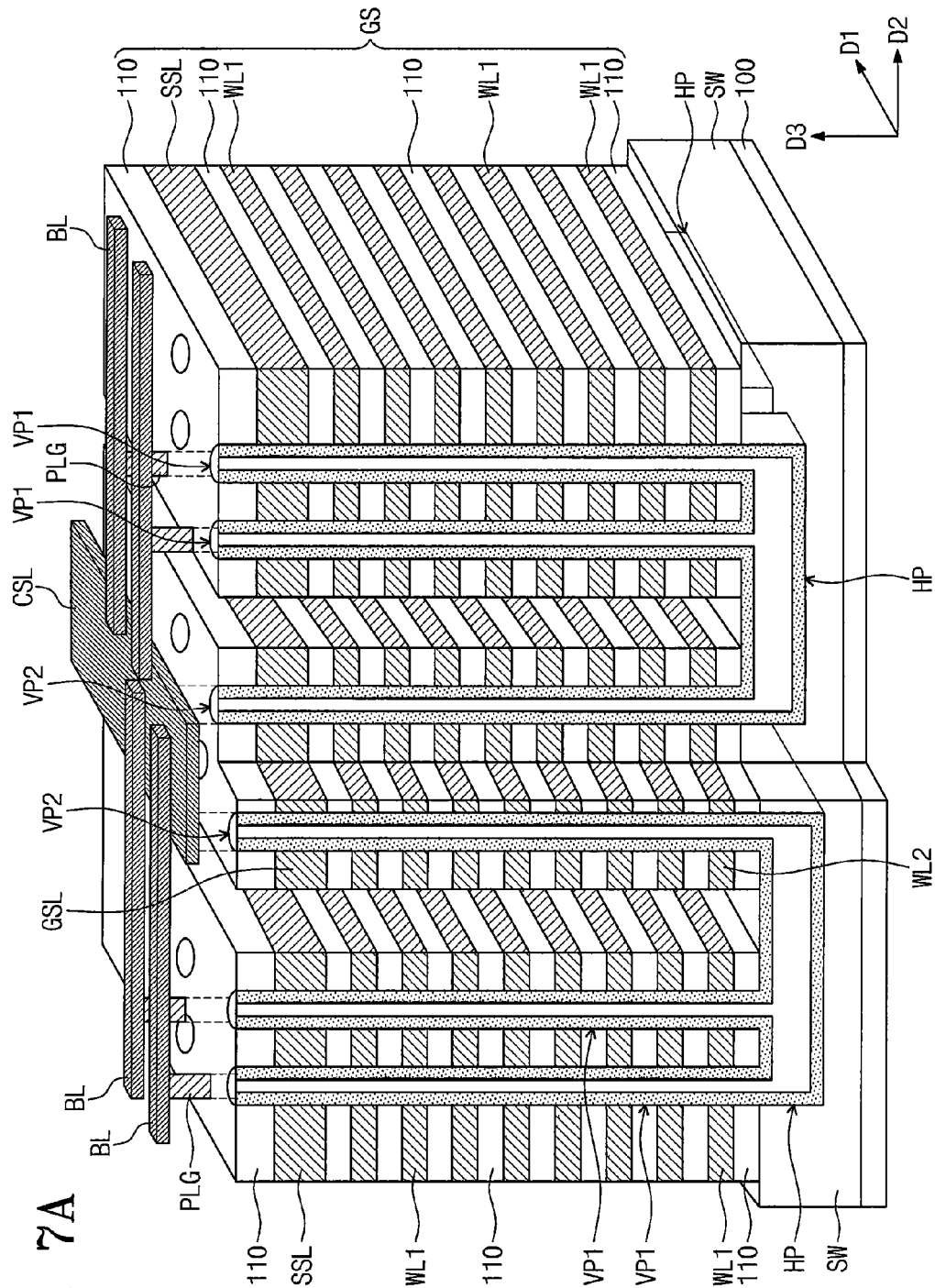
FIG. 7A is a perspective view illustrating a semiconductor device according to a second embodiment of the inventive concepts.
Figure 7B:
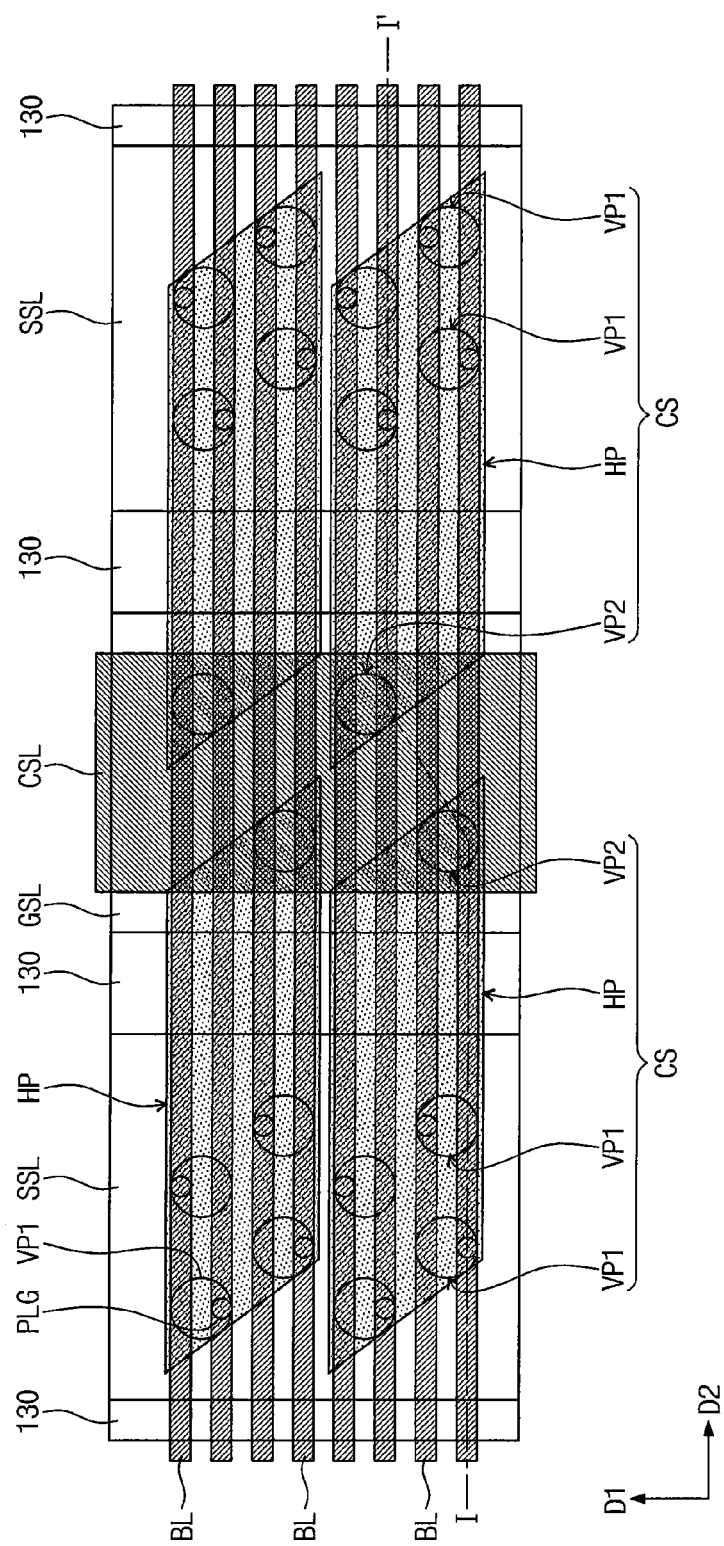
FIG. 7B is a plan view illustrating the semiconductor device according to the second embodiment of the inventive concepts.
Figure 7C:
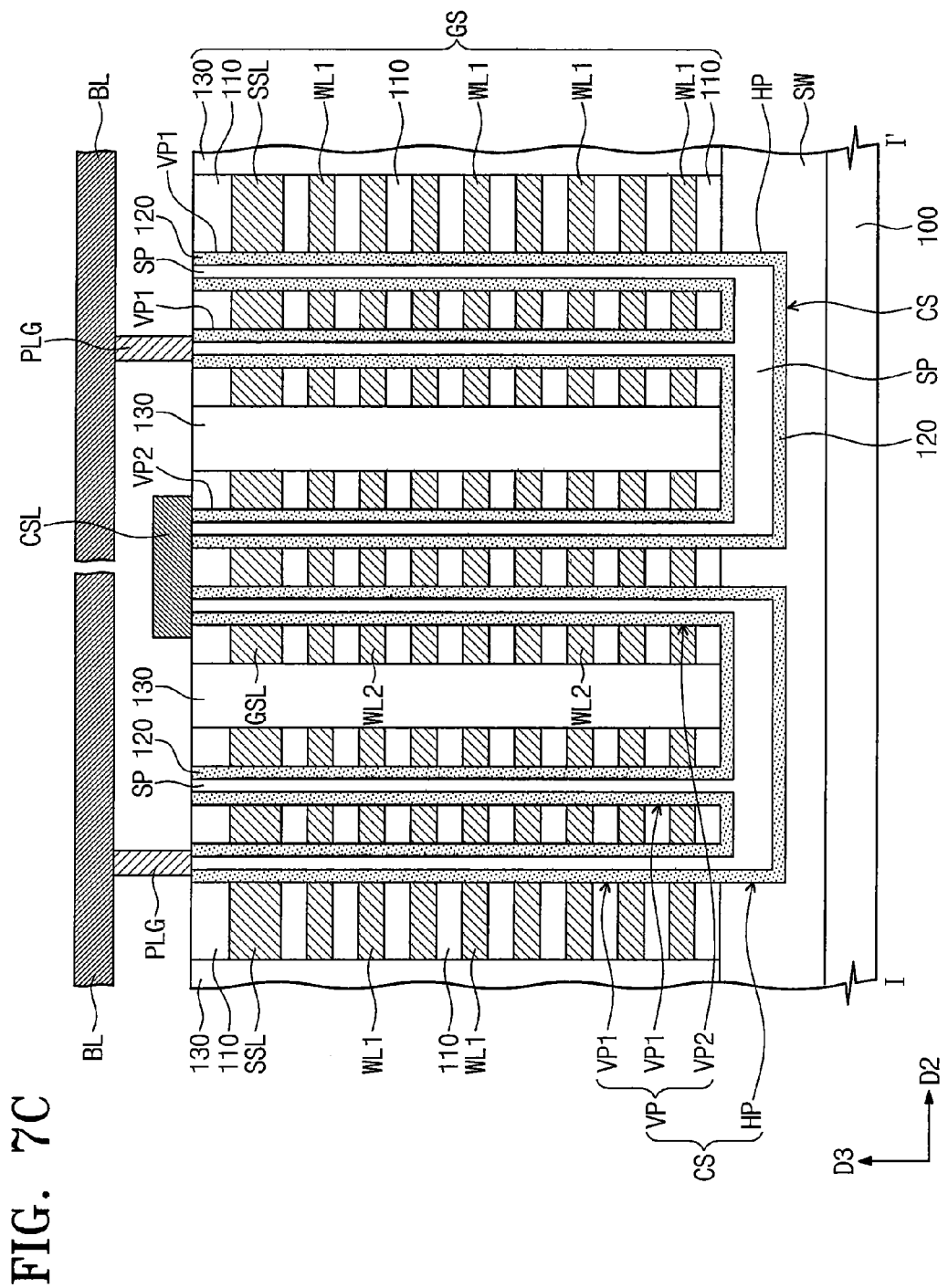
FIG. 7C is a sectional view taken along line I-I' of FIG. 7B.
Figure 7D:
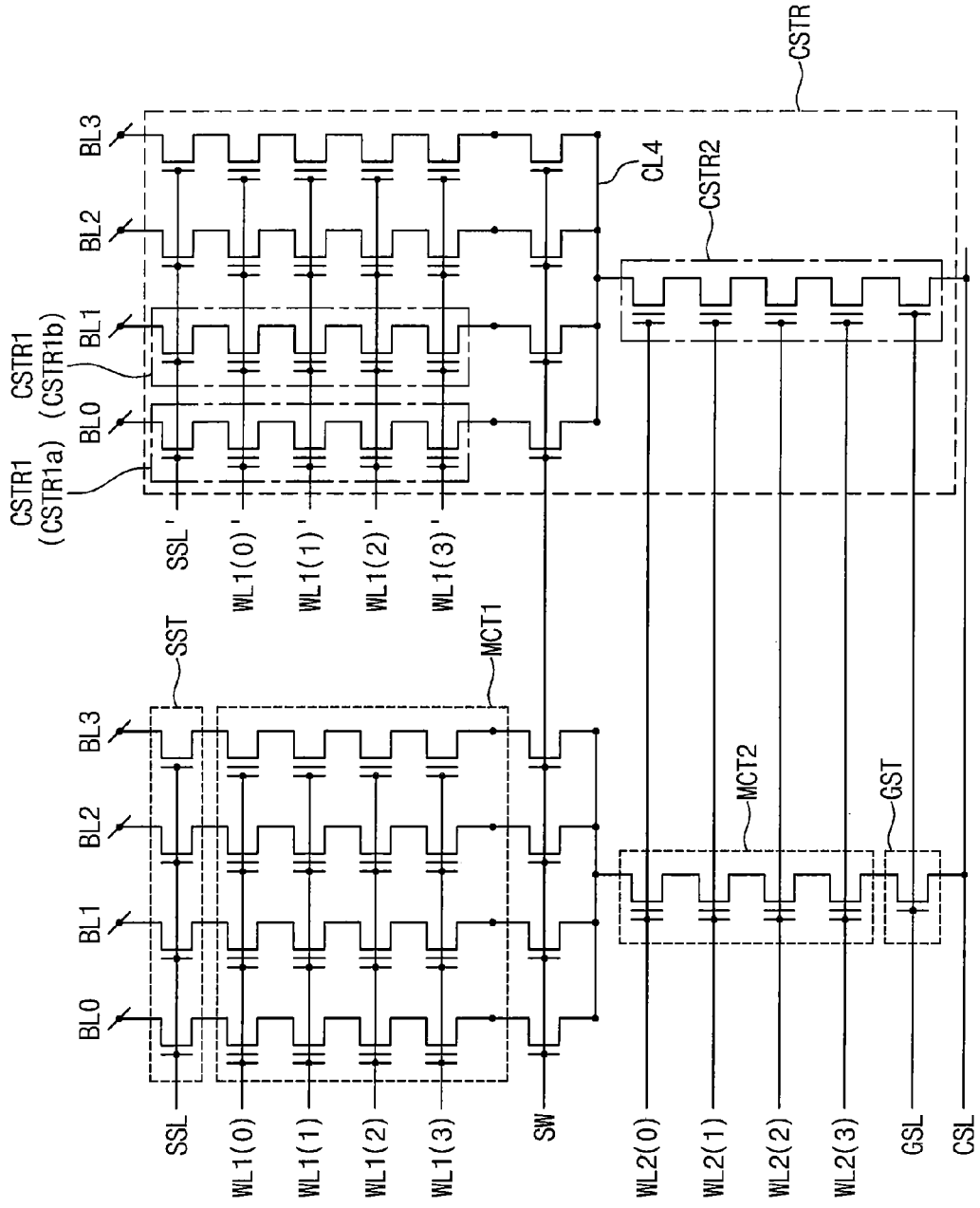
FIG. 7D is a schematic circuit diagram illustrating a cell array of the semiconductor device according to the second embodiment of the inventive concepts.

FIGS. 7A and 7B are perspective and plan views illustrating a semiconductor device according to a second embodiment of the inventive concepts, and FIG. 7C is a sectional view taken along line I-I' of FIG. 7B. Further, FIG. 7D is a schematic circuit diagram illustrating a cell array of the semiconductor device according to the second embodiment of the inventive concepts. In the following description of FIGS. 7A through 7D, an element previously described with reference to FIGS. 1A through 1D may be identified by a similar or identical reference number without repeating an overlapping description thereof, for the sake of brevity.

Referring to FIGS. 7A through 7C, a semiconductor device may include bit lines BL on a substrate 100, a gate structure GS between the substrate 100 and the bit lines BL, a common source line CSL between the gate structure GS and the bit lines BL, and channel structures CS penetrating the gate structure GS. Each of the channel structures CS may be provided to connect a corresponding one of the bit lines BL to the common source line CSL. The semiconductor device may further include contact plugs PLG provided between the gate structure GS and the bit lines BL.

The gate structure GS may include a plurality of word lines sequentially stacked on the substrate 100 and a plurality of selection lines disposed between the word lines and the bit lines BL. The selection lines may include a string selection line SSL between the word lines and the bit lines BL and a ground selection line GSL between the word lines and the common source line CSL. The word lines, the string selection line SSL, and the ground selection line GSL may extend parallel to a first direction D1. The string and ground selection lines SSL and GSL may be spaced apart from each other in a second direction D2 crossing the first direction D1. The word lines may include a plurality of upper word lines WL1 disposed between the substrate 100 and the string selection line SSL and a plurality of lower word lines WL2 disposed between the substrate 100 and the ground selection line GSL. The upper word lines WL1 may be spaced apart from the lower word lines WL2 in the second direction D2.

An electrode separating pattern 130 may be provided between the string and ground selection lines SSL and GSL and between the upper and lower word lines WL1 and WL2. The electrode separating pattern 130 may be a line-shaped pattern extending parallel to the first direction D1.

When viewed in plan view, the channel structures CS may be two-dimensionally arranged along the first and second directions D1 and D2. For example, as shown in FIG. 7B, the channel structures CS may be arranged to form columns parallel to the first direction D1 and rows parallel to the second direction D2.

Each of the channel structures CS may include a plurality of first vertical portions VP1 penetrating the upper word lines WL1 and the string selection line SSL and a second vertical portion VP2 penetrating the lower word lines WL2 and the ground selection line GSL. The first vertical portions VP1 may be connected to corresponding ones of the bit lines BL, and the second vertical portion VP2 may be connected to the common source line CSL. The first vertical portions VP1 may be connected to the corresponding bit lines through corresponding ones of the contact plugs PLG. Each of the channel structures CS may further include a horizontal portion HP, which is disposed below both the upper and lower word lines WL1 and WL2 to connect the first vertical portions VP1 to the second vertical portion VP2. When viewed in plan view, as shown in FIG. 7B, the horizontal portion HP may be shaped like a plate crossing the electrode separating pattern 130.

The channel structures CS adjacent to each other in the first direction D1 may share not only the string selection line SSL and the upper word lines WL1 but also the ground selection line GSL and the lower word lines WL2. For example, the first vertical portions VP1 of the channel structures CS adjacent to each other in the first direction D1 may be provided to penetrate the string selection line SSL and the upper word lines WL1. Further, the second vertical portions VP2 of the channel structures CS adjacent to each other in the first direction D1 may be provided to penetrate the ground selection line GSL and the lower word lines WL2.

According to the present embodiment, the channel structures CS may include a pair of channel structures CS disposed adjacent to each other in the second direction D2. Of the pair of channel structures CS, one may be connected to the string selection line SSL and the upper word lines WL1 and the other may be connected to other string selection line SSL and other upper word lines WL1, which are spaced apart from the string selection line SSL and the upper word lines WL1 with the ground selection line GSL and the lower word lines WL2 interposed therebetween. In other words, each of the string selection line SSL and the upper word lines WL1 may not be shared by both of the pair of the channel structures CS adjacent to each other in the second direction D2. The ground selection line GSL and the lower word lines WL2 may be shared by both of the pair of the channel structures CS disposed adjacent to each other in the second direction D2.

For example, the first vertical portions VP1 of one of the pair of the channel structures CS may be provided to penetrate the string selection line SSL and the upper word lines WL1. The first vertical portions VP1 of the other of the pair of the channel structures CS may be provided to penetrate other string selection line SSL and other upper word lines WL1, which are spaced apart from the string selection line SSL and the upper word lines WL1 with the ground selection line GSL and the lower word lines WL2 interposed therebetween. The second vertical portions VP2 of the pair of the channel structures CS may be provided to penetrate the lower word lines WL2 and the ground selection line GSL.

As shown in FIG. 7B, when viewed in plan view, the second vertical portions VP2 of the pair of the channel structures CS may be disposed to form a zigzag arrangement.

According to the present embodiment, since the ground selection line GSL and the lower word lines WL2 are shared by the pair of the channel structures CS disposed adjacent to each other in the second direction D2, the semiconductor device can be fabricated to have an increased integration density.

Each of the channel structures CS may include a semiconductor pattern SP, which penetrates the gate structure GS and to extend blow the gate structure GS, and a memory layer 120 interposed between the semiconductor pattern SP and the gate structure GS.

A switching device SW may be provided in the substrate 100 to selectively control an electric current flowing through the horizontal portion HP of the channel structure CS. According to the present embodiment, the switching device SW may be configured to simultaneously control the horizontal portions HP of the channel structures CS, which are two-dimensionally arranged along the first and second directions D1 and D2.

Referring to FIG. 7D, a cell array of the semiconductor device according to the second embodiment of the inventive concepts may include the common source line CSL, the plurality of bit lines BL, and a plurality of cell strings CSTR between the common source line CSL and the bit lines BL.

Each of the cell strings CSTR may include a plurality of upper strings CSTR1 (for example, CSTR1a, CSTR1b) which are respectively connected to corresponding ones of the bit lines BL, and a single lower string CSTR2 connected to the common source line CSL. The plurality of upper strings CSTR1 (for example, CSTR1a, CSTR1b) may be connected in common to the lower string CSTR2. The upper strings CSTR1 (for example, CSTR1a, CSTR1b) may be connected in common to the lower string CSTR2 through the switching device SW.

The upper strings CSTR1 (for example, CSTR1a, CSTR1b) of each of the cell strings CSTR may share the string selection line SSL and upper word lines WL1(0)-WL1(3) disposed between the bit lines BL and the switching devices SW. In other words, the upper strings CSTR1 (for example, CSTR1a, CSTR1b) of each of the cell strings CSTR may be controlled by the string selection line SSL and the upper word lines'WL1(0)-WL1(3). The lower string CSTR2 of each of the cell strings CSTR may be connected to the ground selection line GSL and lower word lines WL2(0)-WL2(3) disposed between the common source line CSL and the switching devices SW. In other words, the lower string CSTR2 of each of the cell strings CSTR may be controlled by the ground selection line GSL and the lower word lines WL2(0)-WL2(3).

The cell strings CSTR may include at least a pair of cell strings CSTR which share the ground selection line GSL and the lower word lines WL2(0)-WL2(3). The lower strings CSTR2 of the pair of the cell strings CSTR may share the ground selection line GSL and the lower word lines WL2(0)-WL2(3). The pair of cell strings CSTR may not share the string selection line SSL and the upper word lines WL1(0)-WL1(3). The pair of cell strings CSTR may share the corresponding ones of the bit lines BL, which are connected to the upper strings CSTR1 of each of the pair of the cell strings CSTR.

The switching devices SW connected to the upper strings CSTR1 (for example, CSTR1a, CSTR1b) of the pair of the cell strings CSTR may be configured in such a way that the same voltage is applied thereto.

Figure 9:
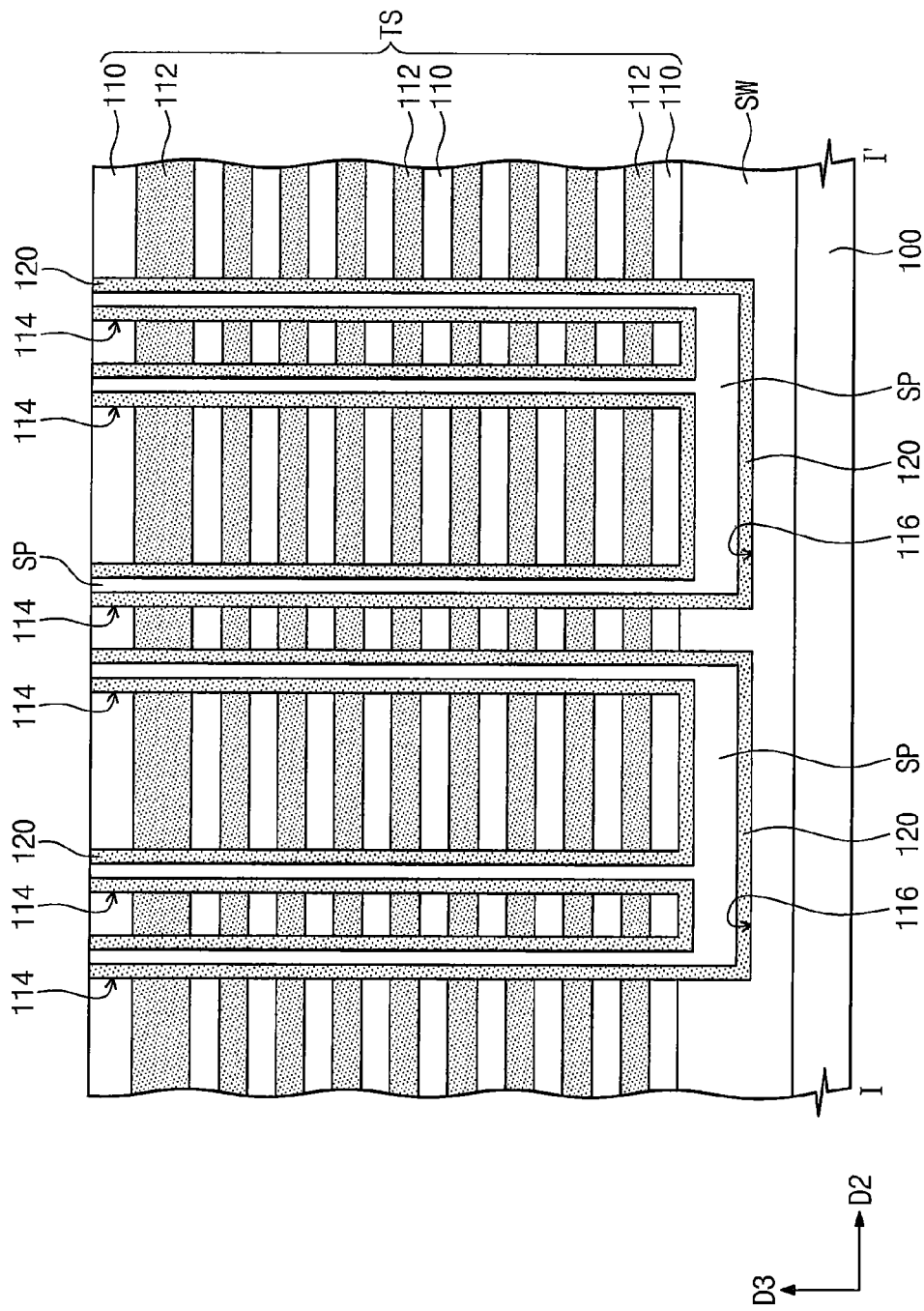
Figure 10:
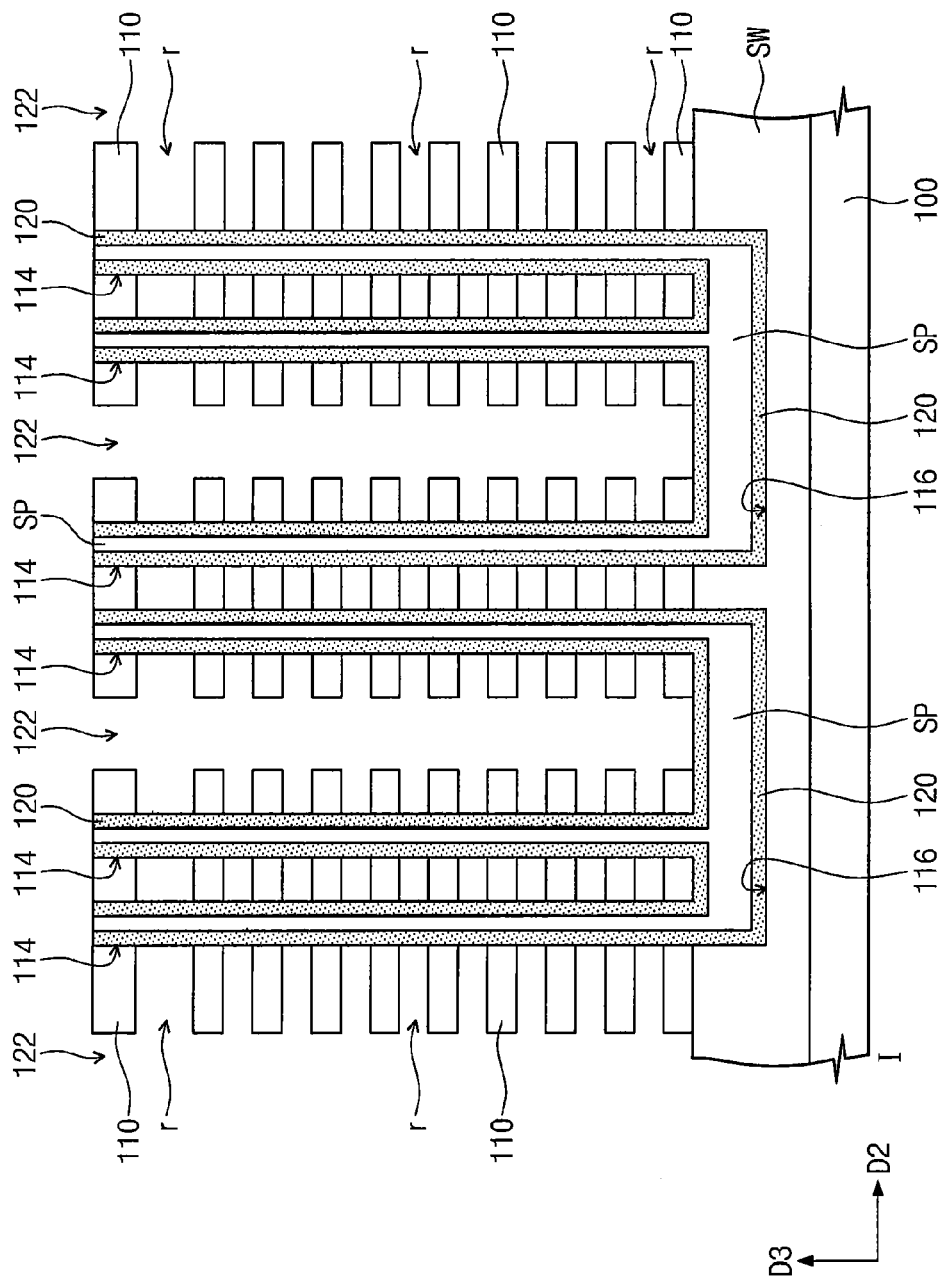

FIGS. 8 through 10 are sectional views taken along the line I-I' of FIG. 7B to illustrate a method of fabricating the semiconductor device according to the second embodiment of the inventive concepts. In the following description of FIGS. 8 through 10, an element or step previously described with reference to FIGS. 2 through 6 may be identified by a similar or identical reference number without repeating an overlapping description thereof, for the sake of brevity.

First, as described with reference to FIG. 2, the switching device SW and a buried sacrificial pattern 102 may be formed in the substrate 100, and the layered structure TS may be formed on the structure provided with the buried sacrificial pattern 102. In the case where a plurality of buried sacrificial patterns 102 are formed, the plurality of buried sacrificial patterns 102 may be two-dimensionally arranged in both of first and second directions D2, which are not parallel to each other, when viewed in plan view. The layered structure TS may include a plurality of insulating layers 110 and a plurality of sacrificial layers 112, which are alternatingly and repeatedly stacked on the substrate 100.

Referring to FIG. 8, through holes 114 may be formed to penetrate the layered structure TS and thereby expose a top surface of the buried sacrificial pattern 102. In example embodiments, at least three through holes 114 may be formed on the buried sacrificial pattern 102. Thereafter, the buried sacrificial pattern 102 may be selectively removed through the through holes 114, thereby forming a horizontal hole 116. The horizontal hole 116 may be formed to connect the at least three through holes 114 to each other. The through holes 114 and the horizontal hole 116 connected to each other may constitute one opening penetrating the layered structure TS.

Referring to FIG. 9, the semiconductor pattern SP may be formed in the opening. The semiconductor pattern SP may be formed to fill at least a portion of the opening. Before the formation of the semiconductor pattern SP, the memory layer 120 may be formed to conformally cover an inner surface of the opening.

Referring to FIG. 10, the layered structure TS may be patterned to form trenches 122 exposing the substrate 100. At least one of the trenches 122 may be formed to cross the horizontal hole 116. The trench 122 crossing the horizontal hole 116 may be formed between a pair of through holes 114 connected by the horizontal hole 116. Of the at least three through holes 114 connected by the horizontal hole 116, one may be formed on one side of the trench 122, and the others may be formed on opposite side of the trench 122.

In the case where a plurality of horizontal holes 116 are two-dimensionally arranged along the first and second directions D1 and D2, at least one of the trenches 122 may be formed to cross a plurality of the horizontal holes 116 arranged along the first direction D1. A pair of the trenches 122 spaced apart from each other in the second direction D2 may be formed to cross respectively a pair of the horizontal holes 116, which are spaced apart from each other in the second direction D2. Between the pair of the trenches 122, a pair of through holes 114 spaced apart from each other in the second direction D2 may be respectively connected to a pair of the horizontal holes 116 spaced apart from each other in the second direction D2.

The trenches 122 may be formed to expose side surfaces of the insulating and sacrificial layers 110 and 112. The sacrificial layers 112 exposed by the trenches 122 may be selectively removed to form recess regions r between the insulating layers 110. Each of the recess regions r may be a gap region, which is extended from the trenches 122 horizontally toward the semiconductor pattern SP. In example embodiments, the recess regions r may be formed to expose a sidewall of the memory layer 120.

The subsequent processes may be performed in substantially the same manner as those of the fabrication method previously described with reference to FIGS. 6 and 1C.

Modification of Second Embodiment

Figure 11A:
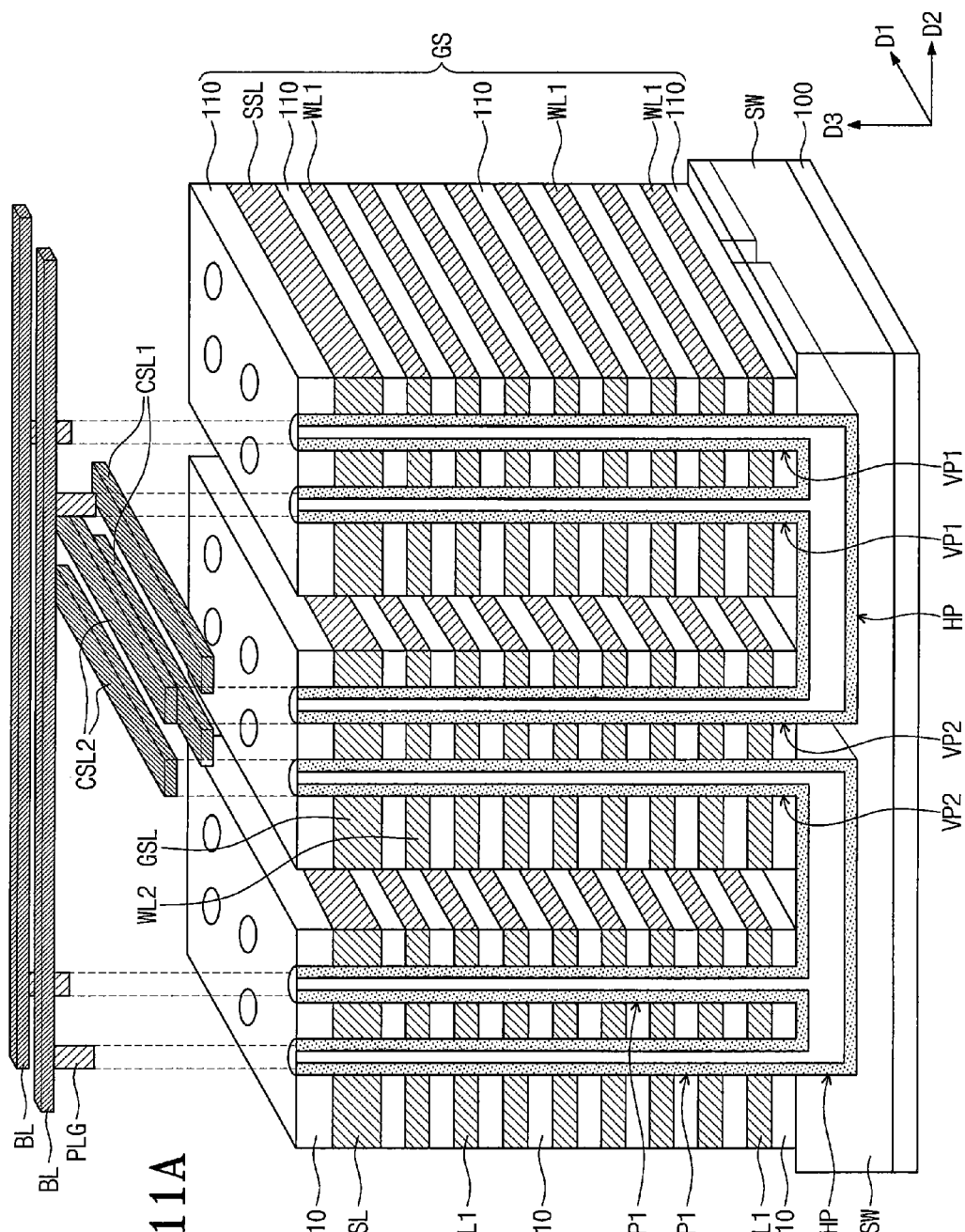
FIG. 11A is a perspective view illustrating a semiconductor device according to a modification of the second embodiment of the inventive concepts.
Figure 11B:
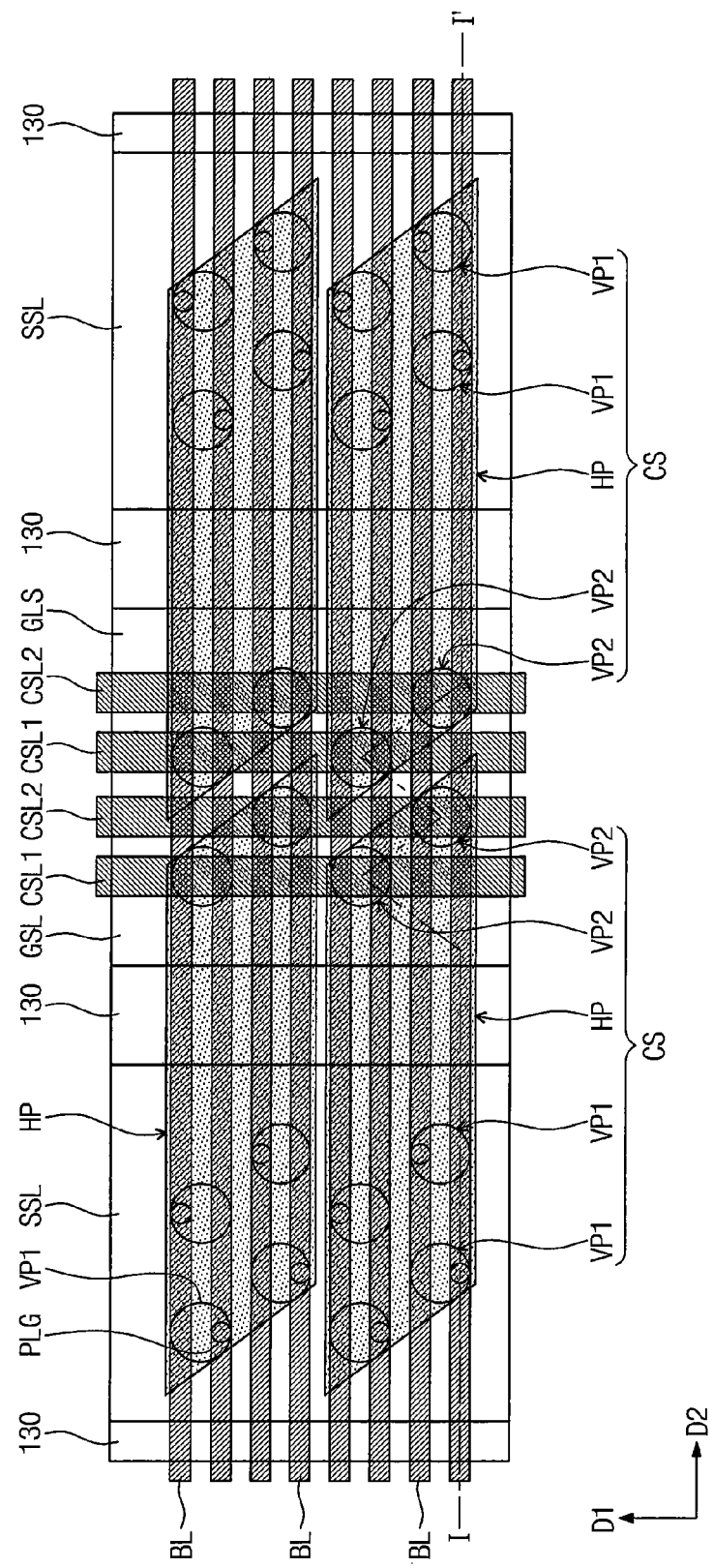
FIG. 11B is a plan view illustrating the semiconductor device according to the modification of the second embodiment of the inventive concepts.
Figure 11C:
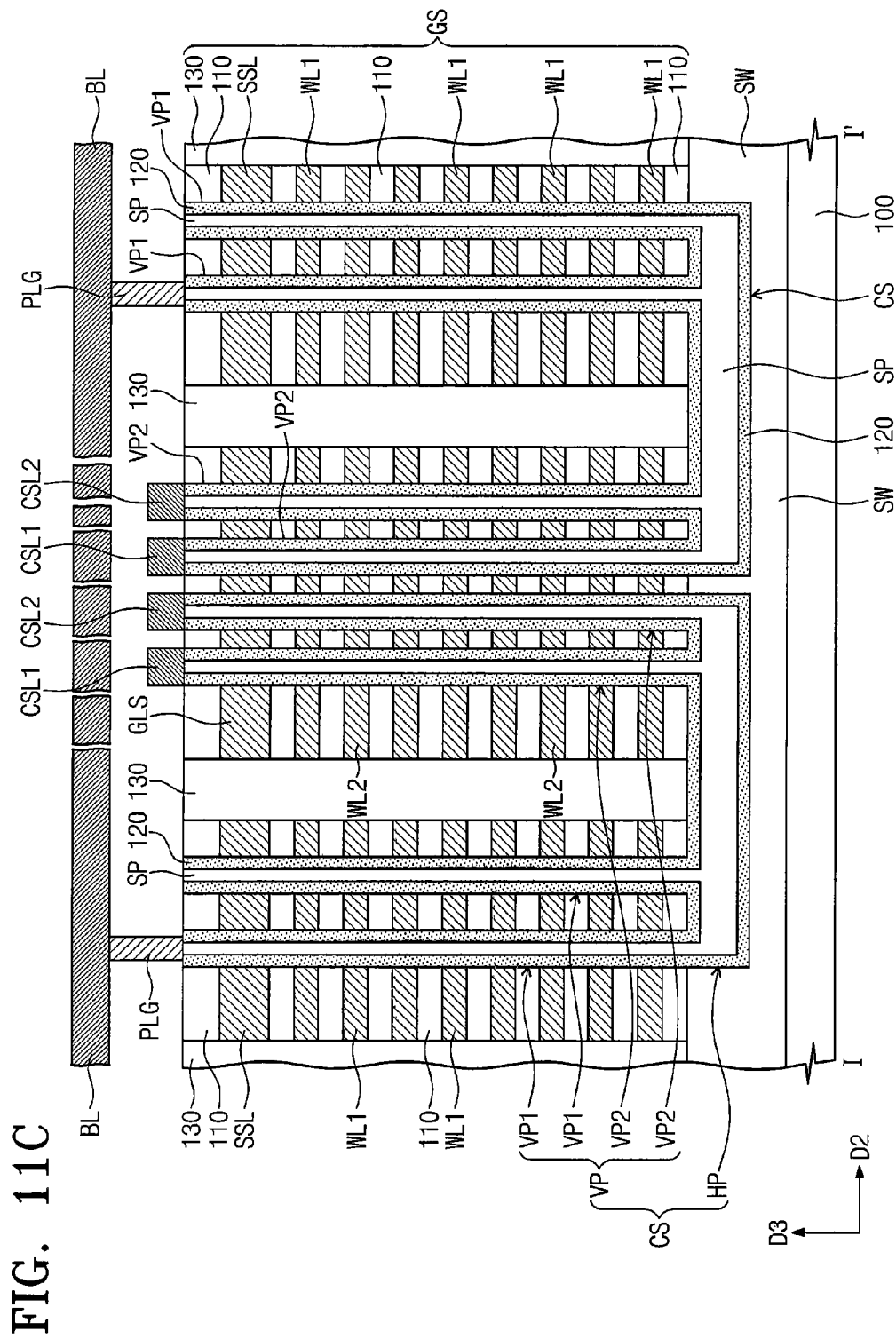
FIG. 11C is a sectional view taken along line I-I' of FIG. 11B.
Figure 11D:
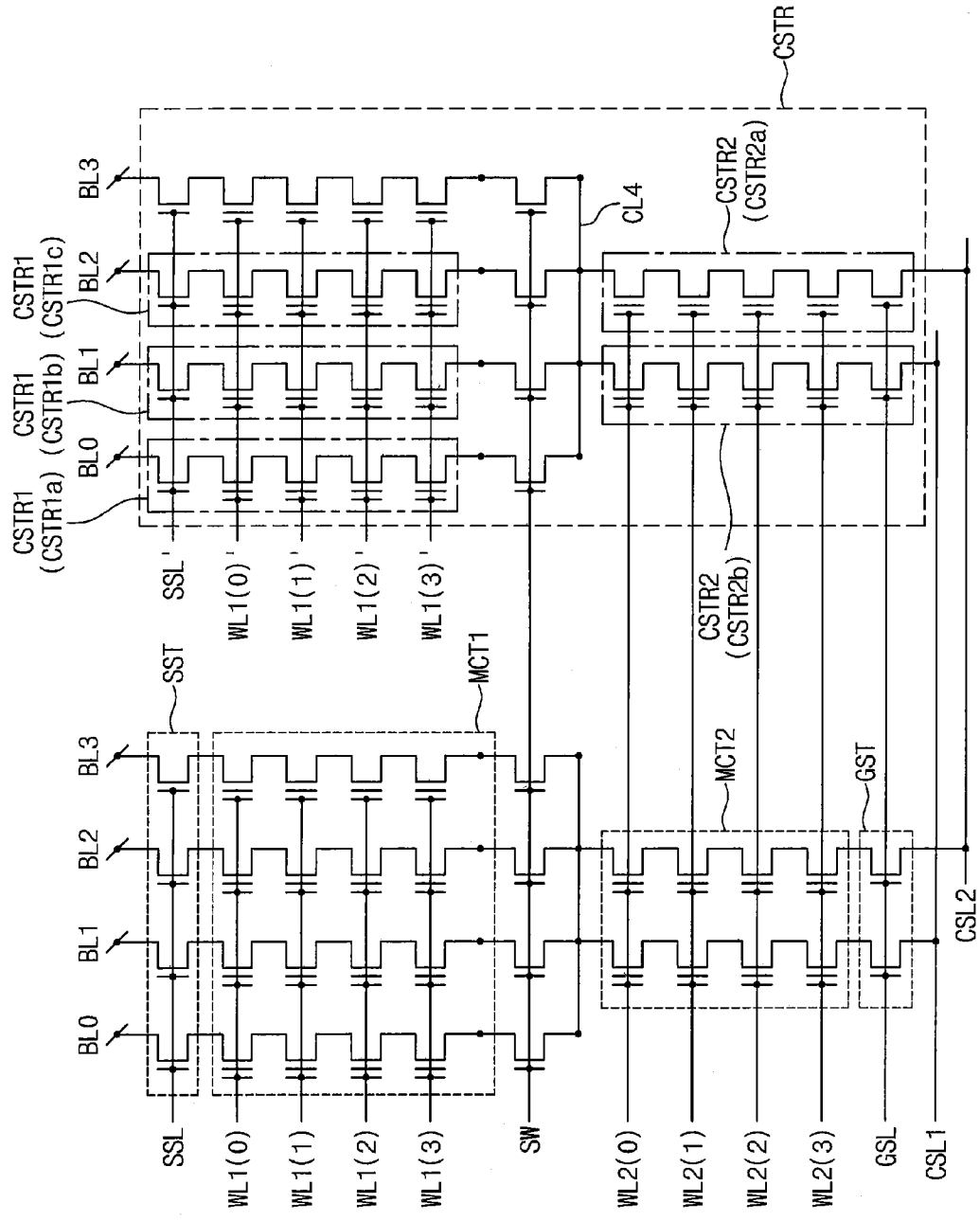
FIG. 11D is a schematic circuit diagram illustrating a cell array of the semiconductor device according to the modification of the second embodiment of the inventive concepts.

FIGS. 11A and 11B are perspective and plan views illustrating a semiconductor device according to a modification of the second embodiment of the inventive concepts, and FIG. 11C is a sectional view taken along line I-I' of FIG. 11B. In addition, FIG. 11D is a schematic circuit diagram illustrating a cell array of the semiconductor device according to the modification of the second embodiment of the inventive concepts. In the following description of FIGS. 11A through 11D, an element previously described with reference to FIGS. 7A through 7D may be identified by a similar or identical reference number without repeating an overlapping description thereof, for the sake of brevity.

Referring to FIGS. 11A through 11C, a semiconductor device may include bit lines BL on a substrate 100, a gate structure GS between the substrate 100 and the bit lines BL, a common source line between the gate structure GS and the bit lines BL, and channel structures CS penetrating the gate structure GS. Each of the channel structures CS may be provided to connect a corresponding one of the bit lines BL to the common source line CSL. According to the present embodiments, the common source line may include a plurality of lines. For example, the common source line may include a first common source line CSL1 and a second common source line CSL2, which are separated from each other. The first and second common source lines CSL1 and CSL2 may be configured in such a way that the same voltage is applied thereto or different voltages are independently applied thereto. The semiconductor device may further include contact plugs PLG provided between the gate structure GS and the bit lines BL.

The gate structure GS may include a plurality of word lines sequentially stacked on the substrate 100 and a plurality of selection lines disposed between the word lines and the bit lines BL. The selection lines may include a string selection line SSL between the word lines and the bit lines BL and a ground selection line GSL between the word lines and the common source lines CSL1 and CSL2. The word lines, the string selection line SSL, and the ground selection line GSL may extend parallel to a first direction D1. The string and ground selection lines SSL and GSL may be spaced apart from each other in a second direction D2 crossing the first direction D1. The word lines may include a plurality of upper word lines WL1 disposed between the substrate 100 and the string selection line SSL and a plurality of lower word lines WL2 disposed between the substrate 100 and the ground selection line GSL. The upper word lines WL1 may be spaced apart from the lower word lines WL2 in the second direction D2.

An electrode separating pattern 130 may be provided between the string and ground selection lines SSL and GSL and between the upper and lower word lines WL1 and WL2. The electrode separating pattern 130 may be a line-shaped pattern extending parallel to the first direction D1.

When viewed in plan view, the channel structures CS may be two-dimensionally arranged along the first and second directions D1 and D2. For example, as shown in FIG. 11B, the channel structures CS may be arranged to form columns parallel to the first direction D1 and rows parallel to the second direction D2.

According to the present embodiments, each of the channel structures CS may include a plurality of first vertical portions VP1 penetrating the upper word lines WL1 and the string selection line SSL, and a pair of second vertical portions VP2 penetrating the lower word lines WL2 and the ground selection line GSL. The first vertical portions VP1 may be connected to corresponding ones of the bit lines BL, and the pair of second vertical portions VP2 may be connected to the first and second common source lines CSL1 and CSL2, respectively. The first vertical portions VP1 may be connected to the corresponding bit lines BL through corresponding ones of the contact plugs PLG. Each of the channel structures CS may further include a horizontal portion HP, which is disposed below both the upper and lower word lines WL1 and WL2 to connect the first vertical portions VP1 to the pair of the second vertical portions VP2. As shown in FIG. 11B, when viewed in plan view, the horizontal portion HP may be shaped like a plate crossing the electrode separating pattern 130.

According to the present embodiments, in each channel structure CS, a pair of the second vertical portions VP2 are respectively connected to separated common source lines (e.g., CSL1 and CSL2), and this makes it possible to increase an integration density of a semiconductor device.

The channel structures CS adjacent to each other in the first direction D1 may share not only the string selection line SSL and the upper word lines WL1 but also the ground selection line GSL and the lower word lines WL2.

Of adjacent ones of the channel structures CS in the second direction D2, one may be connected to the string selection line SSL and the upper word lines WL1, and the other may be connected to other string selection line SSL and other upper word lines WL1, which are spaced apart from the string selection line SSL and the upper word lines WL1 with the ground selection line GSL and the lower word lines WL2 interposed therebetween. In other words, each of the string selection line SSL and the upper word lines WL1 may not be shared by the adjacent ones of the channel structures CS in the second direction D2.

The ground selection line GSL and the lower word lines WL2 may be shared by the adjacent ones of the channel structures CS in the second direction D2. In other words, the second vertical portions VP2 of the adjacent ones of the channel structures CS in the second direction D2 may be provided to penetrate the lower word lines WL2 and the ground selection line GSL.

As shown in FIG. 11B, when viewed in plan view, the second vertical portions VP2 of the adjacent ones of the channel structures CS in the second direction D2 may be disposed to form a zigzag arrangement.

Each of the channel structures CS may include a semiconductor pattern SP, which penetrates the gate structure GS and extend blow the gate structure GS, and a memory layer 120 interposed between the semiconductor pattern SP and the gate structure GS.

A switching device SW may be provided in the substrate 100 to selectively control an electric current flowing through the horizontal portion HP of the channel structure CS. The switching device SW may be configured to simultaneously control the horizontal portions HP of the channel structures CS, which are two-dimensionally arranged along the first and second directions D1 and D2.

Referring to FIG. 11D, a cell array of the semiconductor device may include a common source line, a plurality of bit lines BL, and a plurality of cell strings CSTR between the common source line and the bit lines BL. According to the present embodiments, the common source line may include a plurality of lines (for example, a first common source line CSL1 and a second common source line CSL2, which are separated from each other). The first and second common source lines CSL1 and CSL2 may be configured in such a way that the same voltage is applied thereto or different voltages are independently applied thereto.

Each of the cell strings CSTR may include a plurality of upper strings CSTR1 (for example, CSTR1*a*, CSTR1*b*, CSTR1*c*) which are respectively connected to a corresponding one of the bit lines BL, and a pair of lower strings CSTR2 (for example, CSTR2*a*, CSTR2*b*) which are respectively connected to a respective one of the common source lines CSL2 and CSL1. The plurality of upper strings CSTR1 (for example, CSTR1*a*, CSTR1*b*, CSTR1*c*) may be connected in common to the pair of lower strings CSTR2 (for example, CSTR2*a*, CSTR2*b*). In other words, the pair of lower strings CSTR2 (for example, CSTR2*a*, CSTR2*b*) may be shared by the plurality of upper strings CSTR1 (for example, CSTR1a, CSTR1b, CSTR1c). The upper strings CSTR1 (for example, CSTR1a, CSTR1b, CSTR1c) of each cell string CSTR may be connected in common to the lower strings CSTR2 (for example, CSTR2a, CSTR2b) through the switching device SW and the common line CL4.

The upper strings CSTR1 (for example, CSTR1a, CSTR1b, CSTR1c) of each of the cell strings CSTR may share the string selection line SSL and upper word lines WL1(0)-WL1(3) disposed between the bit lines BL and the switching devices SW. The lower strings CSTR2 (for example, CSTR2a, CSTR2b) of each of the cell strings CSTR may share the ground selection line GSL and the lower word lines WL2(0)-WL2(3) disposed between the common source line CSL and the switching devices SW.

Thus, FIG. 11D illustrates other embodiments that further comprise a fourth string of nonvolatile memory cells that are stacked on the substrate and are spaced apart from the first through third strings CSTR1a, CSTR2 (for example, CSTR2a), CSTR1b of nonvolatile memory cells, the fourth string of memory cells comprising a first end adjacent the substrate and a second end remote from the substrate, and a fifth conductive line that is connected to the second end of the fourth string of nonvolatile memory cells. The fourth conductive line CL4 also connects the first end of the fourth string of nonvolatile memory cells in common to the first ends of the first, second and third strings of nonvolatile memory cells CSTR1a, CSTR2 (for example, CSTR2a), CSTR1b. In some embodiments, the fourth string of memory cells corresponds to string CSTR1c in FIG. 11D that comprises a string selection transistor SST and is devoid of a ground selection transistor GST. In other embodiments, the fourth string of memory cells correspond to string CSTR2b of FIG. 11D that comprises a ground selection transistor GST and is devoid of a string selection transistor SST.

The cell strings CSTR may include a pair of the cell strings CSTR which share the ground selection line GSL and the lower word lines WL2(0)-WL2(3). The lower strings CSTR2 of the pair of the cell strings CSTR may share the ground selection line GSL and the lower word lines WL2(0)-WL2(3). The pair of the cell strings CSTR may not share the string selection line SSL and the upper word lines WL1(0)-WL1(3). The pair of cell strings CSTR may share the corresponding ones of the bit lines BL, which are connected to the upper strings CSTR1 of each of the pair of the cell strings CSTR.

Figure 13:
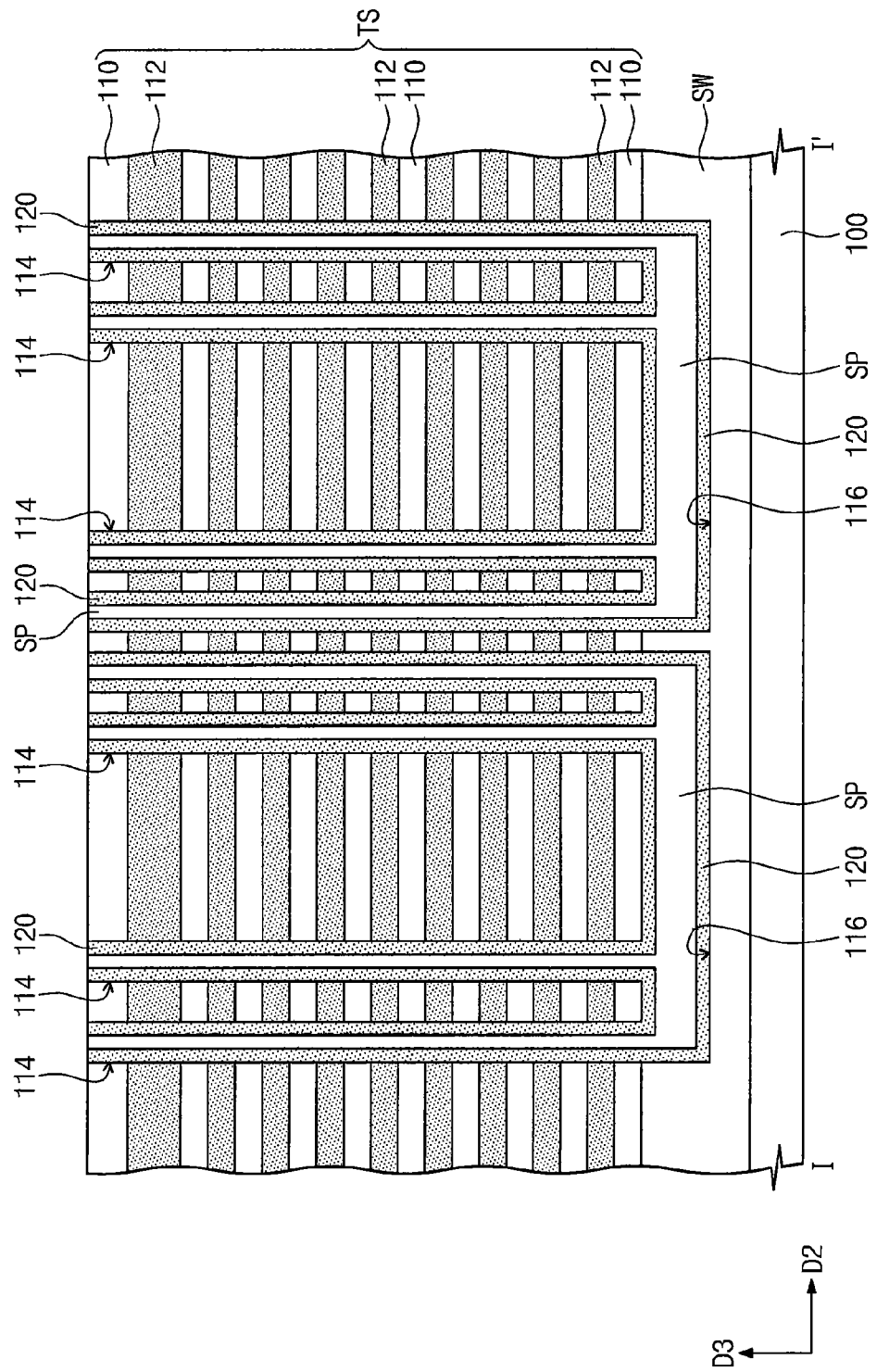
Figure 14:
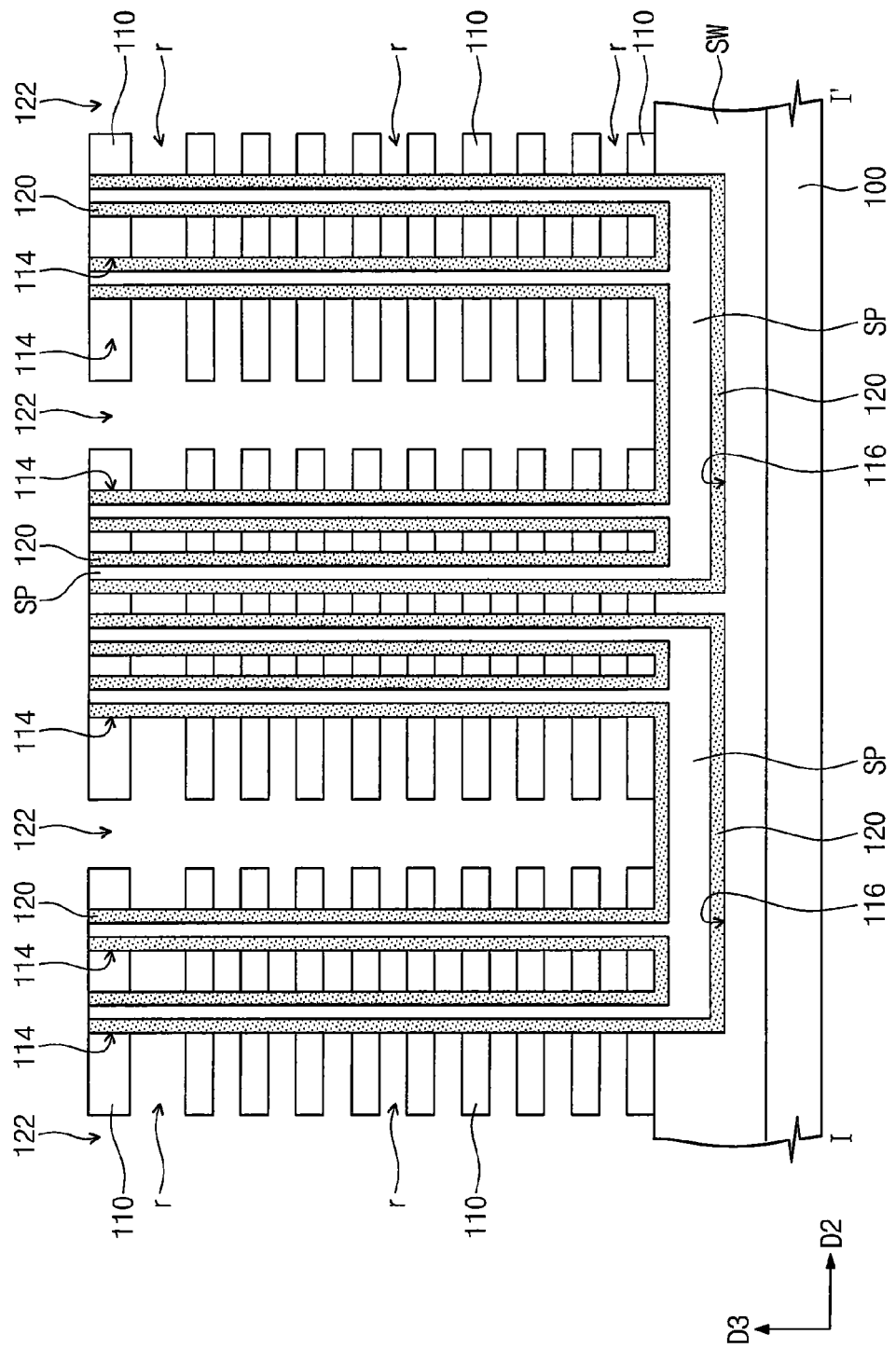

FIGS. 12 through 14 are sectional views taken along the line I-I' of FIG. 11B to illustrate a method of fabricating the semiconductor device according to the modification of the second embodiment of the inventive concepts. In the following description of FIGS. 12 through 14, an element or step previously described with reference to FIGS. 8 through 10 may be identified by a similar or identical reference number without repeating an overlapping description thereof, for the sake, of brevity.

First, as described with reference to FIG. 2, the switching device SW and a buried sacrificial pattern 102 may be formed in the substrate 100, and the layered structure TS may be formed on the structure provided with the buried sacrificial pattern 102. In the case where a plurality of buried sacrificial patterns 102 are formed, the plurality of buried sacrificial patterns 102 may be two-dimensionally arranged in both of first and second directions D2, which are not parallel to each other, when viewed in plan view. The layered structure TS may include a plurality of insulating layers 110 and a plurality of sacrificial layers 112, which are alternatingly and repeatedly stacked on the substrate 100.

Referring to FIG. 12, through holes 114 may be formed to penetrate the layered structure TS and thereby expose a top surface of the buried sacrificial pattern 102. At least four through holes 114 may be formed on the buried sacrificial pattern 102. Thereafter, the buried sacrificial pattern 102 may be selectively removed through the through holes 114, thereby forming a horizontal hole 116. The horizontal hole 116 may be formed to connect the at least four through holes 114 to each other. The through holes 114 and the horizontal hole 116 connected to each other may constitute one opening penetrating the layered structure TS.

Referring to FIG. 13, the semiconductor pattern SP may be formed in the opening. The semiconductor pattern SP may be formed to fill at least a portion of the opening. Before the formation of the semiconductor pattern SP, the memory layer 120 may be formed to conformally cover an inner surface of the opening.

Referring to FIG. 14, the layered structure TS may be patterned to form trenches 122 exposing side surfaces of the insulating and sacrificial layers 110 and 112. At least one of the trenches 122 may be formed to cross the horizontal hole 116. The trench 122 crossing the horizontal hole 116 may be formed between a pair of through holes 114 connected by the horizontal hole 116. Of the at least four through holes 114 connected by the horizontal hole 116, a pair may be formed on one side of the trench 122, and the other pair may be formed on opposite side of the trench 122.

In the case where a plurality of horizontal holes 116 are two-dimensionally arranged along the first and second directions D1 and D2, at least one of the trenches 122 may be formed to cross a plurality of the horizontal holes 116 arranged along the first direction D1. A pair of the trenches 122 spaced apart from each other in the second direction D2 may be formed to cross respectively a pair of the horizontal holes 116, which are spaced apart from each other in the second direction D2. Between the pair of the trenches 122, an adjacent pair of the through holes 114 may be connected in common to one of a pair of the horizontal holes 116 spaced apart from each other in the second direction D2, and another adjacent pair of the through holes 114 may be connected in common to the other of the pair of the horizontal holes 116.

The trenches 122 may be formed to expose side surfaces of the insulating and sacrificial layers 110 and 112. The sacrificial layers 112 exposed by the trenches 122 may be selectively removed to form recess regions r between the insulating layers 110. Each of the recess regions r may be a gap region, which is extended from the trenches 122 horizontally toward the semiconductor pattern SP. In example embodiments, the recess regions r may be formed to expose a sidewall of the memory layer 120.

The subsequent processes may be performed in substantially the same manner as those of the fabrication method previously described with reference to FIGS. 6 and 1C.

Third Embodiment

Figure 15A:
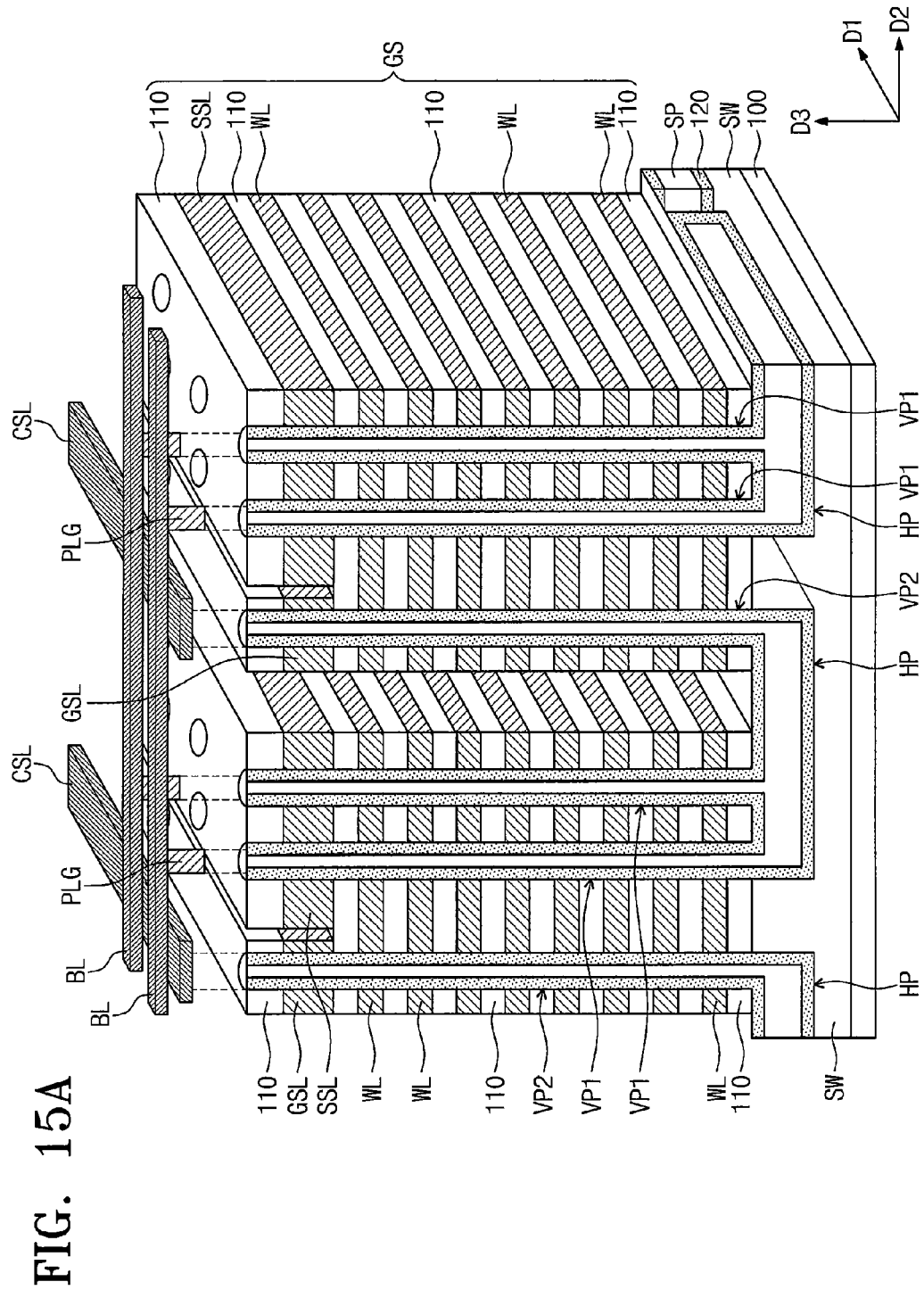
FIG. 15A is a perspective view illustrating a semiconductor device according to a third embodiment of the inventive concepts.
Figure 15B:
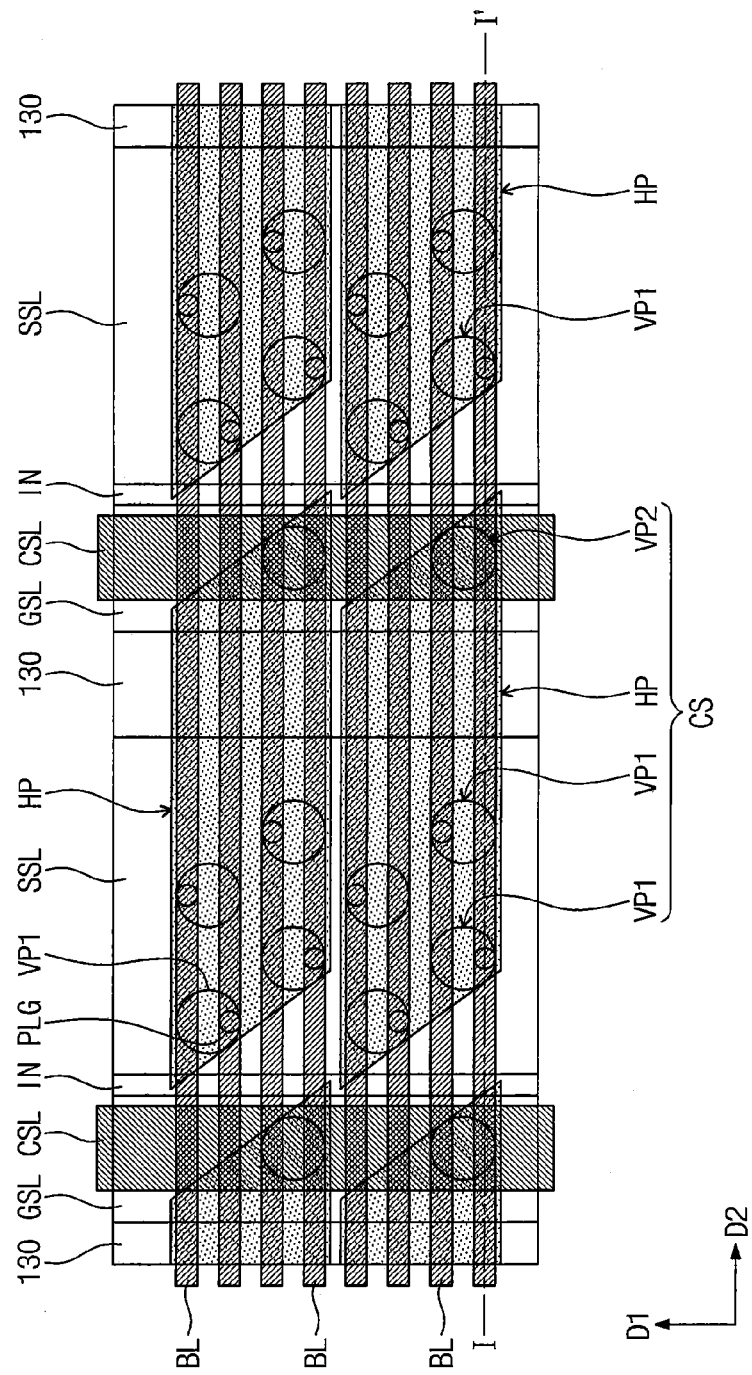
FIG. 15B is a plan view illustrating the semiconductor device according to the third embodiment of the inventive concepts.
Figure 15C:
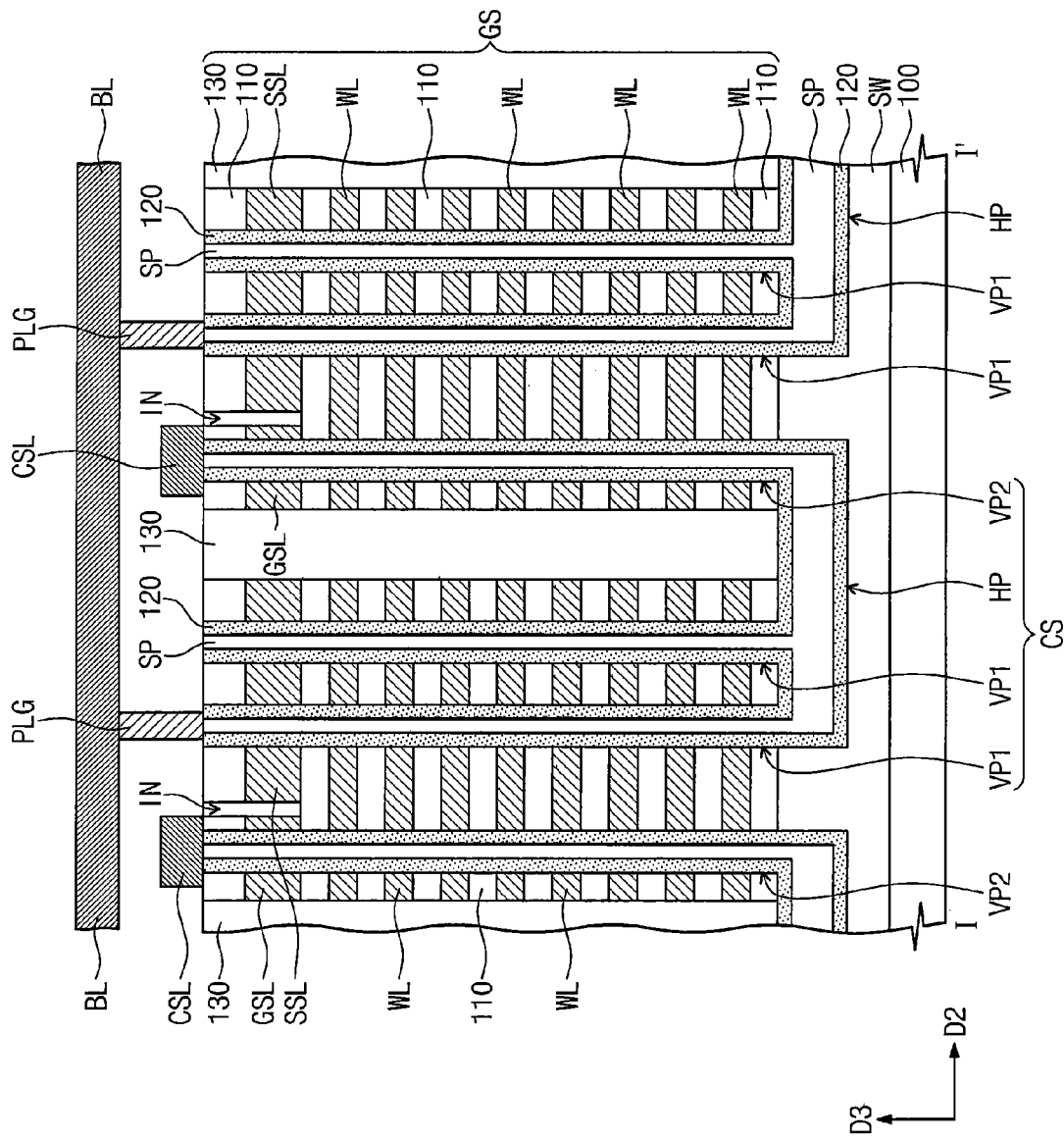
FIG. 15C is a sectional view taken along line I-I' of FIG. 15B.
Figure 15D:
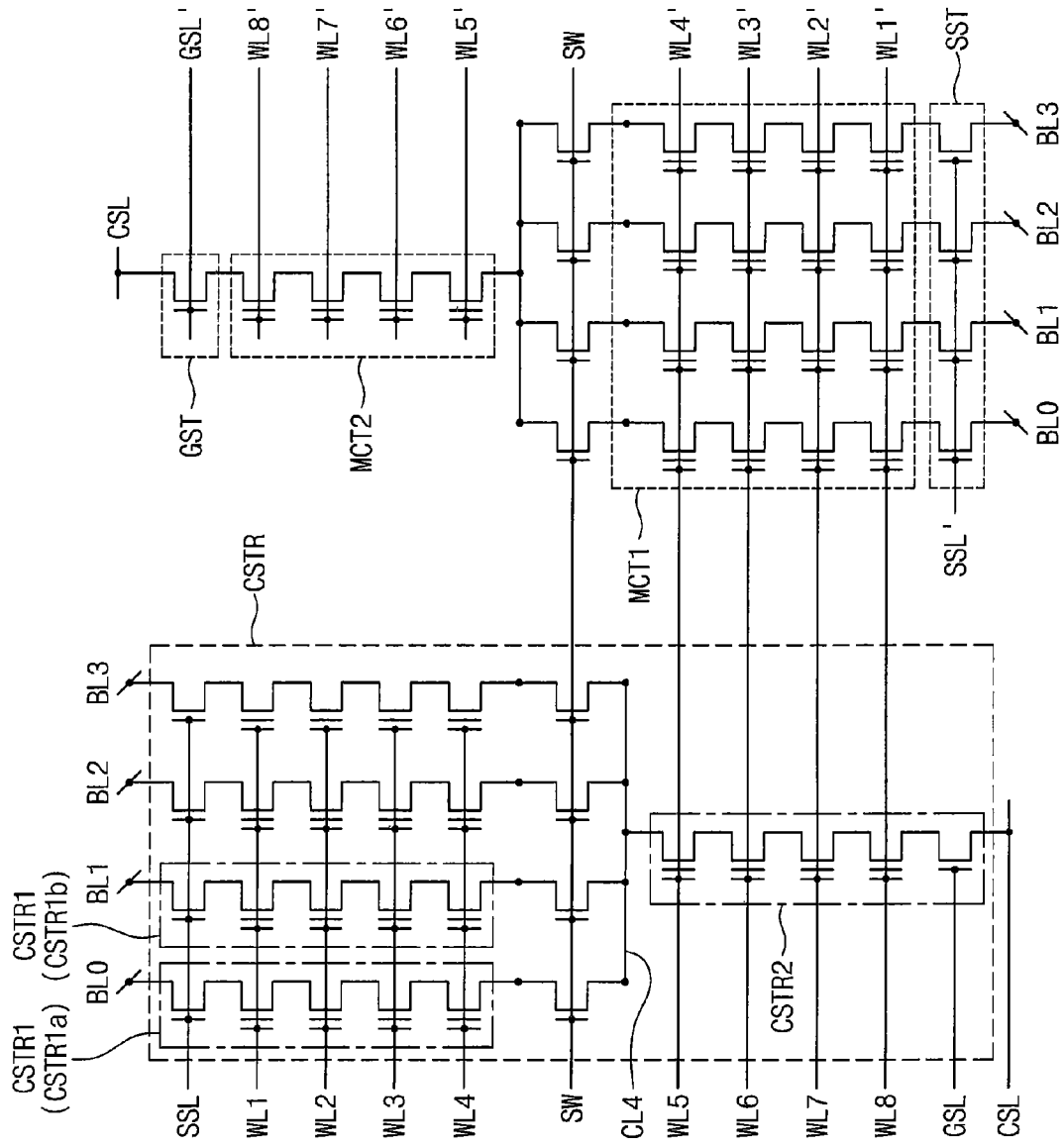
FIG. 15D is a schematic circuit diagram illustrating a cell array of the semiconductor device according to the third embodiment of the inventive concepts.

FIGS. 15A and 15B are perspective and plan views illustrating a semiconductor device according to a third embodiment of the inventive concepts, and FIG. 15C is a sectional view taken along line I-I' of FIG. 15B. In addition, FIG. 15D is a schematic circuit diagram illustrating a cell array of the semiconductor device according to the third embodiment of the inventive concepts. In the following description of FIGS. 15A through 15D, an element previously described with reference to FIGS. 1A through 1D may be identified by a similar or identical reference number without repeating an overlapping description thereof, for the sake of brevity.

Referring to FIGS. 15A through 15C, a semiconductor device may include bit lines BL on a substrate 100, a gate structure GS between the substrate 100 and the bit lines BL, a common source line CSL between the gate structure GS and the bit lines BL, and channel structures CS penetrating the gate structure GS. Each of the channel structures CS may be provided to connect a corresponding one of the bit lines BL to the common source line CSL. The semiconductor device may further include contact plugs PLG provided between the gate structure GS and the bit lines BL.

The gate structure GS may include a plurality of word lines WL sequentially stacked on the substrate 100 and a plurality of selection lines disposed between the word lines WL and the bit lines BL. The selection lines may include a string selection line SSL between the word lines WL and the bit lines BL and a ground selection line GSL between the word lines WL and the common source line CSL. The word lines WL, the string selection line SSL, and the ground selection line GSL may extend parallel to a first direction D1, and the string selection line SSL and the ground selection line GSL may be spaced apart from each other in a second direction D2 crossing the first direction D1. The word lines WL disposed below the ground selection line GSL may be spaced apart from the word lines WL disposed below the string selection line SSL in the second direction D2.

An electrode separating pattern 130 may be provided between the string and ground selection lines SSL and GSL and between two horizontally-separated groups of the word lines WL respectively disposed below the string and ground selection lines SSL and GSL. The electrode separating pattern 130 may be a line-shaped pattern extending parallel to the first direction D1.

According to the present embodiment, a pair of selection lines may be provided on each group of the word lines WL that are sequentially stacked on the substrate 100 and between an adjacent pair of the electrode separating pattern 130. The pair of selection lines may include the string selection line SSL and a neighboring ground selection line GSL, which is spaced apart from the ground selection line GSL by the string selection line SSL interposed therebetween. Or, the pair of selection lines may include the ground selection line GSL and a neighboring string selection line SSL, which is spaced apart from the sting selection line SSL by the ground selection line GSL interposed therebetween. The pair of selection lines are spatially and electrically separated from each other by an insulating pattern IN interposed therebetween. The insulating pattern IN may be a line-shaped pattern extending along the first direction D1 and may be formed of or include at least one of silicon oxide, silicon nitride, or silicon oxynitride.

Since the pair of selection lines are provided on each group of the word lines WL, the semiconductor device can be fabricated to have an increased integration density.

When viewed in plan view, the channel structures CS may be two-dimensionally arranged along the first and second directions D1 and D2. As shown in FIG. 15B, the channel structures CS may be arranged to form columns parallel to the first direction D1 and rows parallel to the second direction D2.

Each of the channel structures CS may include a plurality of first vertical portions VP1, which are provided to penetrate the string selection line SSL and the word lines WL therebelow, and a second vertical portion VP2, which is provided to penetrate the ground selection line GSL and the word lines WL therebelow. The first vertical portions VP1 may be connected to corresponding ones of the bit lines BL, and the second vertical portion VP2 may be connected to the common source line CSL. The first vertical portions VP1 may be connected to the corresponding bit lines through corresponding ones of the contact plugs PLG. Each of the channel structures CS may further include a horizontal portion HP, which is disposed below the word lines WL provided below the string selection line SSL, and extended below the word lines WL provided below the ground selection line GSL. The horizontal portion HP may be formed to connect the first vertical portions VP1 and the second vertical portion VP2. As shown in FIG. 15B, when viewed in plan view, the horizontal portion HP may be shaped like a plate crossing the electrode separating pattern 130.

Each of the channel structures CS may include a semiconductor pattern SP, which penetrates the gate structure GS and extend below the gate structure GS, and a memory layer 120 interposed between the semiconductor pattern SP wad the gate structure GS.

A switching device SW may be provided in the substrate 100 to selectively control an electric current flowing through the horizontal portion HP of the channel structure CS. The switching device SW may be configured to simultaneously control the horizontal portions HP of the plurality of channel structures CS.

Referring to FIG. 15D, a cell array of the semiconductor device according to the third embodiment of the inventive concepts may include the common source line CSL, the plurality of bit lines BL, and the plurality of cell strings CSTR between the common source line CSL and the bit lines BL.

Each of the cell strings CSTR may include a plurality of upper strings CSTR1 (for example, CSTR1a, CSTR1b), which are respectively connected to a corresponding one of the bit lines BL, and a single lower string CSTR2 connected to the common source line CSL. The plurality of upper strings CSTR1 (for example, CSTR1a, CSTR1b) may be connected in common to the lower string CSTR2. The upper strings CSTR1 (for example, CSTR1a, CSTR1b) may be connected in common to the lower string CSTR2 through the switching devices SW and the conductive line CL4.

The upper strings CSTR1 (for example, CSTR1a, CSTR1b) of each of the cell strings CSTR may share the string selection line SSL and word lines WL1-WL4 disposed between the bit lines BL and the switching devices SW. The lower string CSTR2 of each of the cell strings CSTR may be connected to the ground selection line GSL and word lines WL5-WL8 disposed between the common source line CSL and the switching devices SW.

The cell strings CSTR may include a pair of the cell strings CSTR which share some of the word lines. For example, the word lines WL5-WL8 may be used to control the lower string CSTR2 of one of the pair of the cell strings CSTR and the upper strings CSTR1 (for example, CSTR1a, CSTR1b) of the other of the pair of the cell strings CSTR. The ground selection line GSL connected to the lower string CSTR2 of one of the pair of the cell strings CSTR may be electrically separated from a string selection line SSL' shared by the upper strings CSTR1 (for example, CSTR1a, CSTR1b) of the other of the pair of the cell strings CSTR, and thus, the string selection line SSL' may be controlled without dependence on the ground selection line GSL.

In other words, the upper strings CSTR1 (for example, CSTR1a, CSTR1b) of one of the pair of the cell strings CSTR may share the word lines WL1'-WL4' with the lower string CSTR2 of the other of the pair of the cell strings CSTR. The string selection line SSL' shared by the upper strings CSTR1 (for example, CSTR1a, CSTR1b) of one of the pair of the cell strings CSTR may be electrically separated from the ground selection line GSL connected to the lower string CSTR2 of the other of the pair of the cell strings CSTR.

Figure 16:
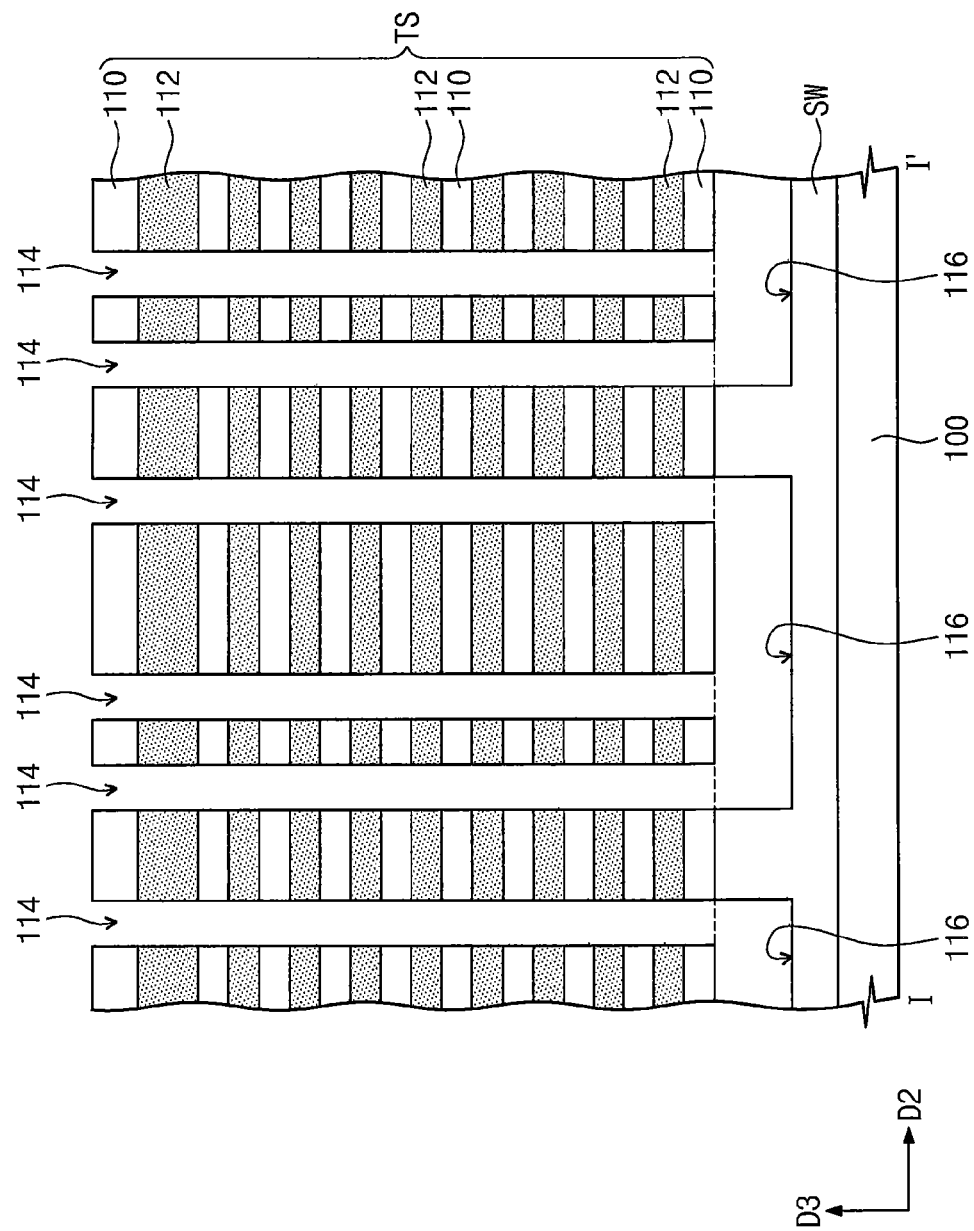
FIGS. 16 through 18 are sectional views taken along the line I-I' of FIG. 15B to illustrate a method of fabricating the semiconductor device according to the third embodiment of the inventive concepts.
Figure 17:
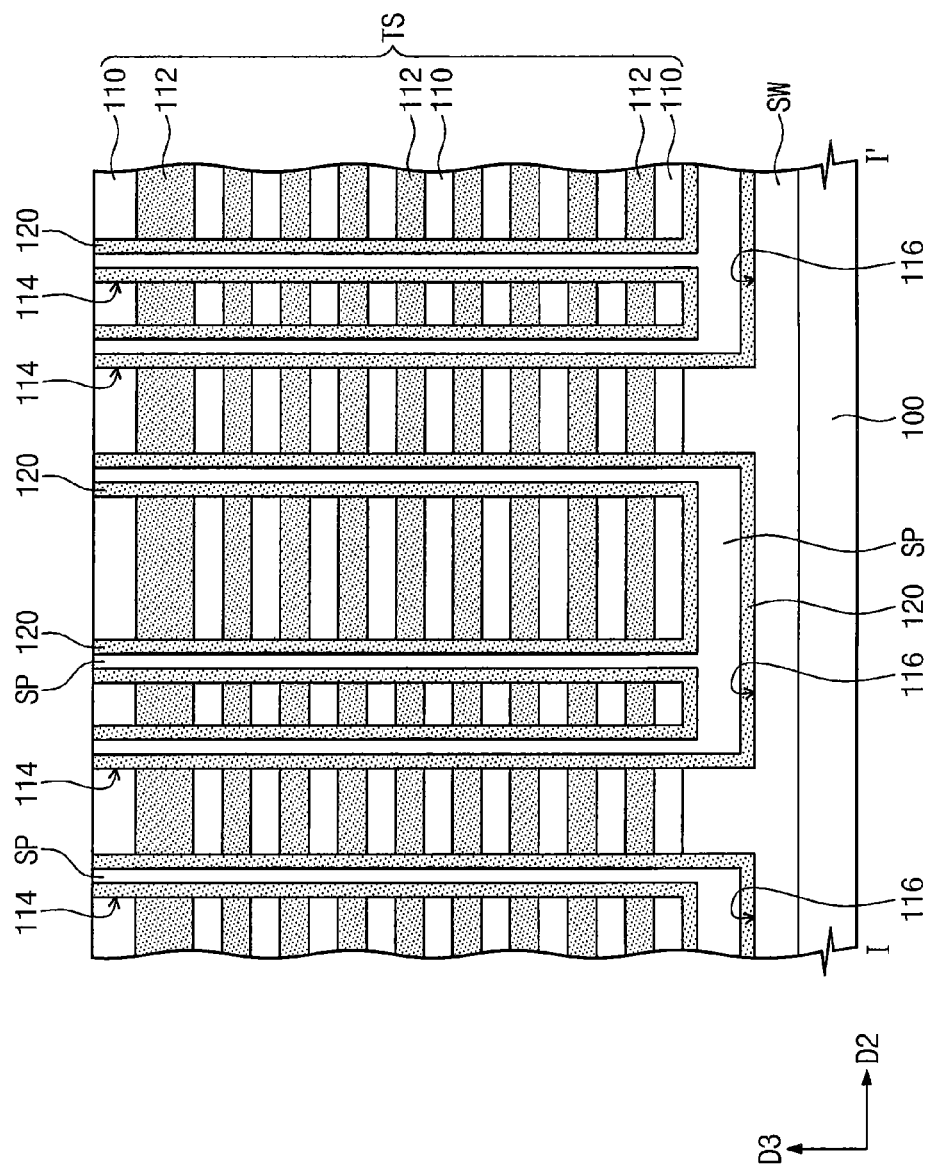
Figure 18:
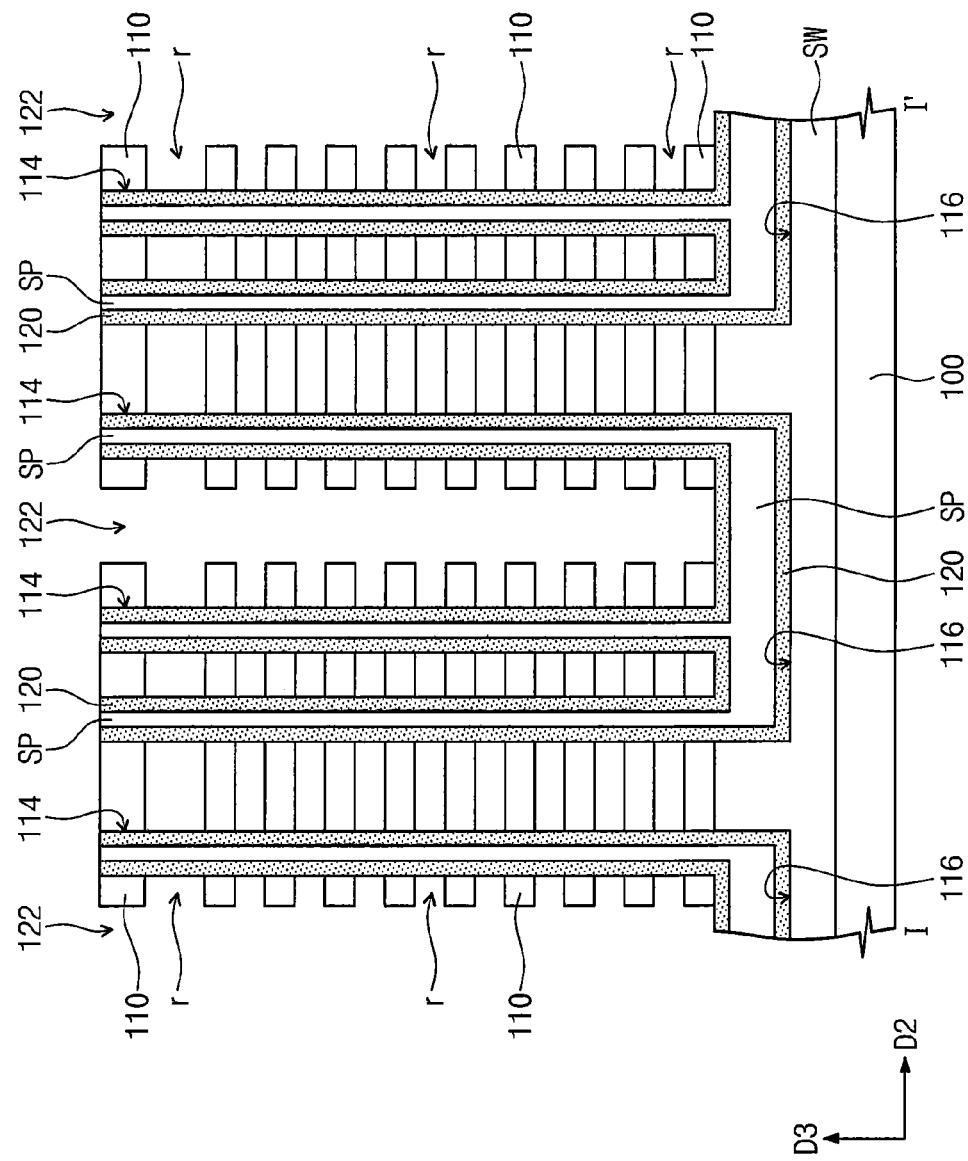

FIGS. 16 through 18 are sectional views taken along the line I-I' of FIG. 15B to illustrate a method of fabricating the semiconductor device according to the third embodiment of the inventive concepts. In the following description of FIGS. 16 through 18, an element or step previously described with reference to FIGS. 2 through 6 may be identified by a similar or identical reference number without repeating an overlapping description thereof, for the sake of brevity.

First, as described with reference to FIG. 2, the switching device SW and a buried sacrificial pattern 102 may be formed in the substrate 100, and the layered structure TS may be formed on the structure provided with the buried sacrificial pattern 102. A plurality of buried sacrificial patterns 102 may be provided, and in this case, when viewed in plan view, they may be two-dimensionally arranged in both of first and second directions D2, which are not parallel to each other. The layered structure TS may include a plurality of insulating layers 110 and a plurality of sacrificial layers 112, which are alternatingly and repeatedly stacked on the substrate 100.

Referring to FIG. 16, through holes 114 may be formed to penetrate the layered structure TS and thereby expose a top surface of the buried sacrificial pattern 102. At least three through holes 114 may be formed on the buried sacrificial pattern 102. Thereafter, the buried sacrificial patterns 102 may be selectively removed through the through holes 114, thereby forming a horizontal hole 116. The horizontal hole 116 may be formed to connect the at least three through holes 114 to each other. The through holes 114 and the horizontal hole 116 connected to each other may constitute one opening penetrating the layered structure TS.

Referring to FIG. 17, the semiconductor pattern SP may be formed in the opening. The semiconductor pattern SP may be formed to fill at least a portion of the opening. Before the formation of the semiconductor pattern SP, the memory layer 120 may be formed to conformally cover an inner surface of the opening.

Referring to FIG. 18, the layered structure TS may be patterned to form trenches 122 crossing the horizontal holes 116. Each of the trenches 122 may be formed between a pair of the through holes 114 connected in common to the horizontal hole 116. Of the at least three through holes 114 connected by the horizontal hole 116, one may be formed on one side of the trench 122 crossing the horizontal hole 116, and the others may be formed on opposite side of the trench 122.

The trenches 122 may be formed to expose side surfaces of the insulating and sacrificial layers 110 and 112. The sacrificial layers 112 exposed by the trenches 122 may be selectively removed to form recess regions r between the insulating layers 110. In example embodiments, the recess regions r may be formed to expose a sidewall of the memory layer 120.

Referring back to FIG. 15C, conductive patterns may be formed in the recess regions r. In example embodiments, as shown in FIGS. 21 and 22, at least a portion of the memory layer 120 may be formed to cover inner surfaces of the recess regions r, before the formation of the conductive patterns, and then, the conductive patterns may be formed to fill the remaining regions of the recess regions r, in which the at least portion of the memory layer 120 is formed.

The uppermost ones of the conductive patterns may be patterned to define the string and ground selection lines SSL and GSL. An insulating pattern IN may be interposed between the string and ground selection lines SSL and GSL.

The conductive patterns, which are disposed below the string selection line SSL, the ground selection line GSL, and the insulating pattern IN, may be used as the word lines WL. The string and ground selection lines SSL and GSL, which are horizontally separated from each other by the insulating pattern IN, may be provided on the word lines WL stacked on the substrate 100. In other words, the string and ground selection lines SSL and GSL may be overlapped with the word lines WL thereunder, when viewed in a plan view. The string and ground selection lines SSL and GSL disposed on each word line may be used as two different channel structures CS, respectively.

The subsequent processes may be performed in substantially the same manner as those of the fabrication method previously described with reference to FIG. 1C.

Modification of Third Embodiment

Figure 19A:
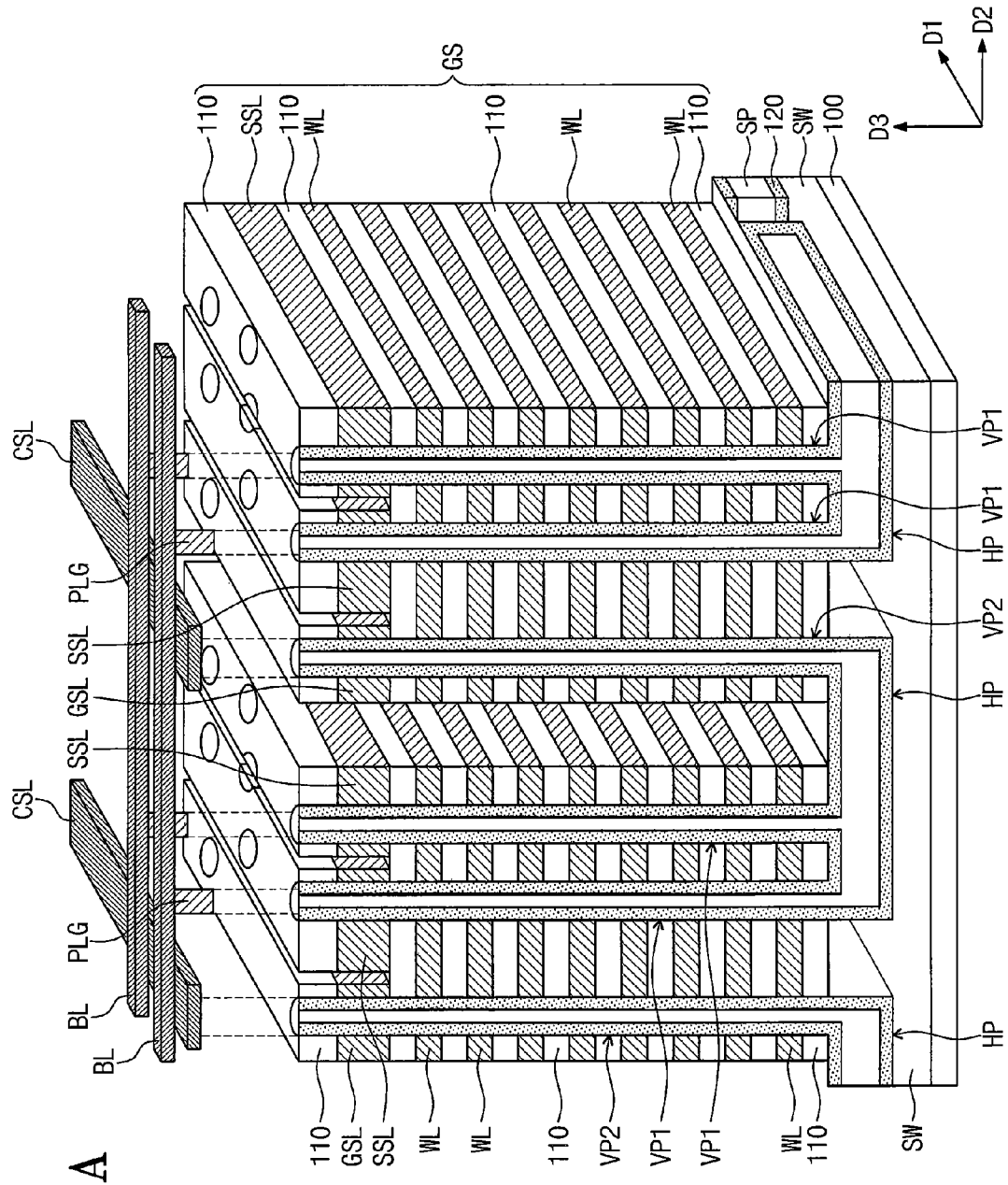
FIG. 19A is a perspective view illustrating a semiconductor device according to a modification of the third embodiment of the inventive concepts.
Figure 19B:
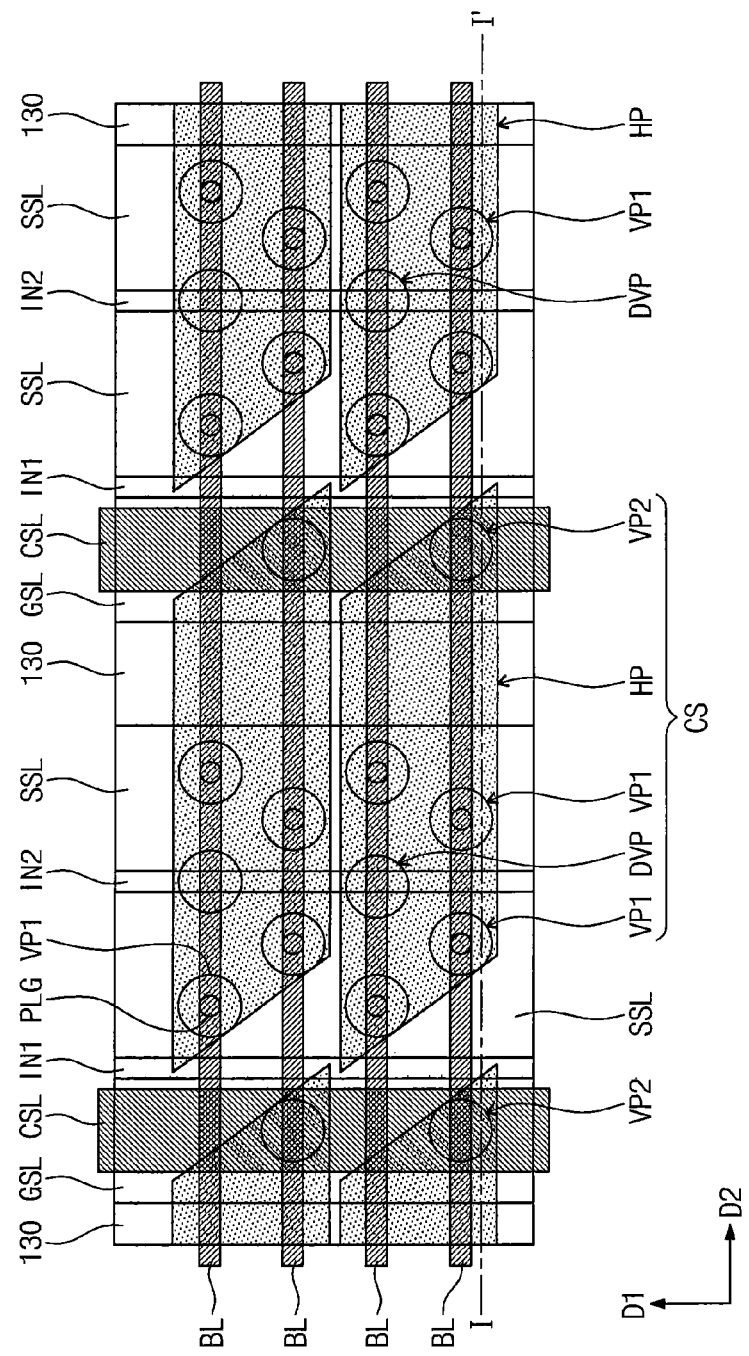
FIG. 19B is a plan view illustrating the semiconductor device according to the modification of the third embodiment of the inventive concepts.
Figure 19C:
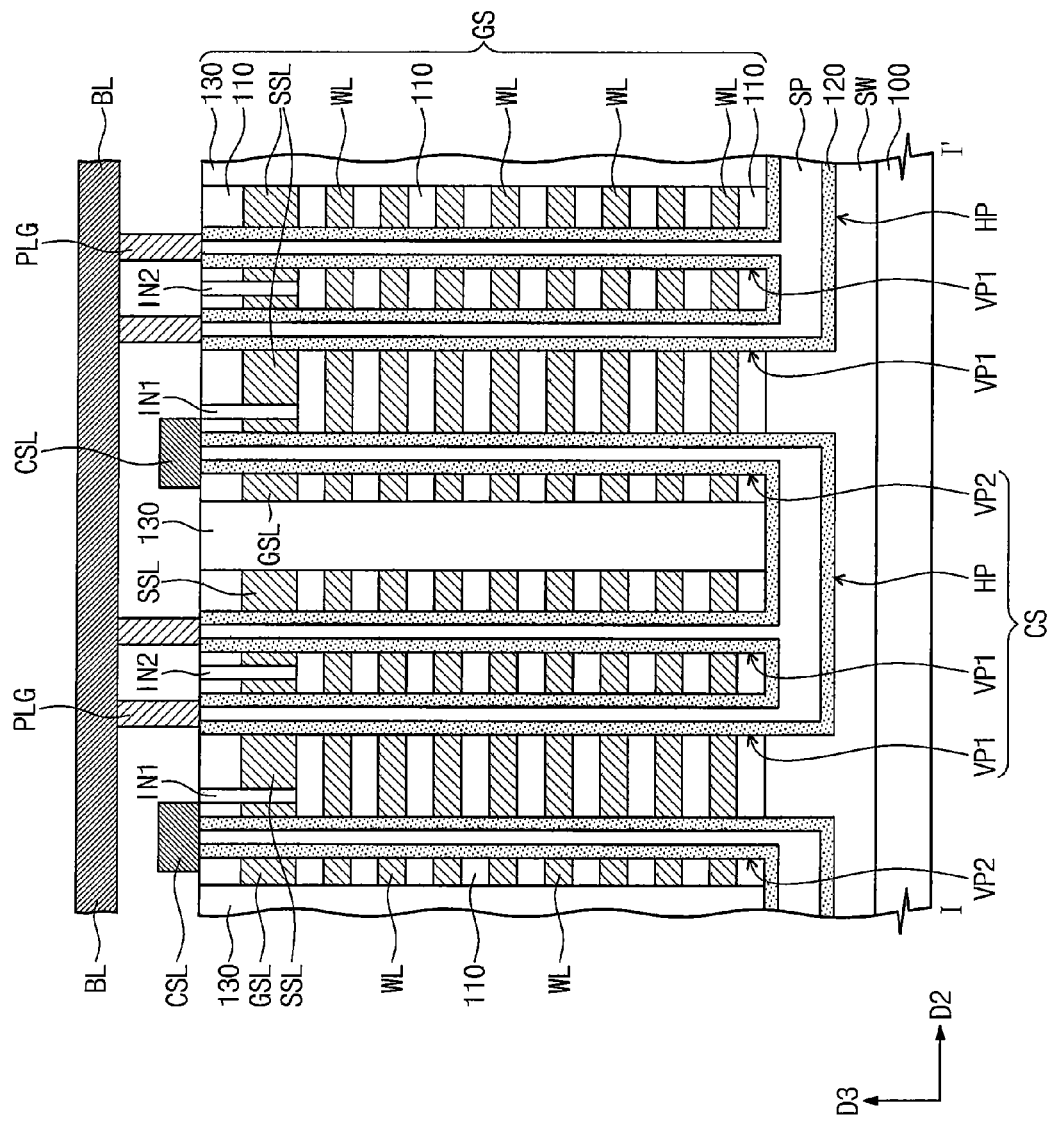
FIG. 19C is a sectional view taken along line I-I' of FIG. 19B.

FIGS. 19A and 19B are perspective and plan views illustrating a semiconductor device according to a modification of the third embodiment of the inventive concepts, and FIG. 19C is a sectional view taken along line I-I' of FIG. 19B. In the following description of FIGS. 19A through 19C, an element previously described with reference to FIGS. 15A through 15D may be identified by a similar or identical reference number without repeating an overlapping description thereof, for the sake of brevity.

Referring to FIGS. 19A through 19C, a semiconductor device may include bit lines BL on a substrate 100, a gate structure GS between the substrate 100 and the bit lines BL, a common source line CSL between the gate structure GS and the bit lines BL, and channel structures CS penetrating the gate structure GS. Each of the channel structures CS may be provided to connect a corresponding one of the bit lines BL to the common source line CSL. The semiconductor device may further include contact plugs PLG provided between the gate structure GS and the bit lines BL.

The gate structure GS may include a plurality of word lines WL sequentially stacked on the substrate 100 and a plurality of selection lines disposed between the word lines WL and the bit lines BL. The selection lines may include a string selection line SSL between the word lines WL and the bit lines BL and a ground selection line GSL between the word lines WL and the common source line CSL.

According to the present embodiments, a pair of the string selection lines SSL horizontally spaced apart from each other may be provided on each of the word lines WL. The word lines WL, the pair of the string selection lines SSL, and the ground selection line GSL may extend parallel to a first direction D1, and the pair of the string selection lines SSL and the ground selection line GSL may be spaced apart from each other in a second direction D2 crossing the first direction D1. The word lines WL disposed below the ground selection line GSL may be spaced apart from the word lines WL disposed below the pair of the string selection line SSL in the second direction D2. An electrode separating pattern 130 may be provided between the pair of the string selection lines SSL and the ground selection line GSL and between two horizontally-separated groups of the word lines WL respectively disposed below the pair of the string selection lines SSL and the ground election line GSL. The electrode separating pattern 130 may be a line-shaped pattern extending parallel to the first direction D1.

The pair of the string selection lines SSL and a neighboring ground selection line GSL, which is spaced apart from the ground selection line GSL by the pair of the string selection lines SSL interposed therebetween, may be disposed on the word lines WL which are provided below the pair of the string selection lines SSL. Similarly, the ground selection line GSL and a pair of neighboring string selection lines SSL, which are spaced apart from the pair of the string selection lines SSL by the ground selection line GSL interposed therebetween, may be disposed on the word lines WL which are provided below the ground selection line GSL.

A first insulating pattern IN1 may be interposed between the pair of the string selection lines SSL and the neighboring ground selection line GSL, and a second insulating pattern IN2 may be interposed between the pair of the string selection lines SSL.

Each of the channel structures CS may include at least one pair of first vertical portions VP1 penetrating respectively the pair of the string selection lines SSL, and a second vertical portion VP2 penetrating the ground selection line GSL. The pair of first vertical portions VP1 may be connected in common to a corresponding one of the bit lines BL, and the second vertical portion VP2 may be connected to the common source line CSL. Each of the pair of first vertical portions VP1 may be connected to a corresponding one of the bit lines BL through a corresponding one of the contact plugs PLG. Each of the channel structures CS may further include a horizontal portion HP connecting the first vertical portions VP1 to the second vertical portion VP2. The horizontal portion HP may be provided to be overlapped with the pair of the string selection lines SSL, the ground selection line GSL, and the word lines WL therebelow, when viewed in a plan view. As shown in FIG. 19B, when viewed in plan view, the horizontal portion HP may be shaped like a plate crossing the electrode separating pattern 130. In example embodiments, each of the channel structures CS may include at least one dummy vertical portion DVP penetrating at least one of the string selection lines SSL. The dummy vertical portion DVP may be provided between the pair of first vertical portions VP1. The second insulating pattern IN2 may be provided to cross the dummy vertical portion DVP. The dummy vertical portion DVP may be provided to increase a process margin in a patterning process for forming the first vertical portions VP1 and may not be used as a channel of the cell string.

According to the present embodiments, each of the channel structures CS may include at least one pair of first vertical portions VP1 penetrating the pair of the string selection lines SSL, respectively, and the pair of first vertical portions VP1 may be connected in common to a corresponding one of the bit lines BL. In this case, a pattern density of the bit lines BL can be reduced.

Referring back to FIG. 15D, a cell array of the semiconductor device may include a common source line CSL, a plurality of bit lines BL, and a plurality of cell strings CSTR between the common source line CSL and the bit lines BL.

According to the present embodiments, unlike the shown example, some of the upper strings CSTR1 of each of the cell strings CSTR may be connected to one of a pair of string selection lines SSL electrically separated from each other, and the others of the upper strings CSTR1 may be connected to the other of the pair of string selection lines SSL. A pair of upper strings CSTR1, which are respectively connected to the pair of string selection lines SSL, may be connected in common to a corresponding one of the bit lines BL.

Figure 23A:
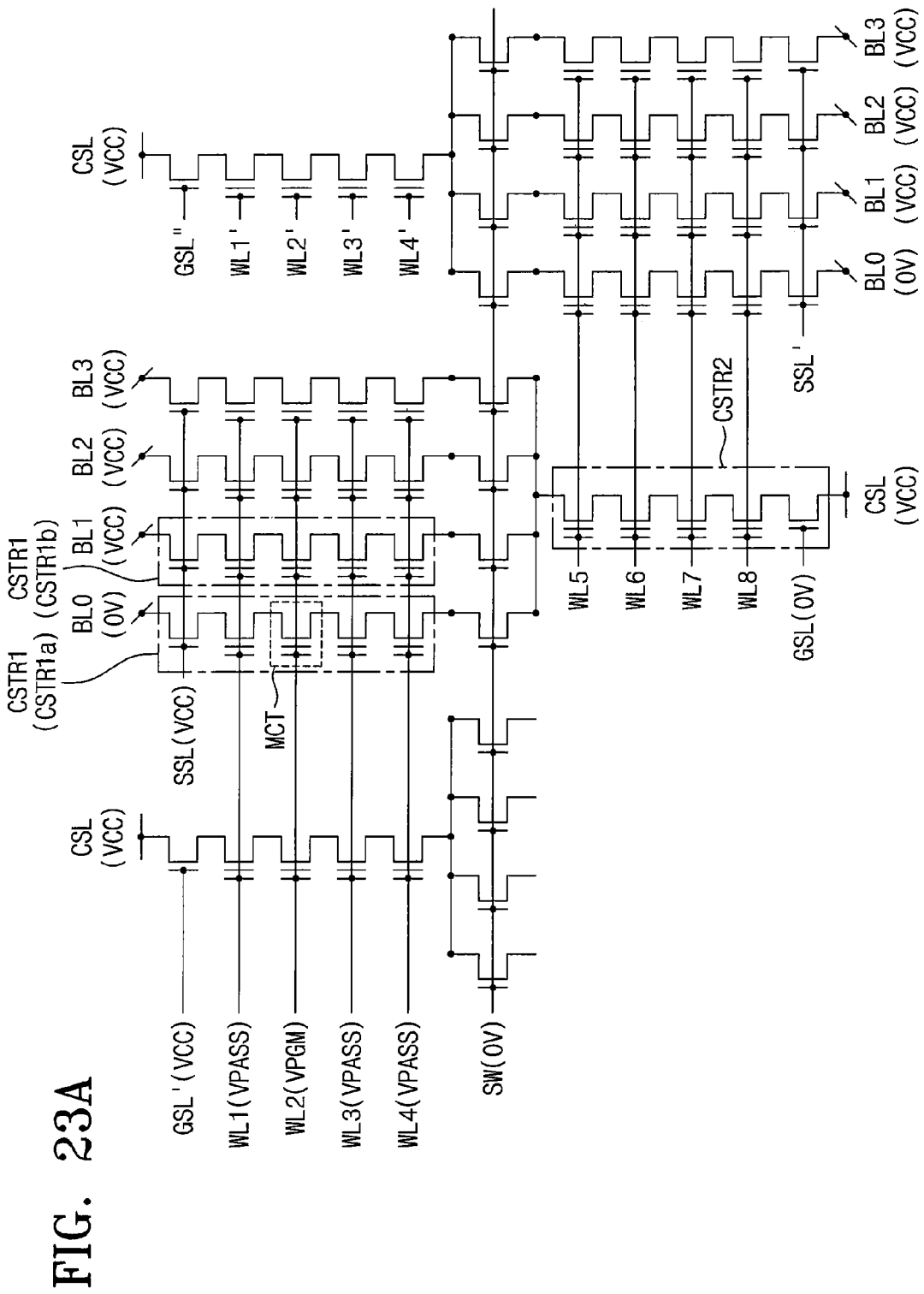
FIGS. 23A and 23B are schematic circuit diagrams presented to illustrate a programming operation on a semiconductor device according to example embodiments of the inventive concepts.
Figure 23B:
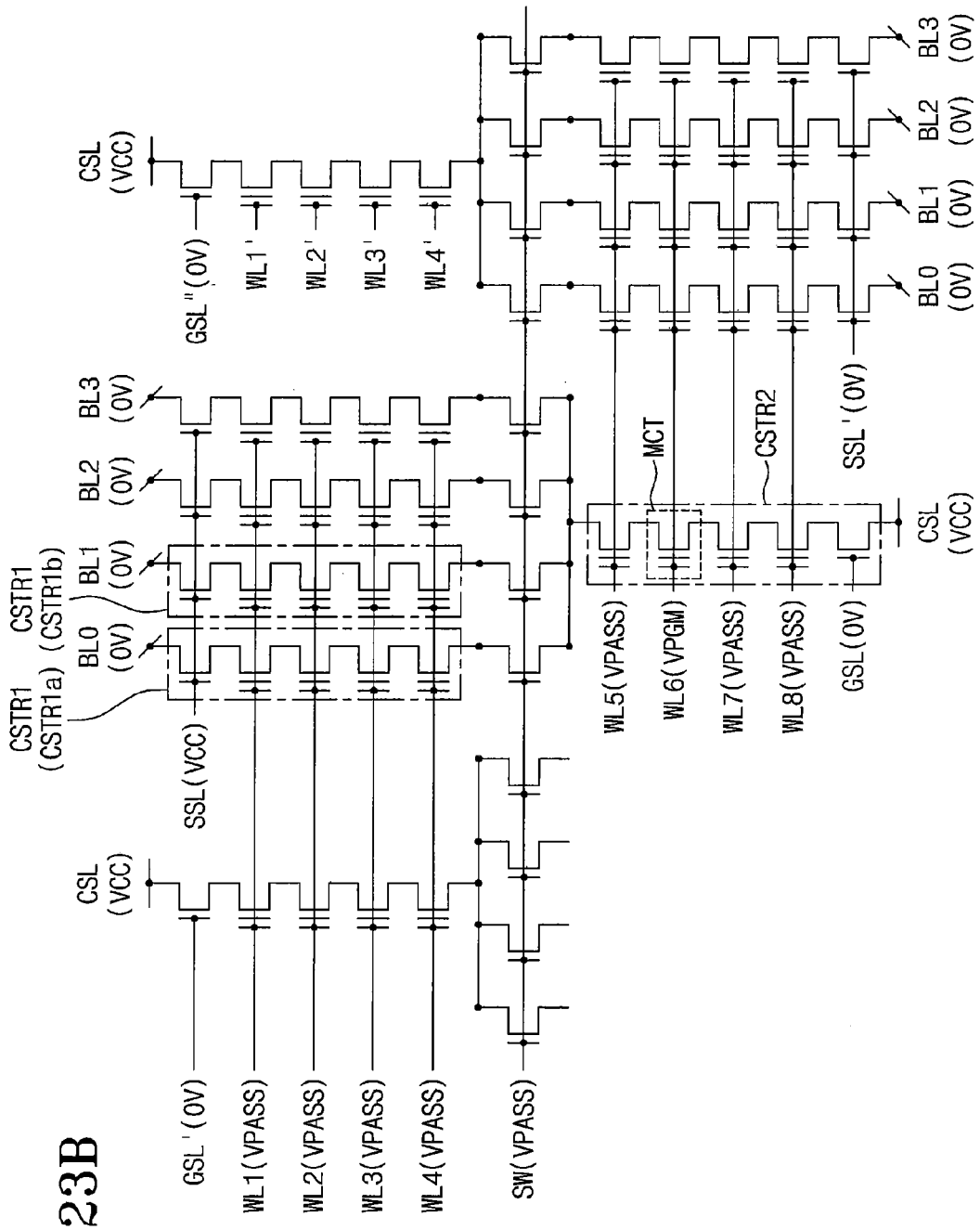
Figure 24A:
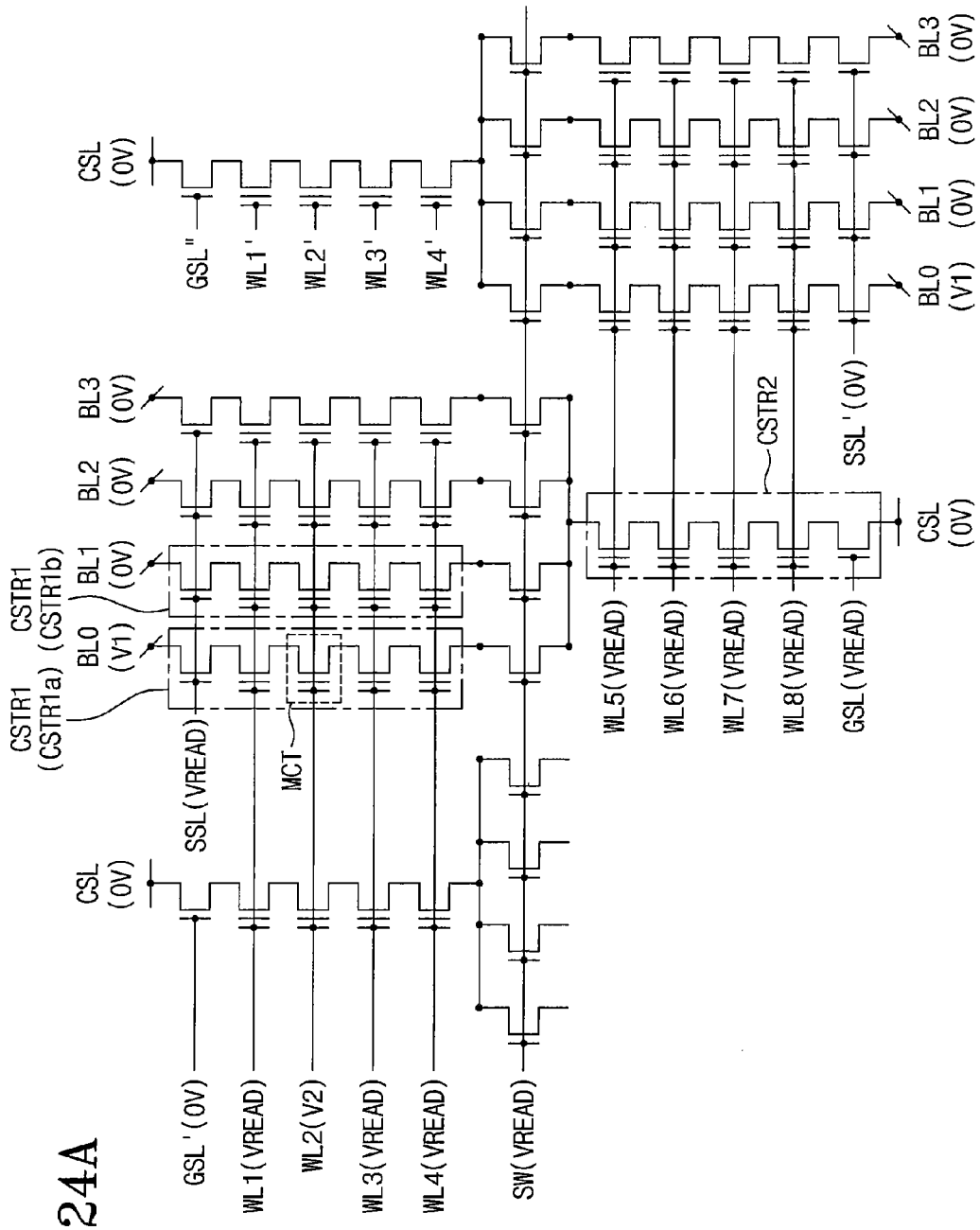
FIGS. 24A and 24B are schematic circuit diagrams presented to illustrate a reading operation on a semiconductor device according to example embodiments of the inventive concepts.
Figure 24B:
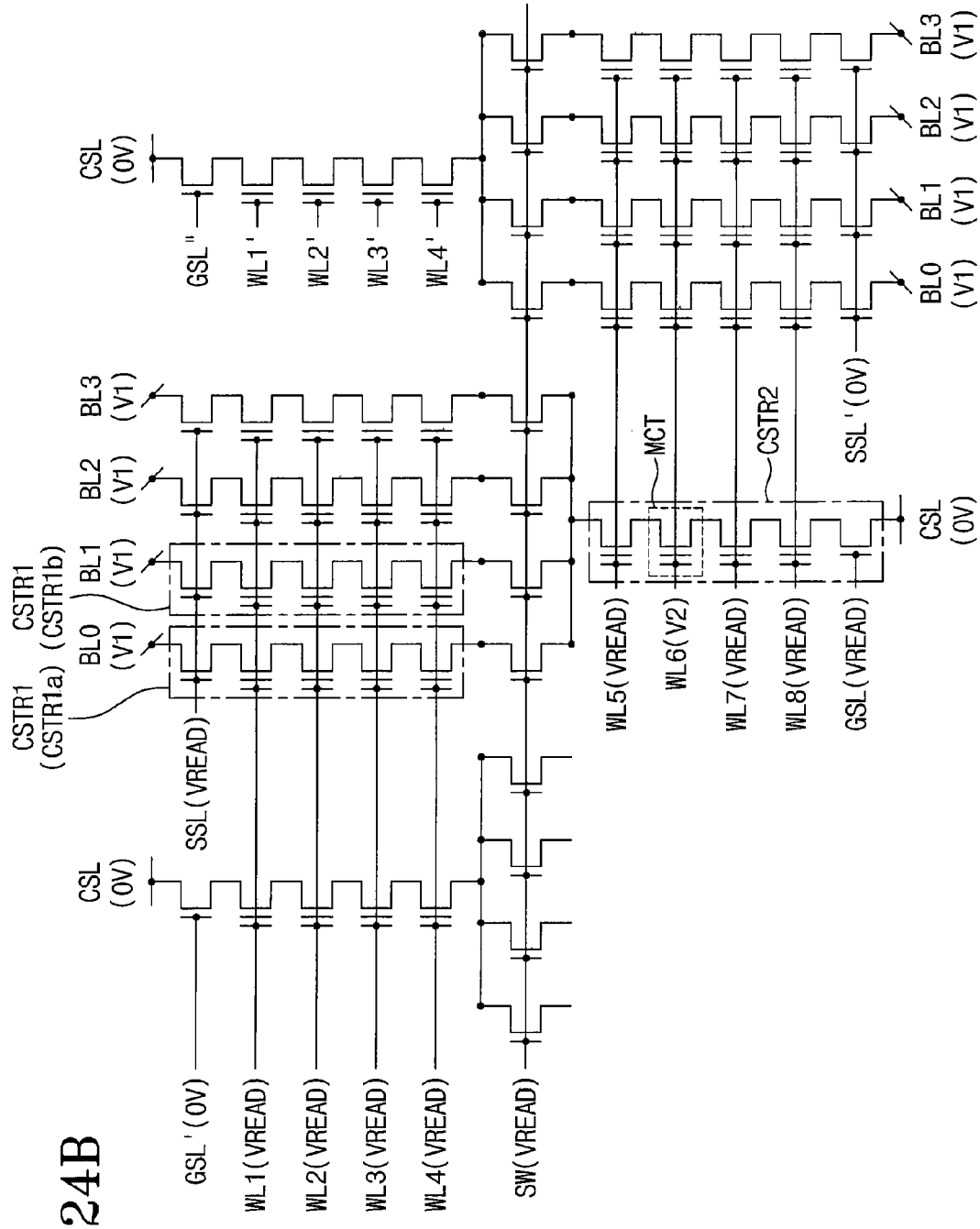

FIGS. 23A and 23B are schematic circuit diagrams presented to illustrate a programming operation on a semiconductor device according to example embodiments of the inventive concepts, and FIGS. 24A and 24B are schematic circuit diagrams presented to illustrate a reading operation on a semiconductor device according to example embodiments of the inventive concepts.

First of all, referring back to FIG. 15D, the unit cell string CSTR of the semiconductor device according to example embodiments of the inventive concepts may include a plurality of upper strings CSTR1 (for example, CSTR1a, CSTR1b), which are connected to the bit lines BL, respectively, and the single lower string CSTR2 connected to the common source line CSL. The upper strings CSTR1 (for example, CSTR1a, CSTR1b) may be connected in common to the lower string CSTR2 through the switching devices SW and the line CL4.

In example embodiments, a programming operation of the semiconductor device may be performed using a Fowler-Nordheim tunneling effect. For example, to program a memory cell transistor MCT, a supply voltage Vcc may be applied to the string selection line SSL shared by the upper strings CSTR1 (for example, CSTR1a, CSTR1b) as shown in FIG. 23A. Of bit lines BL0-BL3 connected to the upper strings CSTR1 (for example, CSTR1a, CSTR1b), a selected bit line BL0 may be applied with a voltage of 0V, and unselected bit lines BL1-BL3 may be applied with the supply voltage Vcc, which may be greater than 0V. Of upper word lines WL1-WL4 shared by the upper strings CSTR1 (for example, CSTR1a, CSTR1b), a selected word line (e.g., WL2) may be applied with a program voltage Vpgm, and unselected word lines (e.g., WL1, WL3, and WL4) may be applied with a pass voltage Vpass, where Vpgm>Vpass>Vcc. The switching devices SW may be applied with a ground voltage of 0V. In this case, a memory cell transistor MCT, which is positioned at an intersection of the selected bit line BL0 and the selected word line WL2, may be programmed.

As another example, the supply voltage Vcc may be applied to the string selection line SSL shared by the upper strings CSTR1 (for example, CSTR1a, CSTR1b), as shown in FIG. 23B. The bit lines BL0-BL3 connected to the upper strings CSTR1 (for example, CSTR1a, CSTR1b) may be applied with the ground voltage of 0V. The pass voltage Vpass may be applied to the upper word lines WL1-WL4 shared by the upper strings CSTR1 (for example, CSTR1a, CSTR1b) and to the switching devices SW. The program voltage Vpgm may be applied to a selected word line (e.g., WL6) coupled to the lower string CSTR2, and the pass voltage Vpass may be applied to unselected word lines (e.g., WL5, WL7, and WL8). The ground voltage of 0V may be applied to the ground selection line GSL coupled to the lower string CSTR2, and the supply voltage Vcc may be applied to the common source line CSL. Accordingly, a memory cell transistor MCT of the lower string CSTR2, which is coupled to the selected word line WL6, may be programmed. The unit cell string CSTR and a neighboring cell string CSTR may share the word lines WL5-WL8 and the bit lines BL0-BL3. In this case, the ground voltage of 0V may be applied to a string selection line SSL' of the neighboring cell string CSTR to prevent a memory cell transistor of the adjacent cell string CSTR from being programmed.

A reading operation of the semiconductor device may be performed using a read current, which is determined by data stored in the memory cell transistor MCT. For example, as shown in FIG. 24A, to read out the data stored in the memory cell transistor MCT, a selected bit line (e.g., BL0) may be applied with a voltage of V1, which is greater than the ground voltage, and unselected bit lines (e.g., BL1-BL3) may be applied with the ground voltage of 0V. Further, the ground voltage of 0V may be applied to the common source line CSL connected to the lower string CSTR2 to produce a potential difference between the selected bit line BL0 and the common source line CSL. The string selection line SSL shared by the upper strings CSTR1 (for example, CSTR1a, CSTR1b), may be applied with a read voltage Vread. A selected word line (e.g., WL2) of the upper word lines WL1-WL4 may be applied with a voltage of V2, and unselected word lines (e.g., WL1, WL3, and WL4) may be applied with the read voltage Vread, where Vread>V1>V2. The lower word lines WL5-WL8 and the ground selection line GSL, which are connected to the lower string CSTR2, and the switching devices SW may be applied with the read voltage Vread. Accordingly, the string selection transistor SST, the memory cell transistors other than the selected memory cell transistor MST, and the ground selection transistor GST, which are connected in series to the selected bit line BL0, may be in the on state. In this case, the read current may be determined by the data stored in the selected memory cell transistor MCT.

As another example, as shown in FIG. 24B, the bit lines BL0-BL3 coupled to the upper strings CSTR1 (for example, CSTR1a, CSTR1b) may be applied with a voltage of V1, which may be greater than the ground voltage, and the common source line CSL connected to the lower string CSTR2 may be applied with the ground voltage of 0V. Accordingly, a potential difference may be produced between the bit lines BL0-BL3 and the common source line CSL. The read voltage Vread may be applied to the string selection line SSL and the upper word lines WL1-WL4, which are shared by the upper strings CSTR1 (for example, CSTR1a, CSTR1b), and the switching devices SW. A selected word line (e.g., WL6) of the lower word lines WL5-WL8 may be applied with a voltage of V2, and unselected word lines (e.g., WL5, WL7, and WL8) and the ground selection line GSL may be applied with the read voltage Vread. Accordingly, the string selection transistors SST and the memory cell transistors constituting the upper strings CSTR1 (for example, CSTR1a, CSTR1b) may be in the on state, and the ground selection transistor GST and the memory cell transistors, which are other than the selected memory cell transistor MST, constituting the lower string CSTR2 may be in the on state. In this case, the read current may be determined by the data stored in the selected memory cell transistor MCT. The unit cell string CSTR and a neighboring cell string CSTR may share the word lines WL5-WL8 and the bit lines BL0-BL3. In this case, the ground voltage of 0V may be applied to a string selection line SSL' of the neighboring cell string CSTR to prevent a reading operation from occurring in the neighboring cell string CSTR.

Although not shown, an erase operation of the semiconductor device according to example embodiments of the inventive concepts may be performed using the hot-hole injection effect.

Figure 25:
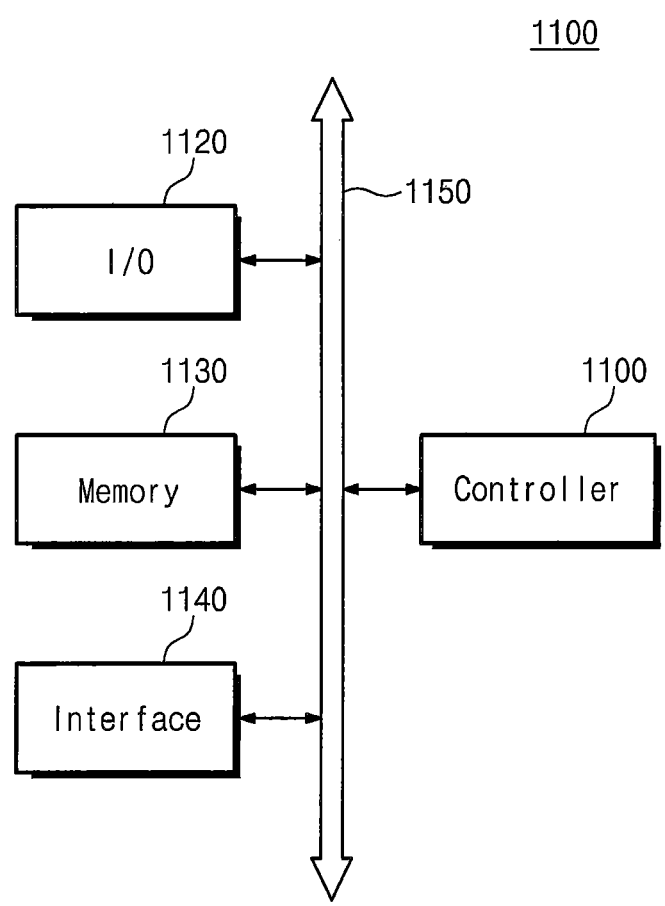
FIG. 25 is a schematic block diagram illustrating an example of electronic systems including three-dimensional semiconductor memory devices according to example embodiments of the inventive concepts.

FIG. 25 is a schematic block diagram illustrating an example of electronic systems including 3D semiconductor memory devices according to example embodiments of the inventive concepts.

Referring to FIG. 25, an electronic system 1100 may be applied to a personal digital assistant (PDA), a portable computer, a web tablet, a wireless phone, a mobile phone, a digital music player, a memory card and/or other electronic products receiving and/or transmitting information data by wireless.

The electronic system 1100 may include a controller 1110, an input/output (I/O) unit 1120 (e.g., a keypad, a keyboard, and/or a display), a memory device 1130, an interface unit 1140, and a data bus 1150. The memory device 1130 and the interface unit 1140 may communicate with each other through the data bus 1150.

The controller 1110 may include a microprocessor, a digital signal processor, a microcontroller and/or other logic device having a similar, function to any one thereof. The memory device 1130 may store data processed by the controller 1110. The I/O unit 1120 may receive data or signals from the outside of the electronic system 1100 or may output data or signals to the outside of the electronic system 1100.

The memory device 1130 and/or any of the other blocks of FIG. 25 may include at least one of the 3D semiconductor memory devices according to the aforementioned embodiments of the inventive concepts. Additionally, the memory device 1130 and/or any of the other blocks of FIG. 25 may further include at least one of another kind of a memory device, a random access volatile memory device, or other various kinds of memory devices.

The interface unit 1140 may transmit electrical data to a communication network or may receive electrical data from a communication network.

Figure 26:
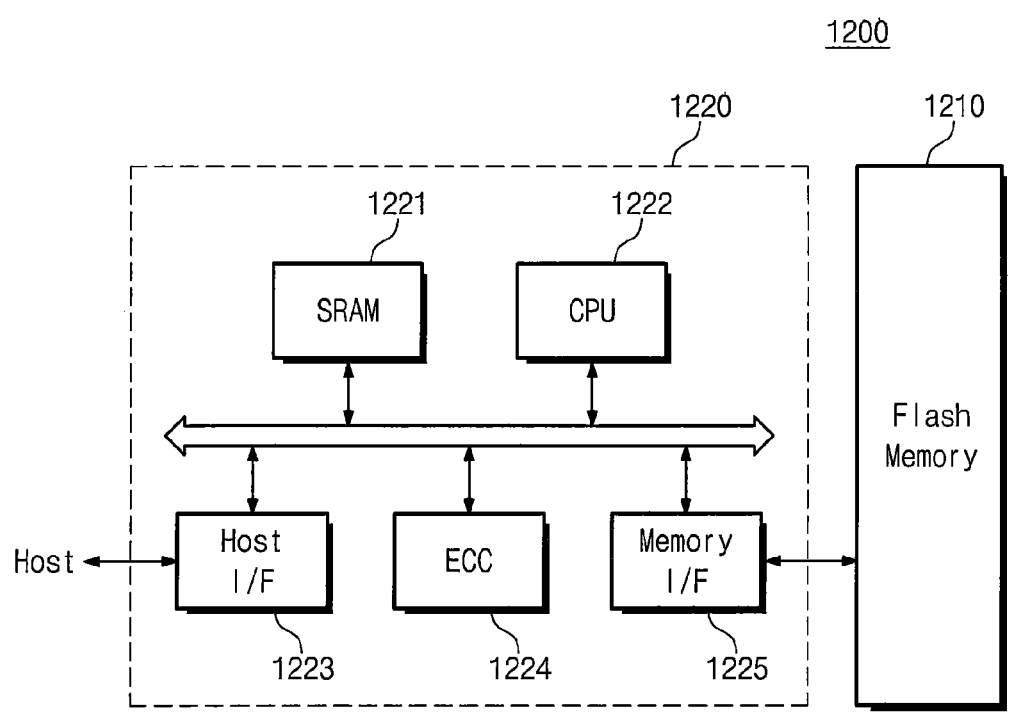
FIG. 26 is a schematic block diagram illustrating an example of memory systems including three-dimensional semiconductor memory devices according to example embodiments of the inventive concepts.

FIG. 26 is a schematic block diagram illustrating an example of memory systems including 3D semiconductor memory devices according to example embodiments of the inventive concepts.

Referring to FIG. 26, a memory system 1200 may include a non-volatile memory device 1210 in order to store massive data. The non-volatile memory device 1210 may include at least one of the 3D semiconductor memory devices according to the aforementioned embodiments of the inventive concepts. The memory system 1200 may include a memory controller 1220 that controls data communication between a host and the non-volatile memory device 1210.

A static random access memory (SRAM) device 1221 may be used as an operation memory of a central processing unit (CPU) 1222. A host interface unit 1223 may be configured to include a data communication protocol between the memory system 1200 and the host. An error check and correction (ECC) block 1224 may detect and correct errors of data which are read out from the non-volatile memory device 1210. A memory interface unit 1225 may interface with the non-volatile memory device 1210 according to example embodiments of the inventive concepts. The CPU 1222 may perform overall operations for data exchange of the memory controller 1220. Even though not shown in the drawings, the memory system 1200 may further include a read only memory (ROM) device that stores code data to interface with the host. Any of the blocks 1221-1225 may also include at least one of the 3D semiconductor memory devices according to the aforementioned embodiments of the inventive concepts.

According to example embodiments of the invective concepts, a plurality of upper strings connected to respective bit lines may be connected in common to a single lower string connected to a common source line. Thus, a ground selection transistor of the single lower string can be shared with the upper strings. Due to the sharing of the ground selection transistor of the lower string, it possible to increase an integration density of the semiconductor device. Further, since the upper strings are respectively connected to the bit lines, it is still possible to independently operate the upper strings sharing the ground selection transistor.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   bit lines on a substrate;
   a gate structure between the substrate and the bit lines;
   a common source line between the gate structure and the bit lines; and
   channel structures connecting the bit lines to the common source line,
   wherein each of the channel structures comprises:
   first vertical portions penetrating the gate structure and being connected to the bit lines;
   a second vertical portion penetrating the gate structure and being connected to the common source line; and
   a horizontal portion between the substrate and the gate structure to connect the first and second vertical portions to each other,
   wherein the common source line comprises a first common source line and a second common source line spaced apart from each other, and
   the second vertical portion of each of the channel structures comprises a pair of second vertical portions coupled to the first and second common source lines, respectively.

2. The device of claim 1, wherein in each of the channel structures, each of the first vertical portions is connected to a corresponding one of the bit lines.

3. The device of claim 1, wherein, in each of the channel structures, each of the first vertical portions is connected to a corresponding one of the bit lines.

4. The device of claim 1, wherein the gate structure comprises:
   word lines stacked on the substrate;
   a string selection line between the word lines and the bit lines; and
   a ground selection line between the word lines and the common source line,
   wherein the word lines comprises upper word lines between the substrate and the string selection line and lower word lines between the substrate and the ground selection line, and
   the lower word lines are spaced apart from the upper word lines in a direction parallel to a face of the substrate,
   wherein in each of the channel structures, each of the first vertical portions penetrates the string selection line and the upper word lines, and each of the pair of second vertical portions penetrates the ground selection line and the lower word lines.

5. The device of claim 4, wherein the string selection line, the ground selection line, and the word lines extend parallel to a first direction, and the string and ground selection lines are spaced apart from each other in a second direction crossing the first direction, and
   wherein the channel structures comprise a pair of channel structures adjacent to each other in the second direction, and
   the second vertical portions of the pair of the channel structures share the lower word lines and the ground selection line.

6. The device of claim 1, wherein the gate structure comprises:
   word lines stacked on the substrate;
   a string selection line between the word lines and the bit lines; and
   a ground selection line between the word lines and the common source line,
   wherein the word lines comprise upper word lines between the substrate and the string selection line and lower word lines between the substrate and the ground selection line, and
   the lower word lines are spaced apart from the upper word lines in a direction parallel to a face of the substrate.

7. The device of claim 6, wherein in each of the channel structures, each of the first vertical portions penetrates the upper word lines and the string selection line, and
   the second vertical portion penetrates the lower word lines and the ground selection line.

8. The device of claim 7, wherein in each of the channel structures, the horizontal portion is overlapped with not only the upper word lines but also the lower word lines, when viewed in a plan view.

9. The device of claim 6, further comprising an electrode separating pattern penetrating the gate structure,
   wherein the electrode separating pattern is between the string selection line and the ground selection line and between the upper word lines and the lower word lines.

10. The device of claim 6, wherein in each of the channel structures, each of the first vertical portions penetrates the upper word lines and the string selection line,
    the second vertical portion penetrates the lower word lines and the ground selection line,
    the string selection line, the ground selection line, and the word lines extend parallel to a first direction, and
    the string selection line is spaced apart from the ground selection line in a second direction crossing the first direction,
    wherein the channel structures comprises a pair of channel structures adjacent to each other in the second direction, and
    the second vertical portions of the pair of the channel structures share the lower word lines and the ground selection line.

11. The device of claim 10, wherein the first vertical portions of one of the pair of the channel structures penetrate the string selection line and the upper word lines, and
    the first vertical portions of the other of the pair of the channel structures penetrate another string selection line and other upper word lines, which are spaced apart from the string selection line and the upper word lines by the ground selection line and the lower word lines interposed therebetween.

12. A semiconductor device comprising:
    a substrate;
    first, second and third strings of nonvolatile memory cells that are stacked on the substrate and spaced apart from each other, such that the first, second and third strings of nonvolatile memory cells each comprises a first end adjacent the substrate and a second end remote from the substrate;
    first, second and third conductive lines, a respective one of which is connected to a respective second end of the first, second and third strings of nonvolatile memory cells; and
    a fourth conductive line that connects the first ends of the first, second and third strings of nonvolatile memory cells in common,
    wherein the first and third strings of memory cells each further comprises a string selection transistor and is devoid of a ground selection transistor and wherein the second string of memory cells comprises a ground selection transistor and is devoid of a string selection transistor.

13. The device of claim 12 wherein the first, second and third conductive lines comprise metal and the fourth conductive line comprises semiconductor material.

14. The device of claim 13 wherein the first through fourth conductive lines all extend parallel to a face of the substrate.

15. A semiconductor device comprising:
a substrate;
first, second and third strings of nonvolatile memory cells that are stacked on the substrate and spaced apart from each other, such that the first, second and third strings of nonvolatile memory cells each comprises a first end adjacent the substrate and a second end remote from the substrate;
first, second and third conductive lines, a respective one of which is connected to a respective second end of the first, second and third strings of nonvolatile memory cells;
a fourth conductive line that connects the first ends of the first, second and third strings of nonvolatile memory cells in common;
a fourth string of nonvolatile memory cells that are stacked on the substrate and are spaced apart from the first through third strings of nonvolatile memory cells, the fourth string of memory cells comprising a first end adjacent the substrate and a second end remote from the substrate; and
a fifth conductive line that is connected to the second end of the fourth string of nonvolatile memory cells,
wherein the fourth conductive line also connects the first end of the fourth string of nonvolatile memory cells in common to the first ends of the first, second and third strings of nonvolatile memory cells.

16. The device of claim 15 wherein the fourth string of memory cells further comprises a string selection transistor and is devoid of a ground selection transistor.

17. The device of claim 15 wherein the fourth string of memory cells further comprises a ground selection transistor and is devoid of a string selection transistor.

* * * * *